United States Patent [19]
Hyman

[11] Patent Number: 5,377,123
[45] Date of Patent: Dec. 27, 1994

[54] PROGRAMMABLE LOGIC DEVICE

[76] Inventor: Edward Hyman, 1202 S. Irena Ave., Redondo Beach, Calif. 90277

[21] Appl. No.: 895,607

[22] Filed: Jun. 8, 1992

[51] Int. Cl.$^5$ .................... G06F 15/60; H03K 17/693
[52] U.S. Cl. .................................. 364/489; 364/488; 364/716; 340/825.83; 326/39
[58] Field of Search ............... 364/488, 489, 490, 716; 307/465; 340/825.83

[56] References Cited

U.S. PATENT DOCUMENTS

| | | | |
|---|---|---|---|
| 3,473,160 | 10/1969 | Wahlstrom . | |
| 3,619,583 | 11/1971 | Arnold | 364/716 |
| 3,731,073 | 5/1973 | Noylan | 364/716 |
| 3,855,536 | 12/1974 | Neuner | 307/465 |
| 3,987,286 | 10/1976 | Muehldorf | 364/716 |
| 4,215,401 | 7/1980 | Holsztynski et al. | 382/41 |
| 4,293,783 | 10/1981 | Patil | 307/465 |
| 4,450,520 | 5/1984 | Hollaar et al. | 395/550 |
| 4,504,904 | 3/1985 | Moore et al. | 395/800 |
| 4,541,071 | 9/1985 | Ohmori | 395/775 |
| 4,574,394 | 3/1986 | Holstzynski et al. | 395/800 |
| 4,591,980 | 5/1986 | Huberman et al. | 395/800 |
| 4,677,587 | 6/1987 | Zemany, Jr. | 395/500 |
| 4,694,411 | 9/1987 | Burrows | 364/578 |
| 4,697,241 | 9/1987 | Lavi | 364/488 |
| 4,703,435 | 10/1987 | Darringer | 364/489 |
| 4,709,327 | 11/1987 | Hillis et al. | 395/375 |
| 4,727,493 | 2/1988 | Taylor, Jr. . | |
| 4,758,745 | 7/1988 | Elgamal et al. | 307/465 |
| 4,758,953 | 7/1988 | Morita . | |
| 4,791,602 | 12/1988 | Resnick | 364/716 |
| 4,792,909 | 12/1988 | Serlet . | |
| 4,814,973 | 3/1989 | Hillis | 395/800 |
| 4,839,851 | 7/1989 | Maki | 395/800 |
| 4,845,633 | 7/1989 | Furtek | 364/490 |
| 4,855,903 | 8/1989 | Carleton et al. | 395/325 |
| 4,918,440 | 4/1990 | Furtek | 340/825.83 |
| 4,963,768 | 10/1990 | Agrawal et al. | 307/465 |
| 5,070,446 | 12/1991 | Salem | 395/500 |
| 5,189,628 | 2/1993 | Olsen et al. | 364/489 |
| 5,222,030 | 6/1993 | Dongelo et al. | 364/489 |
| 5,231,588 | 9/1993 | Shoji et al. | 364/488 |
| 5,255,203 | 10/1993 | Agrawal et al. | 364/489 |

OTHER PUBLICATIONS

George H. Williams, "Array State Assignments in Sequential Circuit Synthesis" (Ph.D. Dissertation, Engineering, Electrical) Yale University Press, 1970.

Monroe M. Newborn, Thomas F. Arnold, "Universal Modules for Bounded Signal Fan-Out Synchronous Sequential Circuits," IEEE (vol. C-21, No. 1, Jan., 1972).

Hyman, E., "Minimal Complexity Universal Cellular Arrays", Ph.D. A Dissertation, University of Southern California (Jan. 1974).

Primary Examiner—Vincent N. Trans
Attorney, Agent, or Firm—Merchant & Gould

[57] ABSTRACT

A programmable logic device includes means for operating a computing element to compile a set of state-machine states in an incompletely specified state-machine. The state-machine states are compiled into a set of cellular array states in a rectilinear format of columns and rows. Multiple memory cells are located on a main diagonal. Function cells are located removed from the main diagonal for transferring information between the memory cells. Compatible sets of sequences are formed of sequences which have non-equal effect. Compatible sets are processed to form a closed cover. A distinct memory cell is then assigned to each compatible set constituting that closed cover. The closed cover can be formed selectively by having a compatible set consist of either a single entry of one sequence, two or more sequences, being at least a pair of sequences, a maximal compatible set or less than maximal compatible set from a pair of compatibles. Moreover, the compatible set could be a prime compatible set or less than prime compatible set being derived from maximal or less than maximal compatible sets. The closed cover tree contains every sequence which does not have equal effect on the internal states of the state-machine. Each implication set corresponding to a compatible set which constitutes the tree is contained as a subset of at least one compatible set.

31 Claims, 29 Drawing Sheets

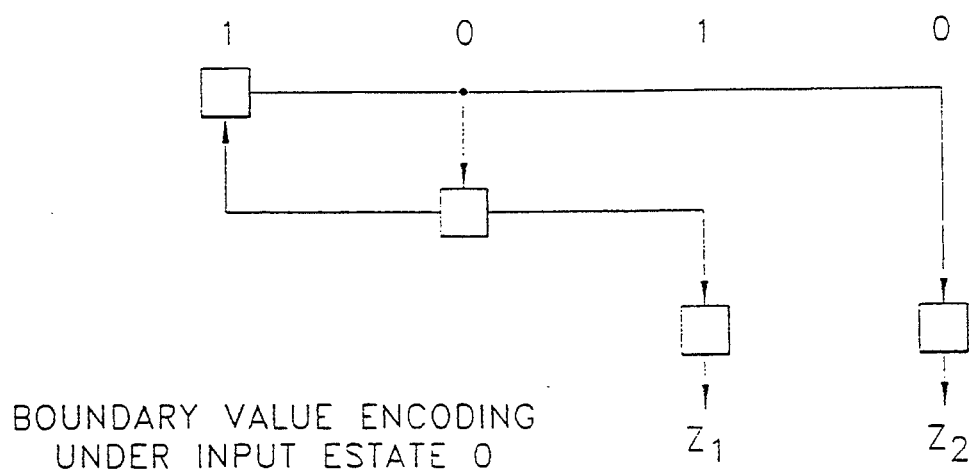
BOUNDARY VALUE ENCODING
UNDER INPUT ESTATE 0
*FIG. 8*
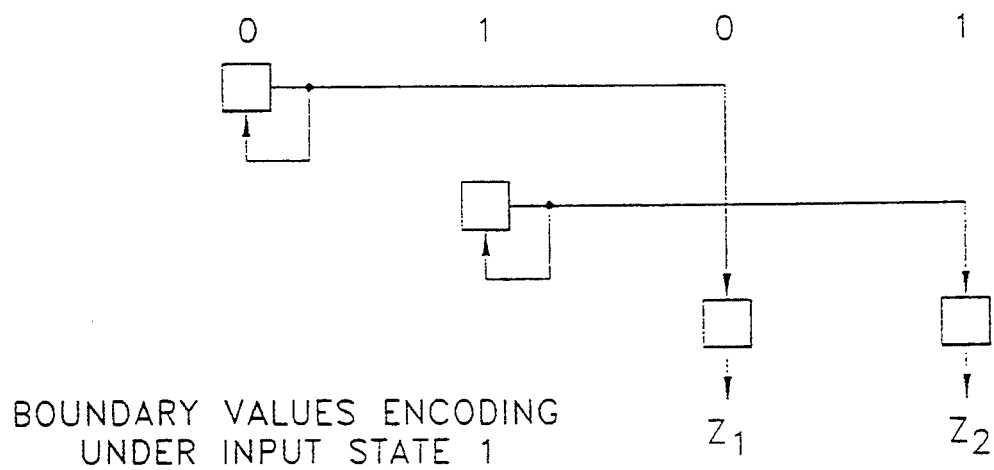
BOUNDARY VALUES ENCODING
UNDER INPUT STATE 1
*FIG. 9*
INITIAL MEMORY CELL VALUES
*FIG. 9A*

STATE TRANSITION STEP 1

STATE TRANSITION STEP 2

STATE TRANSITION STEP 3

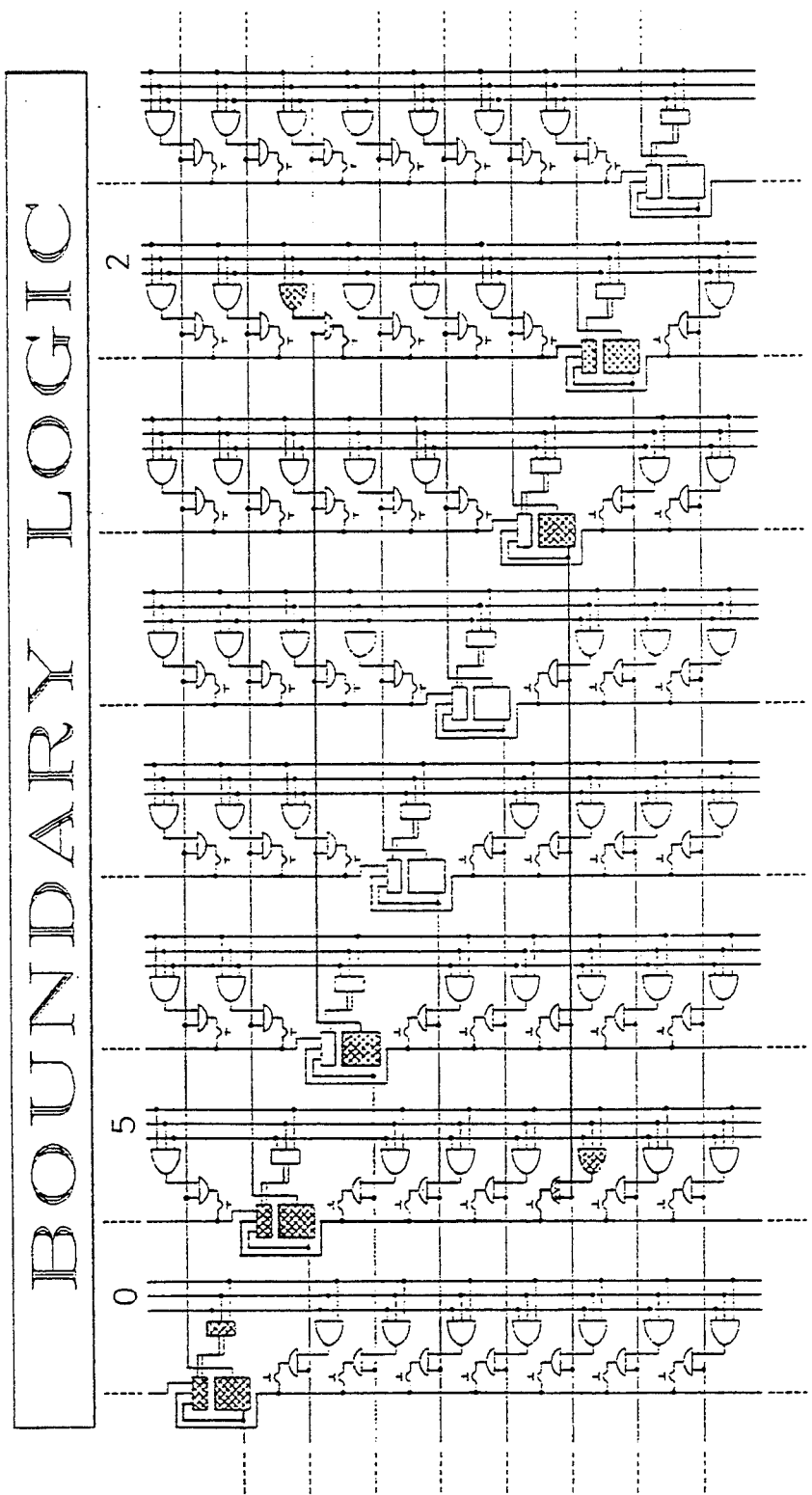
FIG. 15 SIMULTANEOUS ROUTINGS

BUS ARBITER

| | | $i_0$ | $i_1$ | $i_2$ | $i_3$ | $i_4$ | $i_5$ | MBG0 | MBG1 |
|---|---|---|---|---|---|---|---|---|---|
| BEGIN IDLE | 1 | — | 1 | — | 2 | — | 13 | 0 | 0 |
| BEGIN IDLE: PRI 0 | 2 | — | — | — | 3 | — | — | 0 | 0 |
| IDL0 SGT-TGT | 3 | 3 | 3 | 3 | 3 | 7 | 4 | 1 | 0 |
| IDL0: GT1 WT | 4 | — | — | 10 | 3 | 8 | 5 | 1 | 0 |
| IDL1 SGT-TGT | 5 | 5 | 5 | 12 | 6 | 5 | 5 | 0 | 1 |
| IDL1: GT0 WT | 6 | — | — | 10 | 3 | — | — | 0 | 1 |
| IDL0: GT1 WT:MBB | 7 | — | — | 10 | 3 | 8 | — | 1 | 0 |
| NRM1 SGT-TGT | 8 | 8 | 8 | 9 | 6 | 8 | 8 | 0 | 1 |
| NRM1: GT0 WT | 9 | — | — | 10 | 3 | — | — | 0 | 1 |
| NRM0 SGT-TGT | 10 | 10 | 10 | 10 | 10 | 11 | 4 | 1 | 0 |
| NRM0: GT1 WT | 11 | — | — | 10 | 3 | 8 | 5 | 1 | 0 |
| IDL1:GT0 WT:MBB | 12 | — | — | 10 | 3 | — | — | 0 | 1 |
| BEGIN IDLE: PRI 1 | 13 | — | — | — | 3 | — | 5 | 0 | 0 |

$i_0 = \overline{MBR0} \cdot \overline{MBR1} \cdot MBB$  $\quad i_1 = \overline{MBR0} \cdot \overline{MBR1} \cdot \overline{MBB}$ $i_2 = MBR0 \cdot MBB$  $\quad i_3 = MBR0 \cdot \overline{MBB}$ $i_4 = \overline{MBR0} \cdot MBR1 \cdot MBB$  $\quad i_5 = \overline{MBR0} \cdot MBR1 \cdot \overline{MBB}$

|   | $i_0$ | $i_1$ | $i_2$ | $i_3$ | $i_4$ | $i_5$ | MBG0 | MBG1 |        |
|---|---|---|---|---|---|---|---|---|--------|
| a | — | a | — | b | — | b | 0 | 0 | 1      |
| b | — | — | — | c | — | d | 0 | 0 | 2,13   |
| c | c | c | c | c | e | e | 1 | 0 | 3,10   |
| d | d | d | f | f | d | d | 0 | 1 | 5,8    |
| e | — | — | c | c | d | d | 1 | 0 | 4,7,11 |
| f | — | — | c | c | — | — | 0 | 1 | 6,9,12 |

FIG. 17B

| Ω | $i_0$ | $i_1$ | $i_2$ | $i_3$ | $i_4$ | $i_5$ | $i_0i_0$ | $i_0i_1$ | $i_0i_2$ | $i_0i_3$ | $i_0i_4$ | $i_0i_5$ | $i_1i_0$ | $i_1i_1$ |
|---|---|---|---|---|---|---|---|---|---|---|---|---|---|---|
| a | — | a | — | b | — | b | — | — | — | — | — | — | — | a |
| b | — | — | — | c | — | d | — | — | — | c | — | d | — | — |
| c | c | c | c | c | c | c | c | c | c | c | — | — | c | c |
| d | d | d | f | f | d | d | d | d | — | — | d | d | d | d |
| e | — | — | c | c | d | d | — | — | c | c | d | d | — | — |
| f | — | — | c | c | — | — | — | — | c | c | — | — | — | — |

FIG. 17C

| 0 | — | 0 | — | 0 | — | 0 | — | — | — | — | — | — | — | 0 |
|---|---|---|---|---|---|---|---|---|---|---|---|---|---|---|
| 0 | — | — | — | 1 | — | 0 | — | — | — | 1 | — | 0 | — | — |
| 1 | 1 | 1 | 1 | 1 | 1 | 1 | 1 | 1 | 1 | 1 | — | — | 1 | 1 |
| 0 | 0 | 0 | 0 | 0 | 0 | 0 | 0 | 0 | — | — | 0 | 0 | 0 | 0 |
| 1 | — | — | 1 | 1 | 0 | 0 | — | — | 1 | 1 | 0 | 0 | — | — |
| 0 | — | — | 1 | 1 | — | — | — | — | 1 | 1 | — | — | — | — |

FIG. 17D

| 0 | — | 0 | — | 0 | — | 0 | — | — | — | — | — | — | — | 0 |
|---|---|---|---|---|---|---|---|---|---|---|---|---|---|---|
| 0 | — | — | — | 0 | — | 1 | — | — | — | 0 | — | 1 | — | — |
| 0 | 0 | 0 | 0 | 0 | 0 | 0 | 0 | 0 | 0 | 0 | — | — | 0 | 0 |
| 1 | 1 | 1 | 1 | 1 | 1 | 1 | 1 | 1 | — | — | 1 | 1 | 1 | 1 |
| 0 | — | — | 0 | 0 | 1 | 1 | — | — | 0 | 0 | 1 | 1 | — | — |
| 1 | — | — | 0 | 0 | — | — | — | — | 0 | 0 | — | — | — | — |

COLUMN IMPLICATIONS

| $i_0 i_2$ | | $i_0 i_2$ | $i_2 i_2$ | $i_0 i_2 i_1$ | $i_2 i_2 i_1$ |
|---|---|---|---|---|---|
| – | – | – | – | – | – |
| – | – | – | – | – | – |
| c | c | c | c | c | c |
| d | f | – | c | – | c |
| – | c | c | c | – | – |
| – | c | c | c | – | – |
| – | – | – | – | – | – |
| – | – | – | – | – | – |
| 1 | 1 | 1 | 1 | 1 | 1 |
| 0 | 0 | – | 1 | – | 1 |
| – | 1 | 1 | 1 | – | – |
| – | 1 | 1 | 1 | – | – |
| – | – | – | – | – | – |
| – | – | – | – | – | – |
| 0 | 0 | 0 | 0 | 0 | 0 |
| 1 | 1 | – | 0 | – | 0 |
| – | 0 | 0 | 0 | – | – |
| – | 0 | 0 | 0 | – | – |

PAIR CHART $\left.\begin{array}{l} i_0(0), i_1(0) \\ i_2(0), i_{02}(0) \\ i_3(0), i_{03}(0) \\ i_4(0), i_{04}(0) \\ i_5(0), i_{05}(0) \end{array}\right\}$ $\Omega(0)$

| | | | | | | | | | |
|---|---|---|---|---|---|---|---|---|---|
| X | $\Omega(1)$ | | | | | | | | |
| | X | $i_0(0)$ | | | | | | | |
| X | | X | $i_0(1)$ | | | | | | |
| | X | | X | $i_1(0)$ | | | | | |
| X | | X | | X | $i_1(1)$ | | | | |
| X | X | | X | | X | $i_2(0)$ | | | |
| X | X | X | | X | | X | $i_2(1)$ | | |
| X | X | | X | | X | | X | $i_3(0)$ | |
| X | X | X | | X | | X | | X | $i_3(1)$ |
| X | X | | X | | X | X | X | X | X $i_4(0)$ |

$\underbrace{\phantom{XXXXXXXX}}$
$i_{04}(0), i_{44}(0)$
$i_{05}(0), i_{45}(0)$

*FIG. 19*

```
3  7  15  17  38  42  44  47  50  52  57
NULL
NULL
57  15  23
57  17  25  27
19  11  57  38
21  40  38  57
4  6  12  14  20  22  39  41  43  45  46  57       0
NULL  0
NULL  0
57  16                   4
47  57  18  35           4
57  20  31               6
57  22  33  37           6
4  12  20  22  39  41  45  47  54  57
NULL
NULL
57  16
35  18  57  47
20  57  31
22  57  33  37

15  17  20  22  23  25  31  33  34  38  45  46  48  53  57
NULL
NULL
NULL
52  17  57  47  25  27
NULL
38  22  57  42  33  37
15  17  20  22  23  25  27  31  33  37  38  42  45  47  48  52  56  57    6
NULL
NULL
NULL
NULL
NULL
NULL
16  18  19  21  24  26  28  30  32  36  39  43  44  46  49  51  55  57    7
NULL
NULL
NULL
NULL
NULL
NULL
3  5  7  9  15  17  34  38  44  46  53  57         1
NULL  1
NULL  1
57  15  23       6
57  17  25  27   6
57  19  38  11             5
57  21  40  29  38  42     5
```

FIG. 20A

```
 4  8 16 18 35 39 45 47 54 57
NULL
NULL
57 16 24
57 18 26 28
20 12 57 39
22 41 39 57 43

16 18 19 21 24 26 30 32 35 39 44 47 49 54 57    4
NULL    4
NULL    4
NULL    7
51 18 57 46 26 28  7
NULL                      7
39 21 57 43 32 36  7

3  5 11 13 19 21 38 40 44 46 53 57              3
NULL    3
NULL    3
57 17            1
46 57 17 34      1
57 19 30         7
57 21 32 36      7

4  6  8 10 16 18 39 43 45 46 51 57              2
NULL    2
NULL    2
57 16 24         7
57 18 26 28      7
57 30 39 12            0
57 22 41 14 39 43      0

3 11 19 21 29 38 40 42 44 47 50 57              5
NULL    5
NULL    5
57 15            1
34 17 57 46      1
19 57 30         7
21 57 32 36      7
                                        M
                                        B
 2  4  6 39 43 45 46 57                 G
NULL    0                               1
NULL    0
 8 57 16         2
10 57 18         2
12 57 20         0
14 57 22         0
                                        M
                                        B
 1  3  5 38 44 46 53 57                 G
NULL    1                               0
NULL    1
 7 57 15         1
 9 57 17         1
11 57 19         3
13 57 21         3
```

*FIG. 20B*

INPUT STATE 00

INPUT STATE 10

PROGRAMMABLE LOGIC DEVICE

RELATED APPLICATION

This application relates to application Ser. No. 07/614,686 filed Nov. 15, 1990 and entitled UNIVERSAL CELLULAR SEQUENTIAL LOGIC ARRAY. The contents of that application are incorporated by reference herein.

BACKGROUND

Providing an efficient programmable logic device and method is vital with the electronics industry and all related industries.

This invention relates to a logic device and method that can be efficiently configured. In particular, the device is operable with fast and powerful microprocessors, thereby enhancing speed and reducing size in electronic applications. Also, the central logic of the cellular array is amenable to desktop processor implementation.

As microprocessors have become faster, circular logic timing has become critical. At the same time, the more information and logic that can be stored on a silicon chip constituting a memory device, the more beneficial is that device to the semiconductor industry.

The invention is directed to a universal cellular array based on a state table method to logically program such cellular array.

Prior art of programmable logic devices are based on Gate array technology. Such technology requires a desired function to be broken into its basic parts such that an end result function is described in terms of a number of latches, shift registers, MUXS, counters and Medium Scale Integration (MSI) building blocks. The construction of MSI building blocks is decided with proximity to I/O buffers and their construction and placement determines the efficiency of the chip. The requirement of MSI building blocks for a typical sequential logic function is generally disadvantageous.

There is the need to provide a different programmable logic device which implements a cellular array, having the advantage of a more replicable circuit design.

SUMMARY

By this invention is provided a programmable logic device and method which allows for very high densities of cellular array circuit design. The function of the cells of the array is controlled either by a random access memory (RAM) or a programmable logic array and the invented system requires relatively far less programmable area, namely the area of a silicon chip for the cellular array versus the case of the traditional programmable logic approach.

The fundamental logic operation of the cellular array is a "route" between latches which are located on diagonal entries of the array. Boundary values are loaded into the boundary value memory, and this memory tells the memory cell in each column of the chip from which other memory cells it will receive its next value. The function of the device is the result of the boundary value encodings which yield the resultant routings in the cellular array.

According to the invention, there is provided the means and method for operating a computing element to compile a set of state-machine states in an incompletely specified state-machine. The state-machine has an input alphabet, internal states and multiple output functions. The state-machine has the characteristic of present internal states and next internal states, and not all of the next internal state entries are specified. As such, certain next internal state entries are considered as unspecified entries.

The input alphabet includes a plurality of input characters and the multiple output functions have the characteristics that not all output value entries are specified. As such, certain output value entries are left open as unspecified entries.

The state-machine states are compiled into a set of cellular array states.

The cells of the cellular array are created in a rectilinear format in a plurality of columns and rows and having locations along a main diagonal. Multiple memory cells are located along the main diagonal. Functions cells are located removed from the main diagonal for transferring information between the memory cells.

In the preferred form of the invention, there are multiple additional columns of cells for providing output values of the cellular array.

A programmable logic device includes means for operating a computing element to compile a set of state-machine states in an incompletely specified statemachine. The state-machine states are compiled into a set of cellular array states in a rectilinear format of columns and rows. Multiple memory cells are located on a main diagonal. Function cells are located removed from the main diagonal for transferring information between the memory cells. Compatible sets of sequences are formed of sequences which have non-equal effect. Compatible sets are processed to form a closed cover. A distinct memory cell is then assigned to each compatible set constituting that closed cover. The closed cover can be formed selectively by having a compatible set consist of either a single entry of one sequence, two or more sequences, being at least a pair of sequences, a maximal compatible set or less than maximal compatible set from a pair of compatibles. Moreover, the compatible set could be a prime compatible set or less than prime compatible set being derived from maximal or less than maximal compatible sets. The closed cover tree contains every sequence which does not have equal effect on the internal states of the state-machine. Each implication set corresponding to a compatible set which constitutes the tree is contained as a subset of at least one compatible set.

The compiling procedure includes the steps of generating a plurality of sequences of said input characters. The sequences of input characters are applied to a state-machine to obtain columns of internal state entries and unspecified entries.

Multiple sets of binary values and unspecified specifications on internal states are selected for substitution for the columns of internal state entries so that multiple output values and unspecified specifications of the cellular array in the multiple output columns conform to a predetermined set of output value functions and unspecified output specifications of the state-machine. The selected multiple sets of binary values and unspecified specifications are substituted for internal states. Testing the sequences for equal effect on the internal states with said substitute set of binary values and unspecified specifications is effected.

In a different preferred form of the invention, all of the state-machine states and multiple output functions are completely specified and all of the multiple output functions, there being selectively at least two output function columns, are simultaneously determined.

In such a case, a distinct memory cell is assigned to the substituted value. Unique output columns are assigned to each output function of the state-machine. A control memory is provided for controlling a transfer of information between memory cells.

Preferably, all of the multiple output functions are simultaneously determined when the state-machine is completely or incompletely specified. Incompletely specified means specified with selected entries and others being non-specified, namely having being left as unspecified entries.

In the preferred form of the invention where there is an incompletely specified state-machine, the number of memory cells in the multiple diagonal locations is at least no more than the number of memory cells required where the state-machine states and multiple output functions are completely specified.

Preferably, the memory cells support at least two and preferably multiple output values from the cellular array.

In a further preferred form of the invention, a pair chart for recording compatibility or incompatibility of pairs of sequences from sequences found to have non-equal effect on the internal states of an incompletely specified state-machine with multiple output values substituted is constructed. The pair chart also records pair implications for each pair of sequences found to be compatibles, for each input character of the state-machine. The compatibility or incompatibility for each pair of sequences from those sequences found to have non-equal effect on the internal states of the state-machine with multiple output functions substituted is determined for entry into the pair chart.

An antecedent pair of sequences for each pair of sequences found to be compatible and for each input character of the state-machine is determined. The pair implication set of sequences for each antecedent pair of sequences for entry into the pair chart is determined.

Thereafter, maximal compatible sets of sequences from the pair chart is derived to exhibit compatibility or incompatibility of each pair of sequences comprising the maximal compatible set. An implication set of sequences for the maximal compatible set of sequences may be derived for each input character of the state-machine from the pair chart.

In some forms of the invention, the distinct memory cells in the multiple memory cells of the main diagonal can be assigned a value based on the maximal compatible sets and the implication sets of sequences. A unique output column can be assigned to each output function of the state-machine and the control memory for controlling the transfer of information between the memory cells can be provided.

In a further refinement of the invention, prime compatible sets of sequences including, for each prime compatible set of sequences, and input character of the state-machine input alphabet, an implication set of sequences are derived from the maximal compatible sets of sequences and from the pair chart completed so as to exhibit the pair implications.

Candidate minimal cover trees having nodes wherein there is a minimal cover path having a least a number of nodes is derived so that each node of the candidate minimal cover trees corresponds to a prime compatible set of sequences.

In the further preferred form of the invention, each node of the minimal cover path is related to a distinct memory cell located along the main diagonal of the cellular array. Unique output columns are assigned to output functions and the control memory is provided for control of the transfer of information between the memory cells.

The invention is further described with reference to the accompanying drawings.

DRAWINGS

FIG. 8 is an example of a boundary value encoding under input state 0.

FIG. 9 is an example of a boundary value encoding under input state 1.

FIG. 9a is an example of initial binary value specifications of these memory cells comprising a cellular array.

FIG. 15 is an 8×8 cellular array space set out in relation to the boundary logic and in the state transition step 3 illustrating simultaneous routings.

FIG. 16 is a representation of the state table for a bus arbiter application of FIGS. 17a through FIG. 24 relate the development of the boundary value encoding for the bus arbiter.

FIG. 17a is a state-machine illustrating specified values and unspecified "don't care" values for the bus arbiter application.

FIG. 17b is part of the development of the state table with the generated plurality of sequences of the input characters.

FIG. 17c is part of the development for one output of the binary values and unspecified entries for the sequences developed in FIG. 17b.

FIG. 17d is part of the development for a second output of the binary values and unspecified entries for the sequences developed in FIG. 17b.

FIG. 19 is part of a pair chart completed for determining maximal compatible sets of sequences.

FIGS. 20a and 20b are the implication sets for each maximal compatible set of sequences.

DESCRIPTION

In this specification, the terms "cellular array" and "cellular space" are used interchangeably. The terms "boundary value" and "control value" are also used interchangeably.

The Basic Cell

The programmable space consists of a two-dimensional array of simple, repetitive cells. Two types of cells comprise the array: a memory cell, or latch FIG. 10, residing in each main diagonal grid location of the space, and a logic cell two of which are exhibited in FIG. 11 residing in all off-diagonal grid locations. The two-dimensional array of logic cells comprise the space, with the exception of the main diagonal which, as indicated, is composed of memory cells.

As exhibited, the memory cell is composed of three segments: a 3 to 1 multiplexer, a latch, and a controlling logic segment.

The multiplexer segment of the memory cell has three binary input lines—the left-most input line being a feedback line for the latch, the middle input line emanating from the lower portion of the column of the space containing the latch, and the right-most input line emanating from the upper portion of that column.

A cellular space state transition is executed upon the occurrence of a clock pulse. Upon the occurrence of a clock pulse, the latch in each column stores the binary value which is the output of the multiplexer. This stored binary value is then placed on two data lines, one data line directed to the right of the memory cell and the other data line directed to the left of the memory cell, as exhibited. These two data lines propagate the binary value of the latch to all logic cells in the space occupying the row of that latch.

Figure 10:
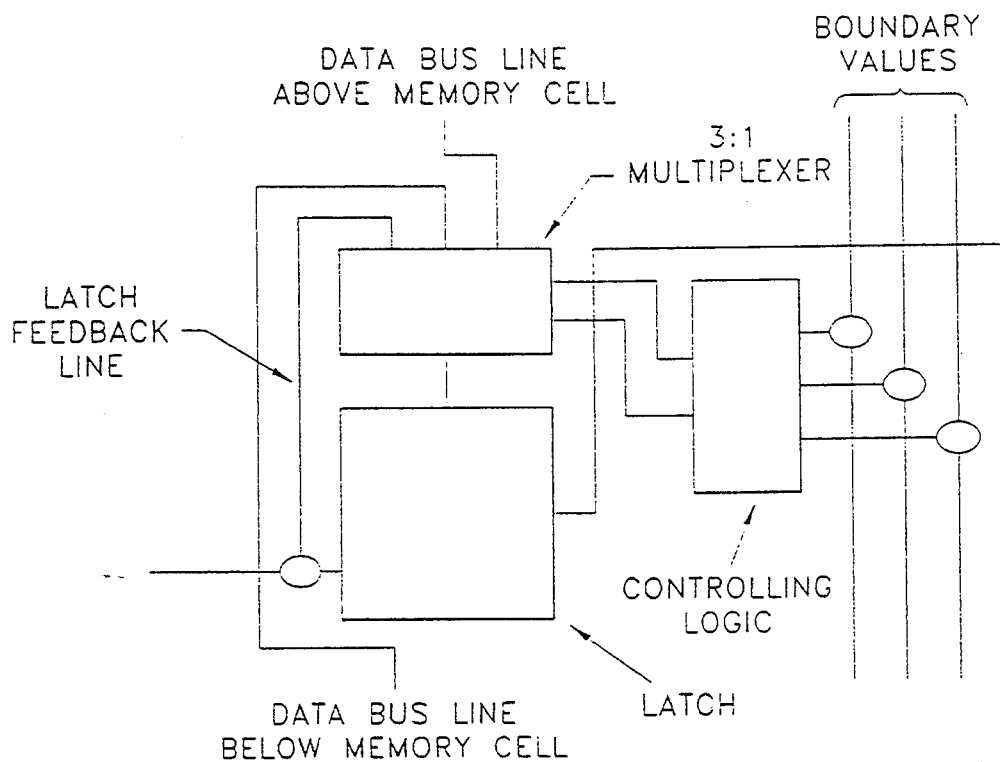
FIG. 10 is a memory cell or latch in accordance with the invention.

As indicated in FIG. 10, the controlling logic segment of the memory cell determines the setting of the 3 to 1 multiplexer. This controlling logic segment is a simple combinational (memoryless) logic function of a set of boundary values (those programmable values which determine the function of the micro-device). This set of boundary values (three are indicated in FIG. 10) controls not only the memory cell (that is, the multiplexer portion of the memory cell) of each column but these boundary values also control the function of each of the logic cells which comprise the remaining portion of the column.

Although three boundary values are shown, the number of boundary values varies with the size of the cellular space and this number is determined to be the log base 2 of the size of one dimension of the space. Our cellular space is the only programmable logic device having so few boundary values that they can reside as a strip in one small portion of the microchip.

Figure 11:
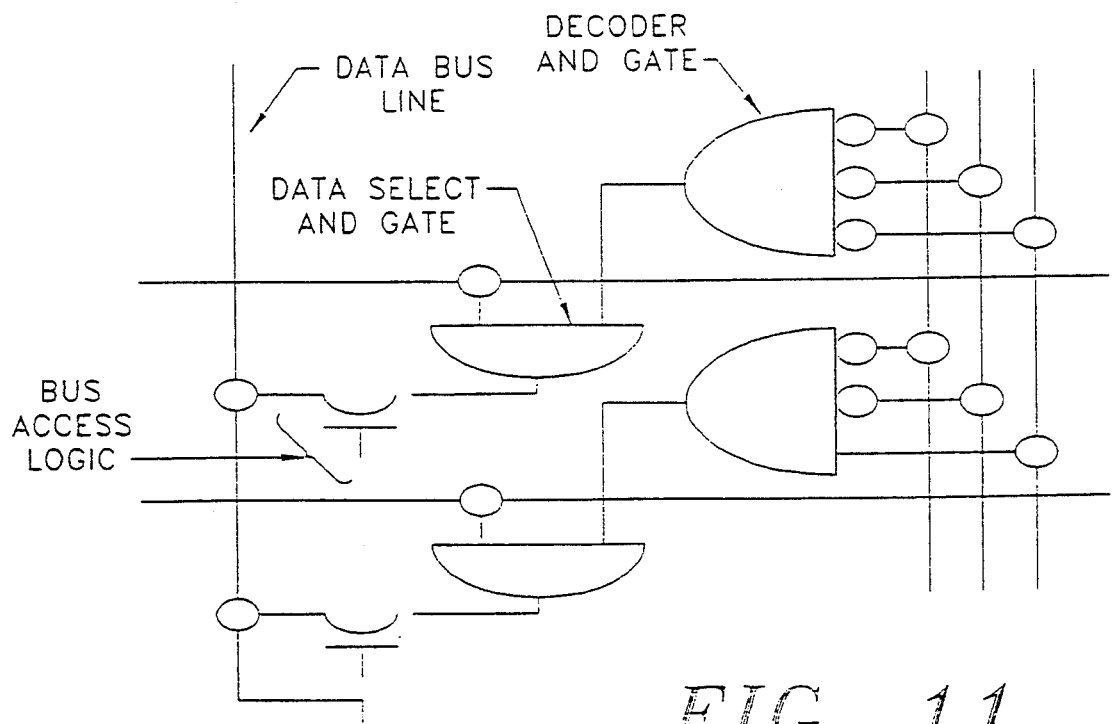
FIG. 11 are representations of two logic cells or functions cells in accordance with the invention.

Each logic cell, two of which are shown in FIG. 11, consists of two AND gates, a DECODER AND gate, and a DATA SELECT AND gate, and BUS ACCESS logic. The set of DECODER AND gates of all logic cells occupying a column constitutes a LOGICAL DECODER of the set of boundary values for that column. The output of the DECODER AND gate of only one logic cell per column becomes unity—the particular logic cell occupying the row which is designated as the value of the boundary values when interpreted as a binary integer.

The DATA SELECT AND gate of the logic cell performs the logical function AND of the binary value of the DECODER AND gate, with the binary value of the data line emanating from the latch residing in the row of that logic cell. Hence, the output of the DATA SELECT AND gate is one only if both the output of the DECODER AND gate of that logic cell and the value of the diagonal latch in the row of that logic cell are both one. Since only one DECODER AND gate per column assumes the value one, only one DATA SELECT AND gate per column, at most, assumes the value one.

The Basic Cellular Array

Figure 12:
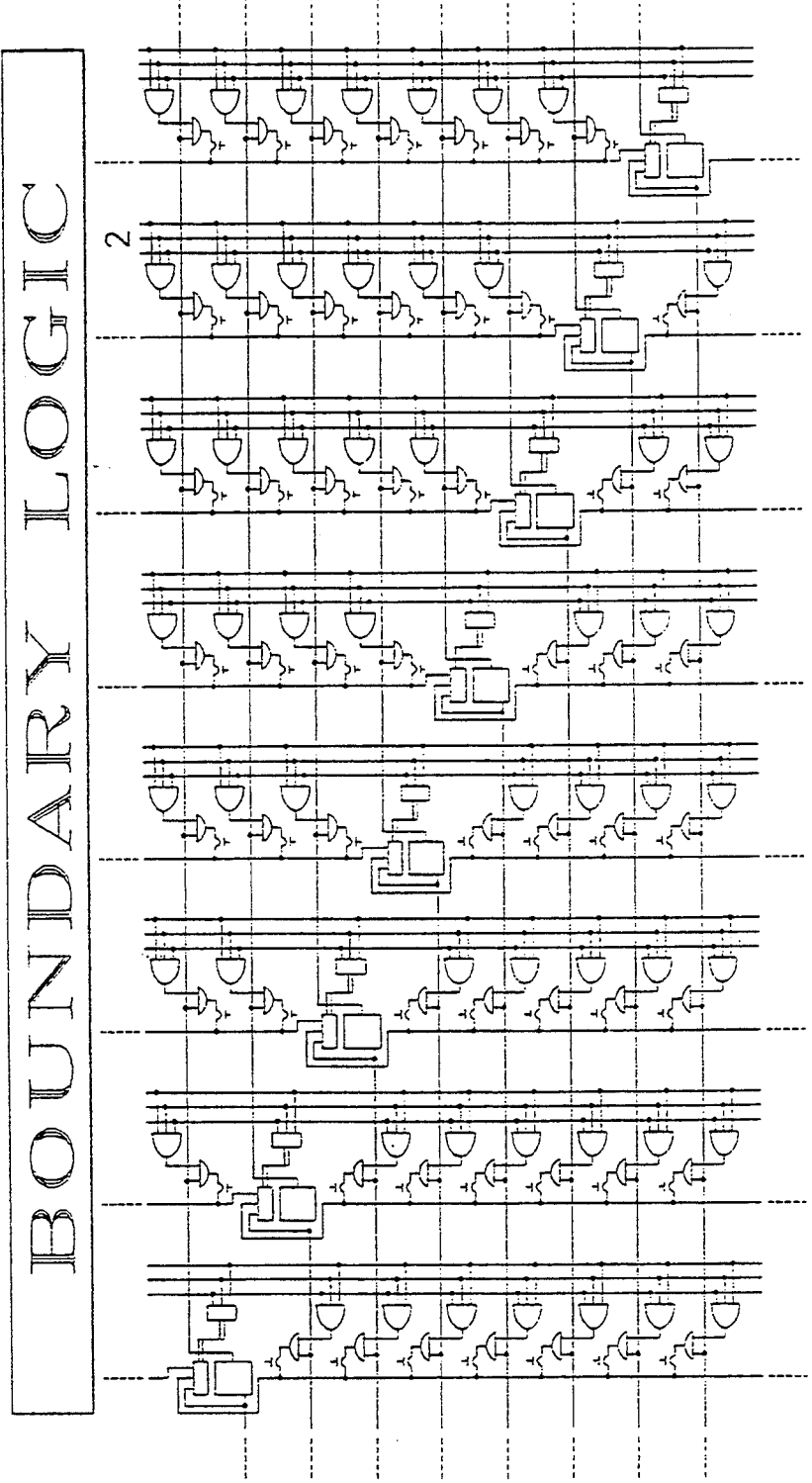
FIG. 12 is an 8×8 cellular array space set out in relation to the boundary logic and in the state transition step 1.

A cellular array can be exhibited from the schematic diagram of FIG. 12, representing an 8×8 array for illustration purposes. Note that a memory cell occupies each diagonal entry of the 8×8 array and logic cells occupy all other entries. Note also that the three entries into each memory cell multiplexer are:

1. the latch feedback line;
2. the bus connecting all logic cells of the column below the memory cell; and
3. the bus connecting all logic cells of the column above the memory cell.

The boundary values of the cellular array are produced by the boundary logic block residing in a strip on top of the array. This boundary logic block produces the boundary values as logical functions of the input lines of the sequential machine being emulated.

The State Transition Process

Figure 13:
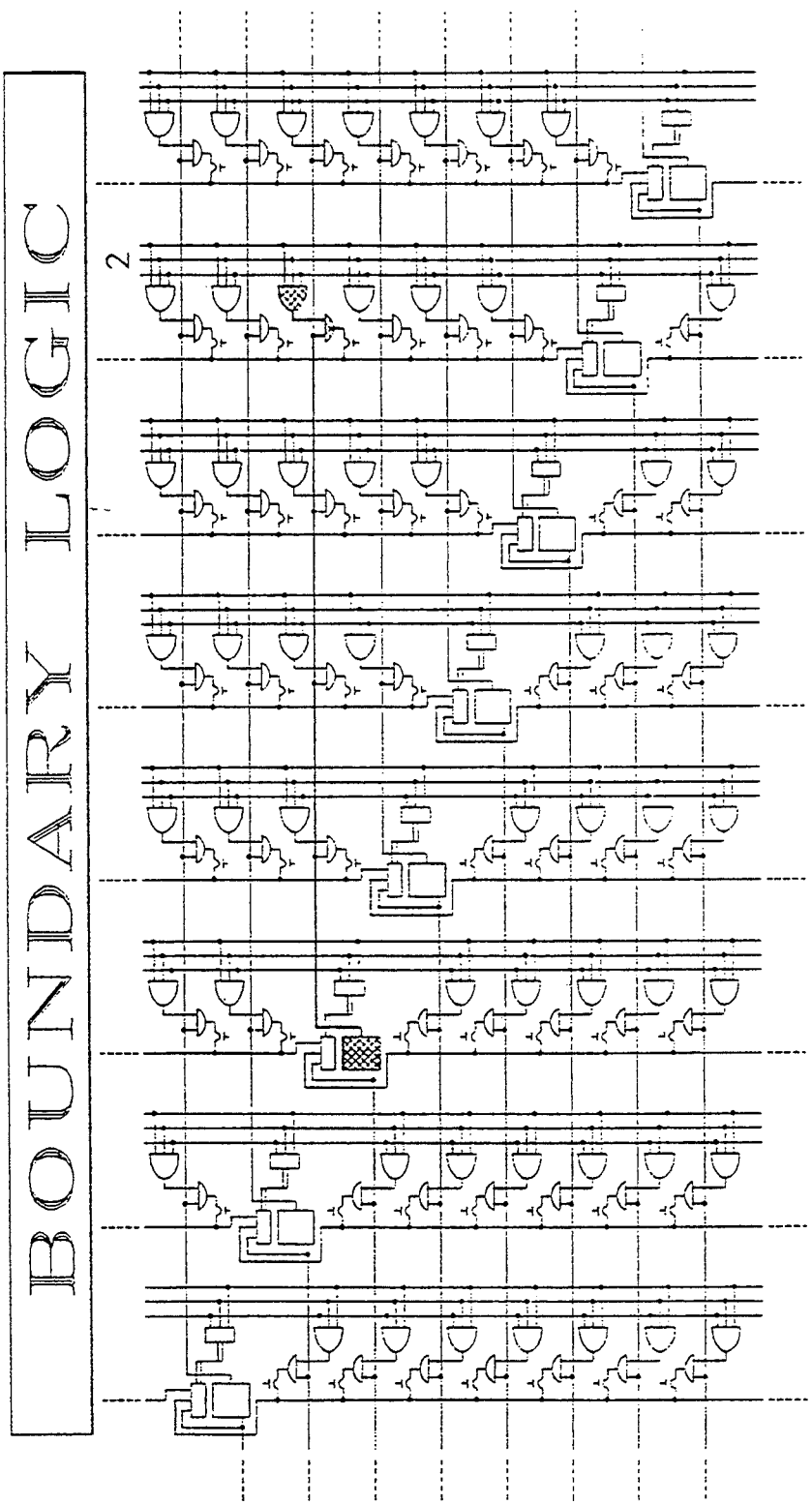
FIG. 13 is an 8×8 cellular array space set out in relation to the boundary logic and in the state transition step 2.
Figure 14:
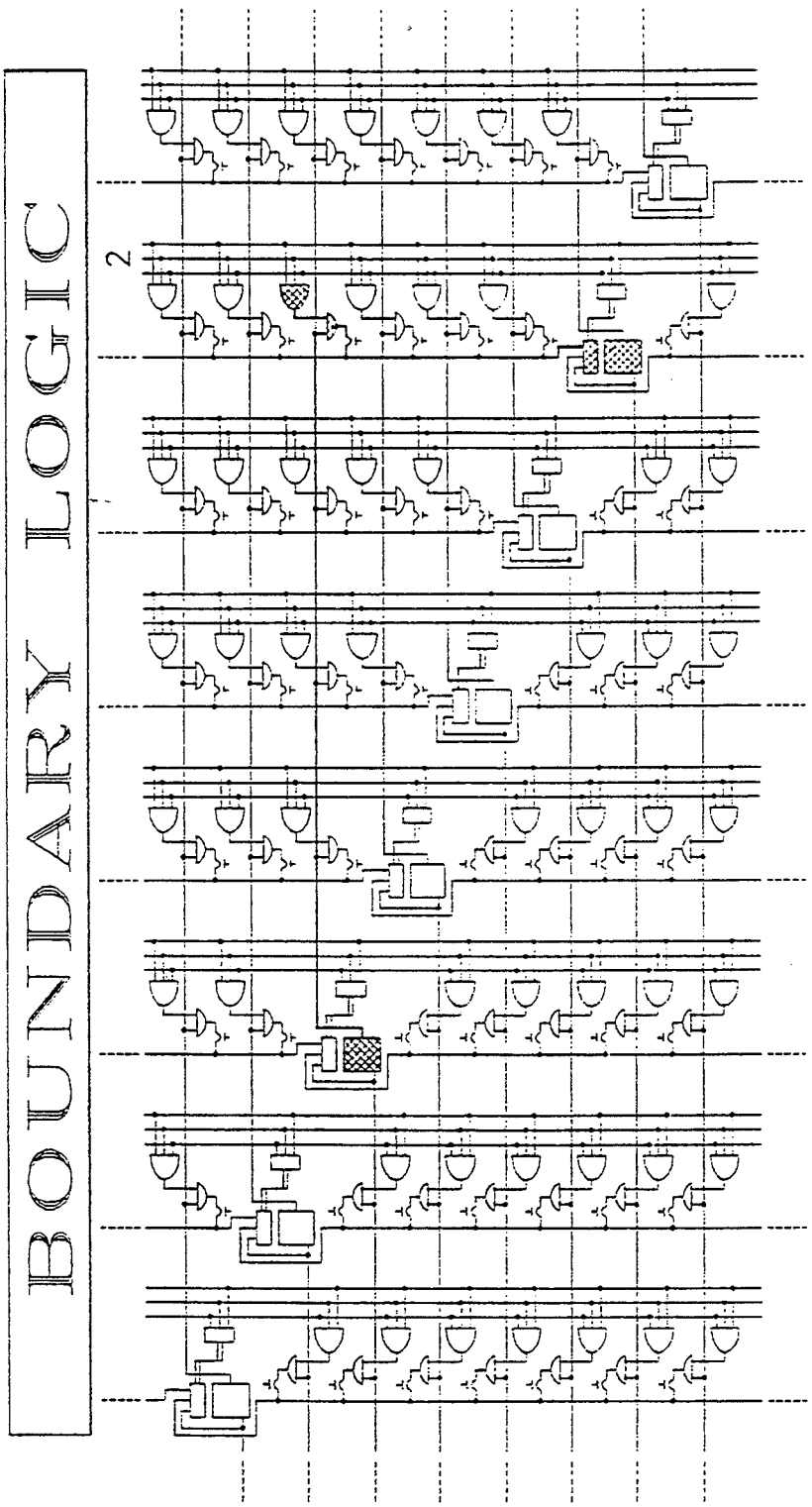
FIG. 14 is an 8×8 cellular array space set out in relation to the boundary logic and in the state transition step 3.

A state transition of the cellular array, which emulates a state transition of an arbitrary synchronous sequential device (a digital logic device containing memory) occurs in three steps, illustrated in FIGS. 12, 13 and 14, respectively.

A step one, shown in FIG. 12, the boundary logic block produces a unique binary integer to be placed on the boundary values of each column. FIG. 12 illustrates this process for the second to right-most column—the integer 2 is placed on the boundary values of that column.

At step two, shown in FIG. 13, this boundary value integer (the integer 2 in the second to right-most column of the cellular space) is decoded by the set of DECODER AND gates residing in that column, and the DECODER AND gate in row 2 (labeling the rows of the cellular space as rows 0 through 7) becomes one. Hence, the DATA SELECT AND gate residing at the logic cell location (row 2, column 6) assumes the value of the latch in column 2. This selection process and data path are highlighted in FIG. 13.

At step three, shown in FIG. 14, the bus access logic at location (row 2, column 6) pulls the bus connecting all logic cells above the memory cell of column 6 to the logical value one only if the output of the DATA SELECT AND gate at that location is unity (that is, only if the latch in column 2 has value one); otherwise, the bus connecting all logic cells above the memory cell of column 6 retains its zero state. Simultaneously, the controlling logic of the memory cell of column 6 sets its multiplexer to accept the data bus emanating from the upper portion of the column, so that the value of this bus enters the latch in column 6 on the next clock pulse to complete the cellular space state transition. This final state transition process is highlighted in FIG. 14.

This operation of directing a binary value from one diagonal latch to another, known as "routing," is the fundamental operation of the cellular array. FIG. 15 shows three simultaneous routings; however, an integer is to be placed on the boundary values of each column and routings for all columns of the cellular array are to occur simultaneously.

A digital logic application requiring memory elements and logic elements for implementation can formally be specified in the vernacular of a state-machine. The following narrative describes a procedure to derive boundary value encodings for our cellular array, beginning with a formal state-machine description of our application.

Encoding Process

As is known in the art of sequential machines, a state-machine is said to exist in one of two general categories:
(i) Completely Specified; and
(ii) Incompletely Specified.

Figure 1:
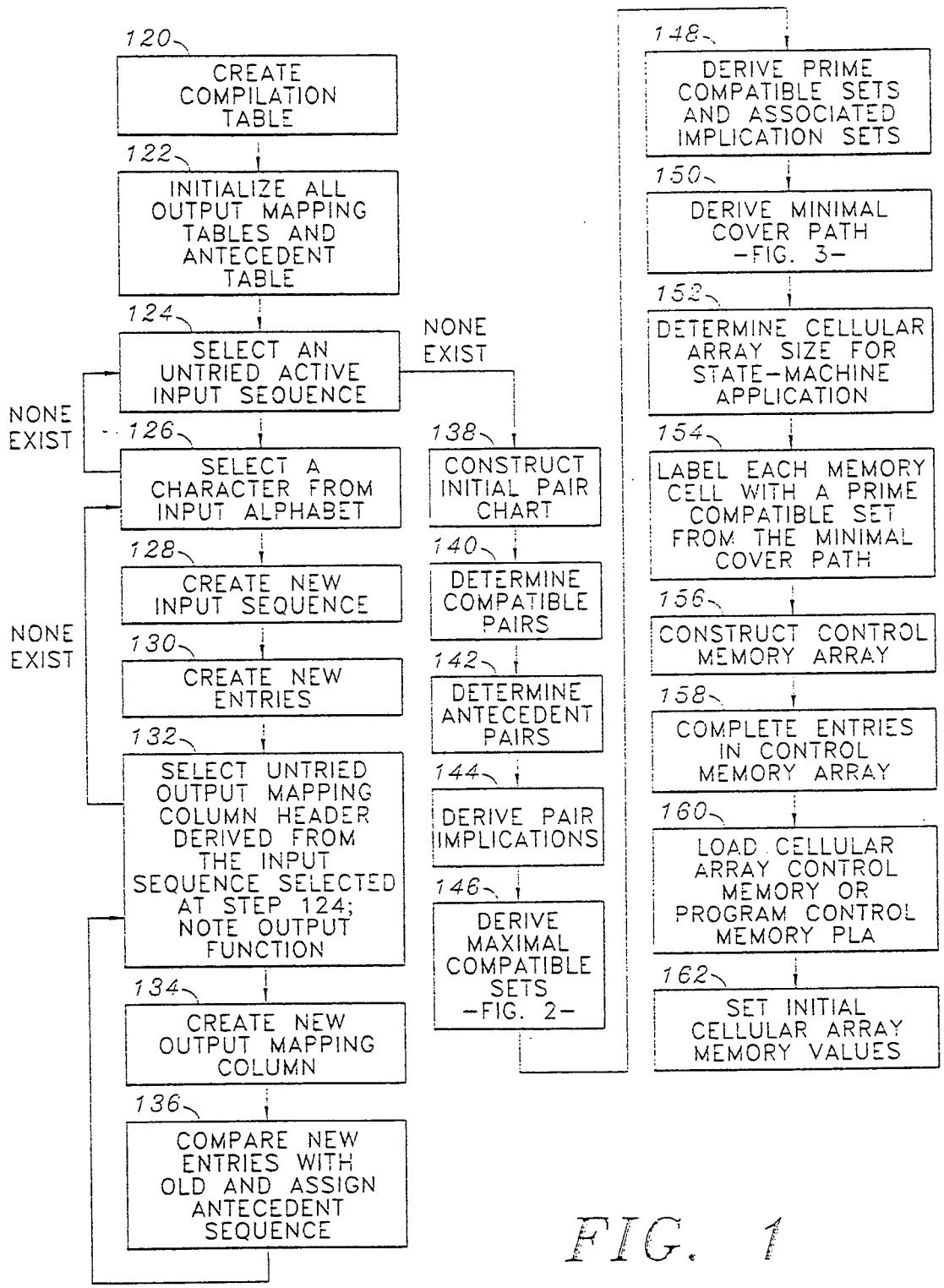
FIG. 1 is a flow diagram illustrating the compiling of state-machine states into cellular array states for an incompletely specified state-machine having multiple output functions.
Figure 1A:
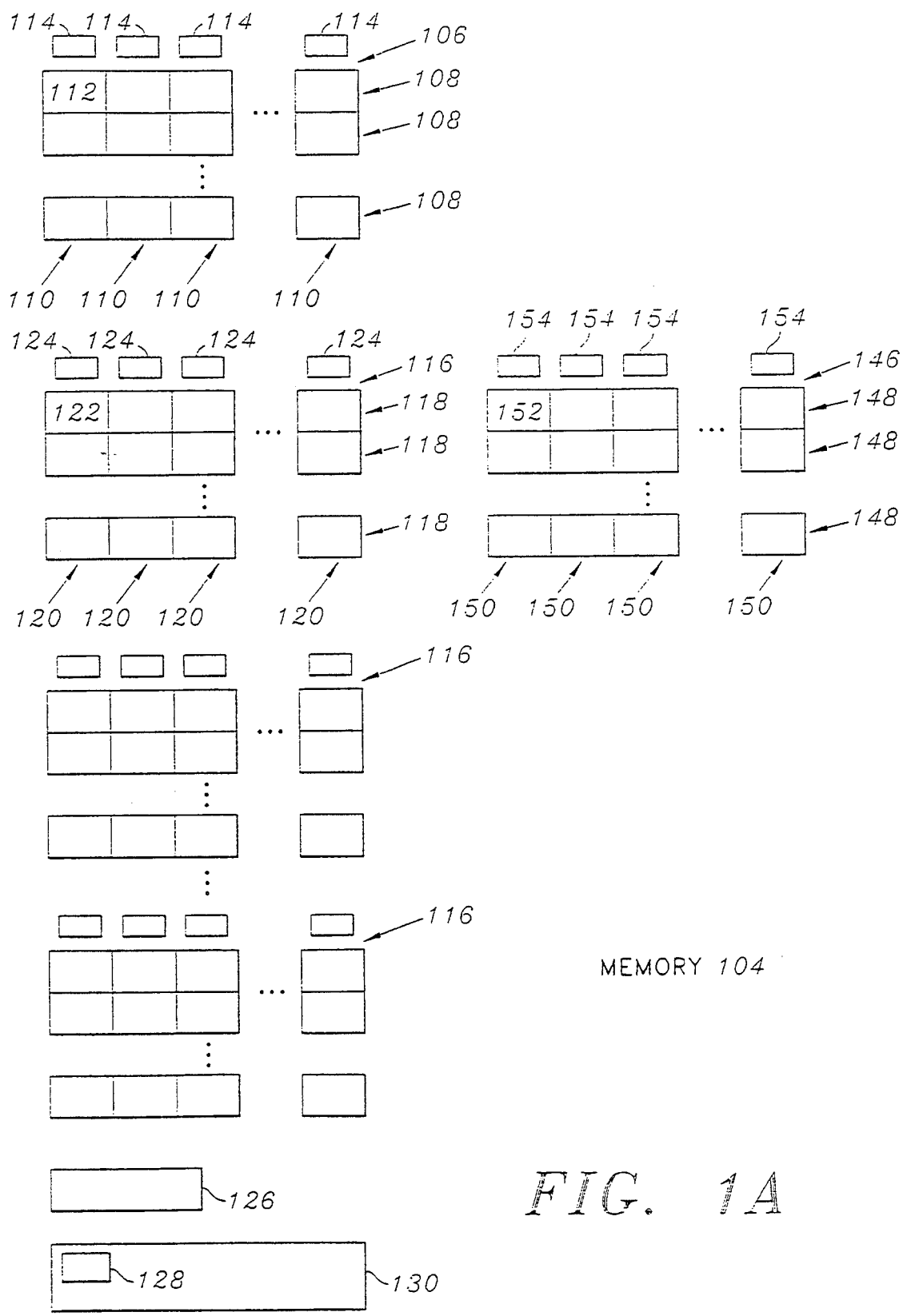
FIG. 1a illustrates the arrangement of the arrays in rows and columns in relation to other components of the programmable logic device (for storing information as intermediate steps in control memory encoding).
Figure 4:
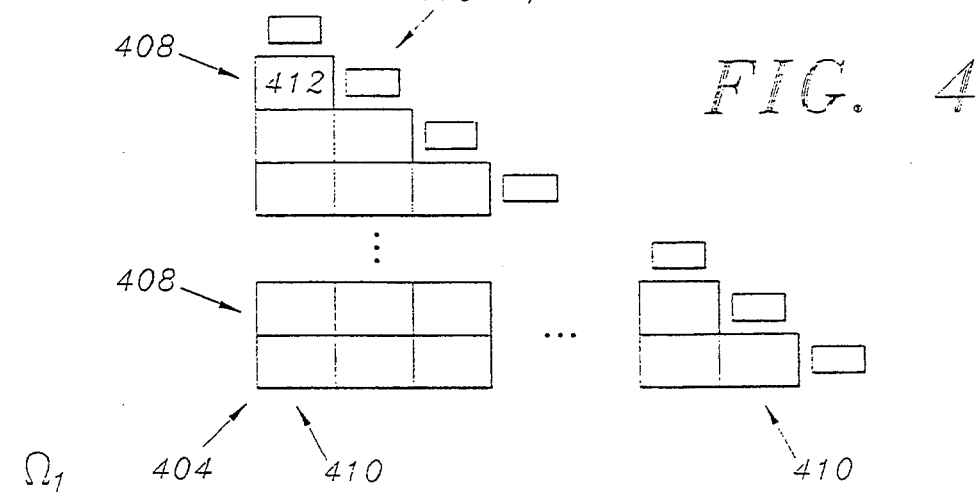
FIG. 4 is a representation of a pair chart illustrating the columns and rows of such chart.

FIG. 4 of the patent application entitled UNIVERSAL CELLULAR SEQUENTIAL LOGIC ARRAY, submitted to the U.S. Patent And Trademarks Office in March, 1988, exhibits a technique for compiling sets of state-machine states into cellular array states for a completely specified state-machine, whereas FIG. 1 of this narrative gives a method of compiling sets of state-machine states into cellular array states for an incompletely specified state-machine.

An example of a completely specified state-machine is exhibited in Table 1:

TABLE 1

| Completely Specified State Table | | | |
|---|---|---|---|
| | 0 | 1 | Z |
| → a | b | c | 0 |
| b | c | b | 1 |
| c | a | c | 1 |

In Table 1, the state-machine consists of the set of internal states, {a,b,c}, input states, {0,1}, and output states {0,1}. The left hand column of internal state entries in Table 1 constitutes the set of present state entries, whereas the column of internal state entries under the input character 0 constitutes the set of next state entries under input state 0 and the column of internal state entries under input character 1 constitutes the set of next state entries under input state 1. Finally, the column of binary value entries under the output Z column constitutes the binary output function, where each internal state in the present state column (left hand column of the state table) is assigned a binary value, designated by the value in the output Z column which occupies the row of that present state entry, which is the binary output value of the state-machine when the state machine is in that present internal state. Each internal state typically represents a binary encoding of internal memory, unique for each such internal state. As depicted in Table 1, internal state a is the initial state, or starting state of the sequential machine. On the first clock pulse into the sequential machine, under an input state of 0, the device progresses from internal state a to internal state b, resulting in an output state change from 0 to 1. If the input state is 1 rather than 0, the occurrence of the first clock pulse causes the sequential machine to progress from internal state a to internal state c, also resulting in a change of output state from 0 to 1. Typically, the input state is adjusted to a new value (in this case, 0 or 1) prior to the occurrence of the next clock pulse, at which time a new internal state and output state is achieved as before.

In most practical instances, the formal state-machine description of a sequential digital logic procedure is an incompletely specified state-machine with multiple output functions, as exhibited in Table 2.

TABLE 2

| Incompletely Specified State Table | | | | |
|---|---|---|---|---|
| | 0 | 1 | $Z_1$ | $Z_2$ |
| a | b | c | 0 | 1 |
| b | c | b | 1 | 0 |
| c | - | c | - | 1 |

Table 2 differs from Table 1 in two categories. First, more than one output function is specified. Hence, there are two output lines, labelled $Z_1$ and $Z_2$, and, therefore, two binary state-machine output values are specified for each internal state in the present state (left hand) column. The second distinction between Table 2 and Table 1 is that unspecified entries are indicated. For instance, the leftmost output line $Z_1$ is left as a "—", meaning unspecified, for internal state c. That is, when the sequential machine, represented by the state table of Table 2, is residing in internal state c, the specification of the first output line is not required and it can be either 0 or 1 in the above case. Similarly, in Table 2, the next internal state entry when the sequential machine represented by the state table of Table 2 is in internal state c and has an input state of 0 is also an unspecified, or arbitrary entry, and the next internal state in this case can be either a, b, or c.

The advantage of leaving certain entries unspecified when allowable, as in Table 2, is that the procedure of deriving an optimal (least size cellular array, or least amount of silicon area) cellular array implementation from the incompletely specified state table allows a reduced cellular array size, verses the case for a completely specified state table. Also, in specifying multiple output lines, the minimal size cellular array required to compute multiple output lines simultaneously is determined. That is, one section of minimal size space can support multiple output functions simultaneously.

FIG. 1 shows a method of compiling state-machine states into cellular array states for an incompletely specified state-machine having multiple output functions. This method will yield the minimal size cellular array control memory encoding which will support all output functions simultaneously for a candidate incompletely specified state table. It ought to be pointed out that the control memory encoding procedure for the completely specified state table having only one output function, as exhibited in FIG. 4 of the patent pending application entitled UNIVERSAL CELLULAR SEQUENTIAL LOGIC ARRAY, submitted to the U.S. Patent And Trademarks Office in Mar., 1988, is a special case of this procedure and the procedure exhibited in this narrative and FIG. 1 reduces to the other case for the completely specified state table and single output function.

As in FIG. 4 of the existing patent application for the completely specified case, equivalence classes of input sequences are generated. Initially, as in the completely specified case with a single output function, the space of all possible input sequences is subjected to an exhaustive search, with sequences yielding duplicate effect upon the state-machine discarded, until all equivalence classes have been found. In the incompletely specified case, however, generating the set of final state-machine states by applying an input sequence to the state-machine constitutes only an intermediate step prior to comparison of the newly generated column of final state-machine states with those columns of state-machine states generated by previously determined active input sequences. In the incompletely specified case, comparison of a column of final state-machine states determined by a new active input sequence with a column of state-machine states determined by a previously generated active input sequence occurs only after selected binary values and unspecified values determined by the multiple output functions of the incompletely specified state-machine are substituted for the columns of final state-machine states determined by said active input sequences applied to said state-machine, thus facilitating the new concept of the "antecedent sequence". It is as if, in the patent application "Universal Cellular Sequential Logic Array", step 434 is placed immediately after step 430 prior to comparison at step 432 of the new column of entries created at step 430 with previously generated columns, with certain embellishments due to the state-machine having multiple output functions and unspecified entries. The significance of the "antecedent sequence" will become clear in the description of the algorithm for compiling sets of state-machine states into cellular array states for an incompletely specified state-machine having multiple output functions.

The compilation method of FIG. 1 may be performed by a computing element under control of appropriate software, as is well known in the art. During operation of the compilation and assignment method of FIG. 1, the computing element may make use of several registers in memory 104, including a Compilation Table 106 having a set of rows 108, a unique row for each present state entry of the state-machine, and columns 110 and associated with each column 110 a column header 114, and a row entry 112 at the intersection of each row 108 and column 110. The computing element may also make use of a set of output mapping tables 116, a unique output mapping table associated with each output function of the state-machine, each output mapping table having a set of rows 118, a unique row for each present state entry of the state-machine, and columns 120, and associated with each column 120 a column header 124, and a row entry 122 at the intersection of each row 118 and column 120. Finally, the computing element may also make use of an antecedent table 146, the antecedent table consisting of a set of rows 148, a unique row for each input character of the state-machine, and columns 150, and, associated with each column 150 a column header 154, and a row entry 152 at the intersection of each row 148 and column 150.

Therefore, at step 120, the Compilation Table 106 is created with one row 108 for each present state entry of the state-machine and one column 110 for each active input sequence 126. Initially, the null sequence is the only active input sequence 126 and it is marked as untried. Each row entry 112 for the null sequence /\ is set equal to that row entry of the present state column of the state-machine. The column header 114 of the initial column 110 of the compilation table is the /\ input sequence.

At step 122, each output mapping table is created with one column per output mapping table, that column consisting of a multiplicity of rows, one row for each present state entry of the state-machine. The number of output mapping tables created at step 122 is the number of output functions of the state-machine. Initially, only the first column of each output mapping table is created. Each row entry 122 of the first column 120 of the first output mapping table is determined to be that row entry 112 of the /\ column of the Compilation Table replaced with its output value assignment given by the first output function of the state-machine. The column header 124 of the newly designated output mapping column 120 is the /\ sequence further distinguished by the first output function of the state-machine. Each row entry 122 of the first column 120 of the second output mapping table is determined to be that row entry 112 of the /\ column of the Compilation Table replaced with its output value assignment given by the second output function of the state-machine. And, the column header 124 of the newly designated output mapping column 120 of the second output mapping table is the /\ sequence further distinguished by the second output function of the state-machine, etc. An initial column of output values substituted for present state entries is determined for each output mapping table, one output mapping table created for each output function of the state-machine. And, the column header 124 of the newly created output mapping column 120 is the /\ sequence distinguished by the state-machine output function associated with said output mapping table. There remains at step 122 to designate the newly created column headers of output mapping columns as active. The column header of the first column of the first output mapping table is designated active. Also, the column header of the first column of the first output mapping table is entered as the column header entry 154 of the initial column 150 of the antecedent table 146. The column header of the first column of the second output mapping table is designated active if it does not have equal effect on the state-machine as the first column of the first output mapping table, that is, if the entries of this column are not equal, entry for entry, including unspecified entries, to the entries of the first column of the first output mapping table, else the first column of the second output mapping table is deleted from the second output mapping table. If the column header of the first column of the second output mapping table is designated active, then a new column 150 of the antecedent table 146 is initiated by entering the column header 124 of the first output mapping column of the second output mapping table as a new column header 154. The column header of the first column of the third output mapping table is designated active if the first column of the third output mapping table does not have equal effect on the state-machine as either the first column of the first output mapping table or the first column of the second output mapping table, else the first column of the third output mapping table is deleted from the third output mapping table, etc. If the column header of the first column of the third output mapping table is designated active, then a new column 150 of the antecedent table 146 is initiated by entering this column header as a new column header 154. The column header of the first column of the lth output mapping table is designated active if the first column of the lth output mapping table does not have equal effect on the state-machine as the first column of each kth output mapping table, for all k<l , else the first column of the lth output mapping table is deleted from the lth output mapping table. Also, if the column header of the first column of the lth output mapping table is designated active, then a new column 150 of the antecedent table 146 is initiated by entering this column header as a new column header 154. Each unique output function of the state-machine yields an initial active output mapping column 120 for a unique output mapping table as well as a unique antecedent table column header 156.

A step 124, an active input sequence 126 is selected from the Compilation Table and called the old active input sequence 126. If no untried active input sequence 126 exists, control transfers to step 138 to terminate the compilation method of FIG. 1. Else, every character 128 from the state-machine input alphabet 130 is marked untried, and control transfers to step 126.

At step 126, a character 128 from the state-machine input alphabet 130 is selected and marked as tried. Typically, the entire state-machine input alphabet will comprise the characters "0" and "1". If no untried character 128 exists, control transfers to step 124 to try another selected active input sequence 126. Else control transfers to step 128.

At step 128, a new input sequence 126 is created, equal to the old active input sequence 126 with the selected character 128 from the state-machine input alphabet 130 appended. The new input sequence 126 is marked untried.

At step 130, a new column 110 is created for possible entry into the Compilation Table 106. Each row entry 112 of the new column 110 is set equal to the target state-machine state resulting by applying the new active input sequence 126 created in step 128, one input symbol 128 at a time, in reverse order, to the state-machine state which is that entry in the identical row 108 in the column 110 of the Compilation Table having the null string (/\ ) as a column header. The column header of this new column of internal state entries created at step 130 is the new input sequence created at step 128. Finally, at step 130, each active output mapping column header 124 derived from the input sequence selected at step 124 (that is, each active output mapping column header 124 which consists of the input sequence selected at step 124 further distinguished by a state-machine output function) is marked untried. Control proceeds at step 132.

At step 132, an untried active output mapping column header 124 derived from the input sequence selected at step 124 (an untried active output mapping column header which consists of the input sequence derived at step 124 further distinguished by a state-machine output function) is selected and marked as tried and the state-machine output function which distinguishes this selected untried output mapping column header is noted. If no untried active output mapping column header derived from the input sequence selected at step 124 exists, then control returns to step 126. Else, control transfers to step 134.

At step 134, a new output mapping column 120 is created for possible inclusion in an output mapping table by applying the state-machine output function noted at step 132 to the column of final state-machine states created at step 130. Each row entry 122 for the new output mapping column 120 is determined to be the identical row entry 112 of the new column 110, created at step 130, replaced with its output value assignment as designated by said output function noted at step 132. The column header 124 of this new column 120 is the new input sequence 126 created at step 128 distinguished by the state-machine output function noted at step 132 (the input sequence and state-machine output function required to create this new column 120).

At step 136, the output mapping column 120 created at step 134 is compared with all previously generated active output mapping columns of all output mapping tables for equal effect. If the output mapping column created at step 134 does not have equal effect with any previously generated output mapping column, then the column header 124 of the said output mapping column created at step 134 is declared active and this column header 124 is entered as a new column header 154 initiating a new column 150 of the antecedent table 146. Furthermore, this column header 124 created at step 134 is designated the antecedent sequence of the column header 124 of the output mapping column 120 selected at step 132, under the input character selected at step 126. And, this new output mapping column 120 created at step 134 is added to the output mapping table associated with the output function noted at step 132. Also, the new input sequence determined at step 128 is declared active and its associated column of state-machine internal states created at step 130 is added to the Compilation Table 116. Alternatively, if the output mapping column created at step 134 is found to have equal effect as a previously generated output mapping column, then column header 124 of the previously generated output mapping column which is found to have equal effect with the output mapping column created at step 134 is designated the antecedent sequence of the column header 124 of the output mapping column 120 selected at step 132 under the input character selected at step 126. The said antecedent sequence, whether it is the column header 124 of the output mapping column 120 created at step 134 or a column header 124 of a previously generated output mapping column which is found to have equal effect, is then entered as an element 152 in that column 150 of the antecedent table 146 which has as its column header the column header 124 of the output mapping column 120 selected at step 132, in the row of that column associated with the input character selected at step 126.

At step 138, an initial pair chart 404 is constructed, exhibited in FIG. 4. This pair chart is a two dimensional indexed array which will contain as entries the outputs of step 140 (determination of compatible pairs) and of step 144 (derivation of pair implications). Also, the completed pair chart—the resulting pair chart after completion of steps 140,142, and 144—is used to derive the maximal compatible sets at step 146.

The number of columns 410 in the pair chart 404 is the number of unique column headers 154 of the antecedent table 146. Each column 410 of the pair chart 404 has a column header 416, the column header of each column of the pair chart being a unique column header 154 of the antecedent table 146. The number of places for entries 412 in the leftmost column of the pair chart (other than the header) is one less than the number of column headers 154 of the antecedent table 146. The number of places for entries in each remaining column is one less than the number of places for entries in the column which is its left hand neighbor. Hence, the second to the leftmost column in the array has one fewer entry in it than the leftmost column and the second to leftmost column begins in the array one entry lower than the leftmost column, Equivalently, the third to the leftmost column in the array has one fewer entry in it than the second to the leftmost column and the third to the leftmost column begins one entry lower than the second to the leftmost column, etc. Hence, the pair chart resembles the appearance of a pyramid, its highest point being its leftmost column and its lowest point (just a row labelling) being its rightmost column. The input sequence which heads up a particular column is aligned with a row 408 of each column to the left of the column which it heads. For instance, the input sequence which heads up the third to the leftmost column is aligned with the top row of the second to the leftmost column and with the second to the top row of the leftmost column. Each entry 412 in the matrix which constitutes the pair chart 404 is therefore indexed by two input sequences, one input sequence heading the column of that entry and the other input sequence aligned with the row of that entry. Each input sequence 416 therefore occupies a diagonal entry of the pair chart, heading a column and aligning with a row.

The rightmost column of the pair chart consists only of an input sequence which is aligned with the bottom row.

At step 140, each input sequence which is included as a column header 154 of the antecedent table 146 is compared with each other such input sequence for compatibility. Two input sequences which are entered as column headers 154 of the antecedent table 146 are said to be incompatible if any entry 122 in the associated column 120 of the output mapping table 116, which has as a column header one such input sequence (that column of an output mapping table created by applying the said input sequence to the state-machine to obtain a column of final state entries and further applying the state-machine output function which distinguishes the said input sequence to the column of final state-machine state entries to obtain the output mapping column) contains a 0 and the entry 122 in the identical row 118 of the associated output mapping column 120 which has as a column header the other input sequence, contains a 1. Two input sequences which are not incompatible for every row entry 122 are said to be compatible.

The initial pair chart 404 is used to enter the results of step 140. For each entry 412 in the pair chart 404, an X is entered in that entry point if the header 416 of the column of that entry is incompatible with the input sequence 416 aligned with the row of that entry, otherwise the entry is left blank. Note that there is one entry 412 in the pair chart 404 for each pair of unique input sequences which are column headers 154 of the antecedent table 146.

At step 142, for each compatible pair of input sequences derived at step 140 and for each input character of the input alphabet of the state-machine, an antecedent pair of compatible input sequences is determined. The antecedent pair of input sequences is derived from the compatible pair of input sequences by obtaining two entries from the antecedent table 146, these two entries constituting the antecedent pair of input sequences. One entry obtained from the antecedent table is obtained from that column 150 of the antecedent table having as a column header one member of the said compatible pair of input sequences and the other entry of the antecedent pair is obtained from that column 150 of the antecedent table which has as a column header the other member of the said compatible pair of input sequences. Both input sequences which constitute the antecedent pair are obtained from that row of the antecedent table which is associated with the said input character. Hence, an antecedent pair of input sequences is determined (for the compatible pair of input sequences) for each input character comprising the input alphabet of the state-machine.

At step 144, a set of pair implications is determined for each compatible pair derived at step 140. It is noted that, at step 142, k antecedent pairs of input sequences are associated with each compatible pair derived at step 140, k being the number of input states of the incompletely specified state-machine being considered. Each one of these k antecedent pairs of input sequences becomes a pair implication for the associated compatible pair derived at step 140, with the following four exceptions:

(i) If both antecedent input sequences of a compatible pair (under a particular input state) are the same input sequence, then this pair implication becomes only the single input sequence.

(ii) If one of the antecedent input sequences of a compatible pair (under a particular input state) is the column header 124 of an output mapping column 120 which contains strictly "unspecified" ("—") entries, then the associated pair implication becomes just the single entry which is the other input sequence of the antecedent pair.

(iii) If both of the antecedent input sequences of a compatible pair (under a particular input state) are column headers of output mapping columns containing strictly "unspecified" ("—") entries, then the associated pair implication becomes the null set.

(iv) If both of the antecedent input sequences of a compatible pair (under a particular input state) are contained as a subset of the compatible pair, then the pair implication becomes the null set.

The pair chart is now used to enter the results of step 144. As indicated, a blank entry in the pair chart, resulting from step 140, indicates compatibility of the input sequence which is the column header of the column containing that blank entry with the input sequence aligned with the row of that blank entry. Hence, for each blank entry in the pair chart, we enter the pair implications for the compatible pair (column header and row label) associated with that blank entry, derived at step 144. As indicated, the number of pair implications per entry is the number of input characters comprising the input alphabet of the state-machine being considered.

At step 146, the set of pair compatibles derived at step 140 are used to derive maximal compatible sets. A maximal compatible set is a set of input sequences having the following two characteristics:

(i) Each pair of input sequences in the set are compatible, as in step 140.
(ii) There exists no superset of input sequences having the two characteristics that (a) each pair of input sequences in the superset is compatible and (b) the superset of input sequences contains the maximal compatible set of input sequences as a proper subset.

Figure 2:
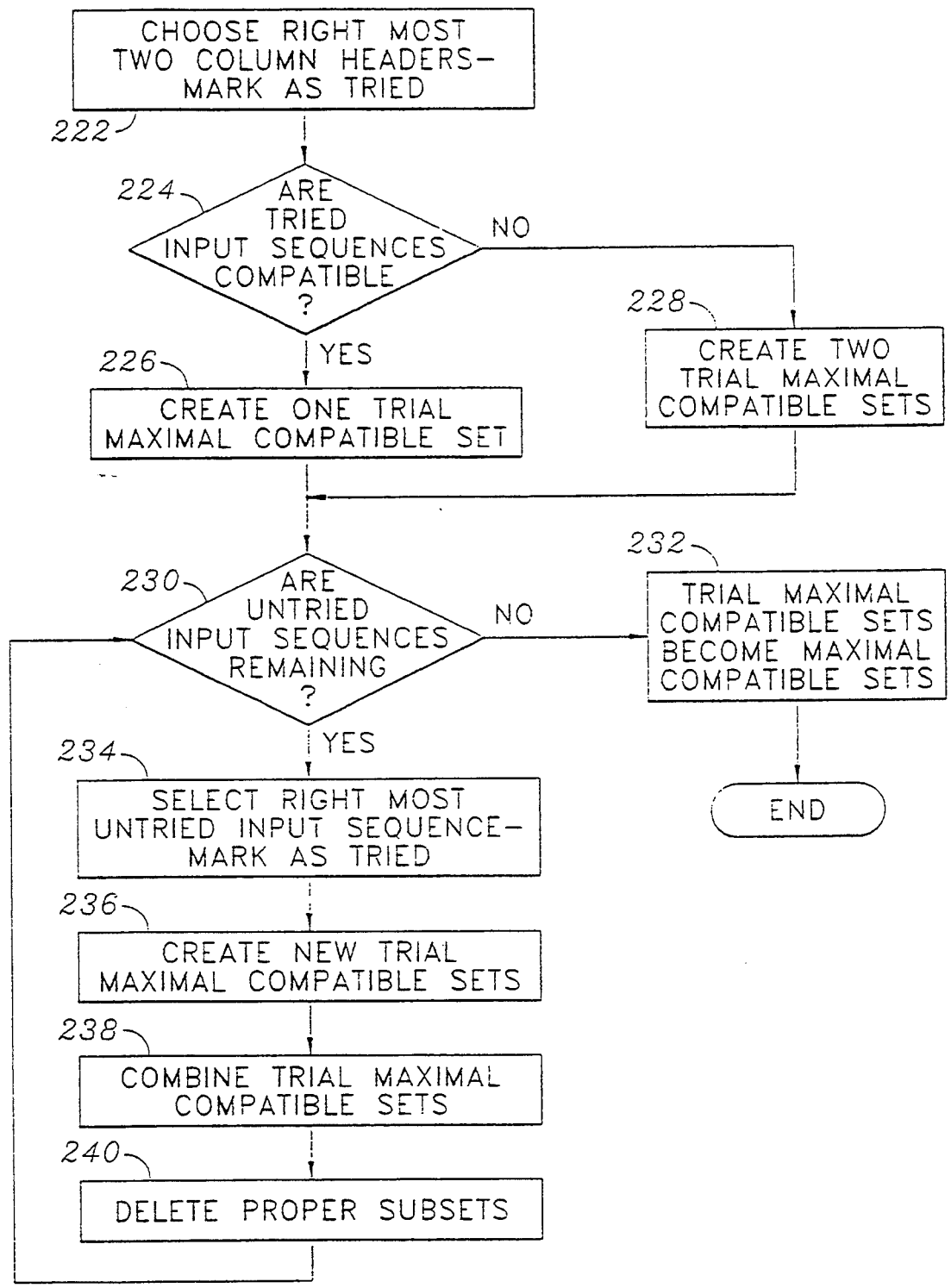
FIG. 2 is a flow diagram illustrating the derivation of maximal compatible sets.

The maximal compatible sets of sequences are derived in accordance with the flowchart of FIG. 2, with the associated explanation appended to this narrative.

At step 148, all maximal compatible sets are labeled prime compatible sets. Also, at step 148, all subsets of all maximal compatible sets derived at step 146 are determined. Each subset of a maximal compatible set is considered in turn and labelled, initially, a test compatible set. Since each maximal compatible set is trivially a subset of itself, each maximal compatible set is included in consideration as a test compatible set. An implication set is now created for each test compatible set and input character. This implication set created for each test compatible set and input character is to include all input sequences which are members of pair implication sets, for the given input character, associated with compatible pairs which comprise the test compatible set. If the implication set so derived is included as a subset of its associated test compatible set, then the implication set is eliminated and the implication set in this case becomes the null set. Note that k implication sets are derived for each test compatible set, k being the number of input characters comprising the input alphabet of the state-machine. A test compatible set is said to be eliminated by another test compatible set (either a maximal compatible set or another proper subset of a maximal compatible set) if the other compatible set has the following two characteristics:

(i) The test compatible set is contained in the other compatible set as a subset of the other compatible set.
(ii) For each input state, the implication set associated with the other compatible set and that input state is contained as a subset of at least one of the implication sets associated with the test compatible set.

A test compatible set which is not eliminated is labelled a prime compatible set. It is noted that all maximal compatible sets are prime compatible sets. All prime compatible sets are retained and used for the construction of the candidate minimal cover tree to obtain the optimal encoding (least silicon area) of the cellular array control memory.

Figure 3:
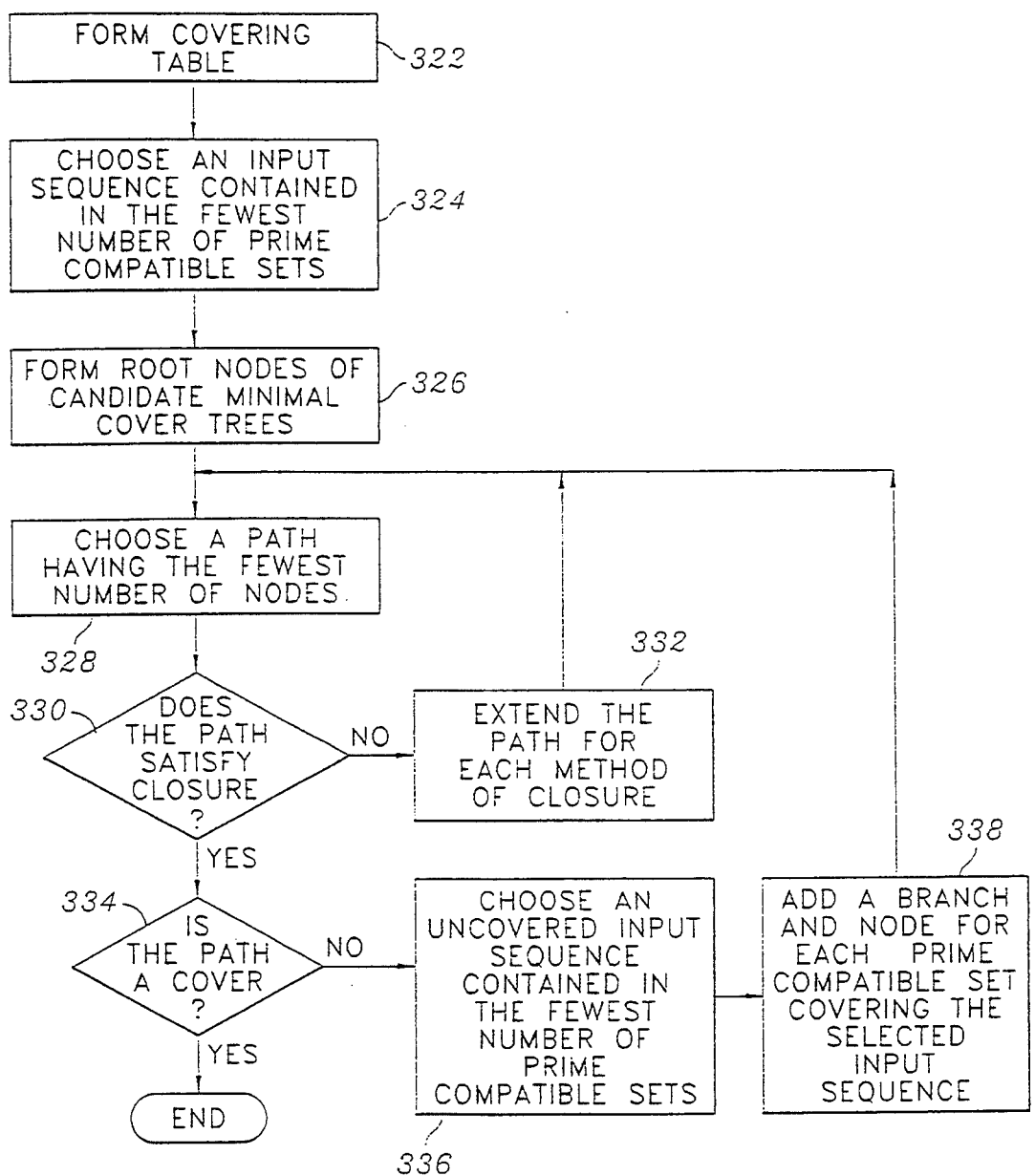
FIG. 3 is a flow diagram illustrating the derivation of candidate minimal cover trees, included in which is a minimal cover path.

At step 150, a set of candidate minimal cover trees is constructed from which a minimal cover path is determined, in accordance with FIG. 3, with associated explanation appended to this text.

At step 152, the number of memory cells in multiple locations along the main diagonal and the number of output columns of the cellular array which are to be used for the state-machine implementation are determined. This number of memory cells in multiple locations along the main diagonal of the cellular array which are to be used for the state-machine implementation is the number of nodes in the minimal cover path. The number of output columns designated for the implementation is the number of output functions of the state-machine being emulated, the memory cell of each output column feeding directly into an output pin buffer. Hence, the total number of columns in the cellular array to be used for a particular implementation is the number of nodes in the minimal cover path (each node corresponding to one of the memory cells along the main diagonal) plus the number of output functions of the state-machine under consideration (each output function corresponding to an output column of the cellular array).

At step 154, each memory cell of the cellular array used for the implementation, whether the memory cell occupies one of the multiple locations along the main diagonal or whether the memory cell occupies a location in one of the output columns, is to have associated with it a prime compatible set which is a member of the minimal cover path. A memory cell located in each one of the multiple locations along the main diagonal of the cellular array has associated with it a unique prime compatible set represented in the minimal cover path. A memory cell located in each one of the output columns has associated with it a prime compatible set, a member of the minimal cover path which contains the sequence $/\!\!\setminus$ further distinguished by the number of the state-machine output function which that output column of the cellular array generates.

At step 156, a two dimensional control memory array is constructed. The number of entries required in the control memory array is the number of memory cells used in the cellular array times the number of input characters in the input alphabet of the state-machine being emulated. In the case that the control memory array is implemented as a programmable logic array rather than as random access memory, the two-dimensional array of data represented by the control memory array is generated by the programmable logic array, as a function of the state-machine input lines, rather than occupying a two-dimensional location in physical memory. The control memory array—or the output of the control memory programmable logic array—is a two dimensional array indexed on its ordinate by each input character of the input alphabet of the state-machine being emulated and on its abscissa by a label corresponding to a unique memory cell of the cellular array, in accordance with Table 3.

TABLE 3

Control Memory Array

| | | | | | | | |
|---|---|---|---|---|---|---|---|
| input state 0 | | | | | | | |
| input state 1 | | | | | | | |
| ⋮ | ⋯ | | | ⋯ | | | |
| input state (k-1) | | | | | | | |
| memory cell number: | 0 | 1 | 2 | (l-1) | $Z_0$ | $Z_1$ | $Z_{(n-1)}$ |

In Table 3, the number of input characters in the input alphabet of the state-machine under consideration is assumed to be k, the number of memory cells along the main diagonal of the cellular array implementation (the number of nodes in the minimal cover path) is assumed to be l, and the number of ouput functions of the state table under consideration is assumed to be n.

In Table 3, memory cell number 0—the leftmost horizontal index—refers to the memory cell occupying the leftmost column of the cellular array, the top left main diagonal location; memory cell number 1 refers to the memory cell occupying the second to the top main diagonal location, etc.; finally, memory cell number (l-1) refers to the memory cell occupying the bottom right main diagonal location. This numerical labelling of the memory cells in multiple locations along the main diagonal has a physical significance, as the control lines of a selector occupying a column of the cellular array (whether a column maintaining a memory cell occupying a location in the main diagonal or an output column) are set to one of the values 0, 1, . . . , (l-1) to specify which memory cell in the main diagonal is to have its binary value selected to enter the memory cell of the column of that selector at the occurrence of the next clock pulse. The memory cells occupying multiple locations along the main diagonal are the cells which have their binary contents routed to all parts of the cellular array at the occurrence of each clock pulse. The memory cells occupying the output columns, which directly feed output pin buffers, receive their next binary values from the memory cells occupying multiple locations along the main diagonal.

The memory cells occupying the output column locations are labelled $Z_1, Z_2, \ldots, Z_{n-1}$, in accordance with the output functions which they support.

At step 158, the entries in the control memory array of Table 3 are filled in. Each entry in the control memory array exhibited in Table 3 is indexed on its abscissa by a column number, or a column labelling for the case of a column producing an output function, and on its ordinate by an input character of the input alphabet of the state-machine being emulated. The integer which is to occupy a particular entry in the array of Table 3 specifies which memory cell is to have its contents routed to the memory cell designated by its abscissa index, under the state-machine input character designated by its ordinate index. The memory cell number occupying that control memory entry is the memory cell associated with the prime compatible set of the minimal cover path which contains as a subset a particular implication set. The implication set to be covered is that implication set associated with the prime compatible set of the minimal cover path selected at step 154 to label the memory cell designated by the abscissa index of that control memory location, under the input character designated by the ordinate index of that control memory location.

At step 160, the cellular array control memory is configured as the two-dimensional control memory of Table 3. The input lines of the state-machine, each unique binary encoding of said input lines corresponding to a unique input character of the input alphabet of the state-machine, address the control memory. At each address location of control memory, a word of data is to exist, that word of data to consist of that particular row of integers of Table 3 specifically indexed on its ordinate axis by the state-machine input character corresponding to the binary encoded values at the state-machine input lines which address control memory. The integers residing in the addressed word of control memory are to exist in binary representation, each binary encoded integer of the addressed word to be placed on the control lines of a selector in a unique column of the cellular array.

For the case that the control memory of the cellular array is implemented as a programmable logic array, then at step 160, the programmable logic array is to be programmed to produce the multi-output combinational logic function specified by the control memory of Table 3. Each unique binary interpretation of the state-machine input lines, each such interpretation corresponding to a unique input character of the state-machine, therefore specifies the appropriate row of the control memory array which is to be produced by the programmable logic array as a multi-output binary function of said state-machine input lines. This multi-output function is to be produced as a minimal gate-count two-level AND-OR realization, as is well known in the art of programmable logic implementation.

At step 162, the initial cellular array memory values are determined. Typically, an initial state-machine internal state is designated as a starting state of the state-machine to be emulated. This internal starting state is the key to specifying the initial cellular array memory values. This internal starting state indexes a row 118 of each output mapping table 116. Each memory cell of the cellular array which is used to emulate the state-machine has associated with it a prime compatible set (output of step 154). This prime compatible set contains a set of compatible input sequences, each such input sequence further distinguished by an output function of the state-machine. Each such distinguished input sequence corresponds to a particular column 120 of one of the output mapping tables 116. Since all such distinguished input sequences contained in the said prime compatible set are compatible, then, for a designated row of the output mapping tables, specifically that row designated by the starting state of the state-machine, all row entries 122 for those columns 120 associated with input sequences of the said prime compatible set are specified from the set {—,0}("unspecified" and 0), or from the set {—,1}("unspecified" and 1), or simply from the set {—}("unspecified"). That is, a row entry 122 for an output mapping column 120 corresponding to one input sequence contained in the said prime compatible set cannot be specified as a 0 and the row entry 122 in the identical row for an output mapping column 120 corresponding to another input sequence contained in the said prime compatible set be specified as a 1 (otherwise, the prime compatible set would not consist of compatible input sequences). For the case that all row entries 122, for that row 118 corresponding to the starting state of the state-machine, in those columns 120 of the output mapping tables associated with the input sequences contained in {—,0}, the said prime compatible set, are specified from the set, then the said memory cell is set to the initial binary value of 0. For the case that said row entries 122 of the output mapping tables 116 are specified from the set, {—, 1}, then the said memory cell is set to the initial binary value of 1. Finally, for the case that the said row entries 122 of the output mapping tables are contained in the set {—}, then the initial value of said memory cell can be left unspecified.

CONSTRUCT MAXIMAL COMPATIBLE SETS

FIG. 2 exhibits the technique of constructing the maximal compatible sets.

At step 222, the two rightmost column headers of the pair chart are selected for construction of trial maximal compatible sets. These two input sequences are marked as tried.

At step 224, the appropriate entry (bottom row, second to the rightmost column) in the pair chart is inspected to determine whether or not the two rightmost column headers are compatible.

If the answer at step 224 is yes, then, at step 226, one trial maximal compatible set is created consisting of both selected column headers.

If, on the other hand, the answer at step 224 is no, then, at step 228, two trial maximal compatible sets are created, each trial maximal compatible set consisting of one of the selected column headers.

At step 230, the question is posed: are any untried column headers remaining in the pair chart?

If the answer at step 230 is no, then, at step 232, the trial maximal compatible sets become the maximal compatible sets and the procedure continues at step 148.

If, on the other hand, the answer at step 230 is yes, then, at step 234, the rightmost untried column header of the pair chart is selected and marked as tried.

At step 236, a set of new trial maximal compatible sets is created, to be combined with the set of existing trial maximal compatible sets. For each existing trial maximal compatible set, a corresponding new trial maximal compatible set is created by combining the most recently selected column header, that column header selected at step 234, with those input sequences of the existing trial maximal compatible set which are compatible with the most recently selected column header. The determination of compatibility is easily made from the pair chart by observing the entries in those rows associated with the input sequences contained in the existing trial maximal compatible set, in the column of the most recently selected column header. At each such entry point 412 of the completed pair chart 404, an "X" specifies incompatibility whereas the non-existence of an "X" specified compatibility.

At step 238, the new trial maximal compatible sets created at step 236 are combined with the existing trial maximal compatible sets to form the new trial maximal compatible sets.

At step 240, any trial maximal compatible set which is a proper subset of another trial maximal compatible set is deleted as a trial maximal compatible set.

The procedure continues at step 230.

CONSTRUCT MINIMAL COVER PATH

FIG. 3 exhibits the technique of constructing the minimal cover path.

At step 322, the covering table consisting of two columns is constructed. The leftmost column of the covering table contains all of the input sequences which are column headers of the pair chart, each such input sequence occupying a unique row of the leftmost column of the covering table. The rightmost column contains, in each row, the number of prime compatible sets having the input sequence of that row (residing in the leftmost column) as an element.

At step 324, the input sequence which is contained in the fewest number of prime compatible sets is chosen from the covering table.

A set of candidate "minimal covering trees" are to be formed. Each candidate tree consists of a leftmost, or root, node. This root node is connected to the right to a multiplicity of nodes, each connection between nodes made by a single line which is called a branch. Each new node encountered on the right side of a branch is further connected to a multiplicity of nodes on its right hand side, each connection again made by a branch, and so on. A path through the tree originates at the tree's root, or leftmost node, then proceeds to the right, one branch and node at a time, until no further branches exist which extend the path beyond the rightmost node encountered. A path through a tree is said to have a length, the length being the number of nodes encountered in the path.

Each node comprising the set of candidate minimal cover trees which are to be constructed represents a prime compatible set. Initially, each prime compatible set containing the input sequence selected at step 324 represents the root node of a unique candidate tree. Hence, the number of trees to be constructed is limited to the number of prime compatible sets which contain the input sequence selected at step 324, each such prime compatible set chosen as the root node of a candidate minimal cover tree. In most applications, each root node will be extended to the right via the addition of branches and nodes, in accordance with the procedure to be detailed.

Therefore, at step 326, each prime compatible set containing the initially selected input sequence is entered as a root node of a candidate tree.

At step 328, the path containing the fewest number of nodes is selected from the set of candidate trees. This path is labelled the test path. Initially, of course, each path contains only one node, a root node of a candidate tree to be constructed. If there is more than one minimal path (a multiplicity of paths having the same number—a minimal number—of nodes), then any one of the minimal paths can be chosen as the test path.

As indicated, each node of the test path represents a prime compatible set. Associated with each prime compatible set is a set of implication sets, one implication set for each input state of the input alphabet of the state-machine under consideration. At step 330, the question is posed: does the test path satisfy closure, i.e., is each implication set associated with each node (prime compatible set) of the test path included as a subset of at least one of the prime compatible sets represented by the various nodes of the test path?

If the answer at step 330 is yes, then the procedure goes to step 334, else the procedure goes to step 332.

At step 332, there exist one or more implication sets associated with prime compatible sets, represented by nodes of the test path, which are not contained as subsets of any of the prime compatible sets associated with the remaining nodes of the test path. Therefore, at step 332, all possible minimal combinations of prime compatible sets (prime compatible sets which are clearly not represented in the test path) which contain the excluded implication sets are compiled and, for each such minimal combination of prime compatible sets, the test path is extended to the right by adding, serially, a branch and node representing each prime compatible set of a derived combination. The procedure then returns to step 328.

At step 334, the question is posed: does the test path exhibit a cover, i.e., is each input sequence which constitutes the leftmost column of the covering table contained in at least one prime compatible set associated with the test path?

If the answer at step 334 is no, then, at step 336, all input sequences which are not contained as members of prime compatible sets associated with the test path are compared in the covering table. That input sequence which is contained in the least number of remaining prime compatible sets is selected.

At step 338, the test path is extended to the right by adding, in parallel to the rightmost node of the test path, a branch and node representing each prime compatible set which contains that input sequence selected at step 336 as a member. The procedure then returns to step 328.

If the answer at step 334 is yes, then the test path constitutes a minimal cover of prime compatible sets and this minimal cover path is then used to complete the control memory encoding procedure of the cellular array for the application of interest. Control then proceeds at step 152.

EXAMPLE

The following example will serve to clarify the procedure, as detailed, of deriving an optimum boundary value encoding for an incompletely specified, multi-output state table.

Consider the state table exhibited as Table 4.

TABLE 4

| Example For Boundary Value Encoding | | | | |
|---|---|---|---|---|
| | 0 | 1 | $Z_1$ | $Z_2$ |
| a | b | a | 0 | 1 |
| b | a | - | 1 | - |

Note, in Table 4, that the next state entry for internal state b, input state 1 is a "—" or unspecified entry and it can be either a or b in the above case. Similarly, the output state for the second (rightmost) output function under internal state b is a "—" meaning unspecified and it can be either 0 or 1.

Proceeding, as in FIG. 1, for the construction of the boundary values for the cellular array and beginning at step 120, the Compilation Table 106 is created with one row 108 for each state-machine state and one column 110 for each active input sequence 116. Initially, the null sequence ($/\backslash$) is the only active input sequence and this entry in table 106 is exhibited in Exemplar 1. As noted, the column header of this initial column is the $/\backslash$ sequence.

Exemplar 1

Initial Column of Compilation Table

| $/\backslash$ |
|---|
| a |
| b |

In essence, Exemplar 1 consists of a single column headed by the $/\backslash$ sequence and having entries which are the present state entries of Table 4, the state table under consideration.

At step 122, two output mapping tables 116 are created, one output mapping table for each output function of the state-machine under consideration, Table 4. An initial column 120 for each output mapping table is designated, the initial column for the first output mapping table being the $/\backslash$ column of the Compilation Table 106, each entry in that column replaced with its output value assignment specified by the first output function of the state-machine, Table 4. The column header of this first output mapping column of the first output mapping table is the $/\backslash$ sequence distinguished by the first state-machine output function. Equivalently, the initial column of the second output mapping table is the $/\backslash$ column of the Compilation Table 106, each entry in that column replaced with its output value assignment specified by the second output function of the state-machine, Table 4. And, the column header of this first output mapping column of the second output mapping table is the $/\backslash$ sequence distinguished by the second state-machine output function. These two initial output mapping columns are exhibited in Exemplar 2.

Exemplar 2

Initial Columns of Output Mapping Tables

| $/\backslash_1$ |
|---|
| 0 |
| 1 |
| $/\backslash_2$ |
| 1 |
| — |

There remains at step 122 to designate those column headers of Exemplar 2 which are associated with unique columns as active and to initialize the antecedent table 146 by designating each such active column header of Exemplar 2 as a column header 156 of the antecedent table. Since both columns of Exemplar 2 are unique, the column header of each column of Exemplar 2 is included as a column header of the antecedent table. These initial two column headers of the antecedent table are exhibited in Exemplar 3.

Exemplar 3

Initial Column Headers of Antecedent Table

| $/\backslash_1$ | $/\backslash_2$ |
|---|---|
| 0 | |
| 1 | |

At step 124, the $/\backslash$ (null) input sequence 116 is the only untried active input sequence in the Compilation Table, Exemplar 1; it is therefore selected and called the old active input sequence. Also, every character 128 from the state-machine input alphabet is marked untried.

At step 126, the character 0 is selected from the input alphabet {0,1} and marked as tried. The choice is arbitrary—the character 1 could have been selected.

At step 128, the new input sequence 0 (0 appended to the $/\backslash$ sequence) is created. This new input sequence is marked untried.

At step 130, a new column is created for possible entry into the Compilation Table, 106. This new column is headed by the new input sequence, 0. In this case, the new column is identical to the column in Table 4 under the 0 input state entry, exhibited in Exemplar 4. Finally, all output mapping column headers of Exemplar 2 are marked untried and control proceeds at step 132.

Exemplar 4

New Column Created at Step 130

|   |
| --- |
| 0 |
| b |
| a |

At step 132, an untried active output mapping column header in Exemplar 2 derived from the input sequence selected at step 124 ($/\backslash$) is selected and marked as tried. We select the column header of the topmost column, $/\backslash$, and mark it as tried. Also, we note the state-machine output function which distinguishes the selected output mapping column header, which in this case is the first state-machine output function.

At step 134, a new output mapping column is created. This new output mapping column is determined by applying the state-machine output function noted at step 132 (the first state-machine output function) to the column of internal states created at step 130 (Exemplar 4) as if each entry were a present state entry of the state-machine. The top entry of Exemplar 4 is the internal state "b" and its output mapping under the first state-machine output function is "1", whereas the bottom entry of Exemplar 4 is the internal state "a" and its output mapping under the first state-machine output function is "0". This new column is exhibited in Exemplar 5. Note that the column header of Exemplar 5 is the input sequence determined at step 128 distinguished by the state-machine output function noted at step 132, $0_1$, that input sequence and state-machine output function used to create the new output mapping column.

Exemplar 5

New Output Mapping Column Created at Step 134

| |
| --- |
| $0_1$ |
| 1 |
| 0 |

At step 136, The output mapping column exhibited in Exemplar 5 is compared with all previously generated output mapping columns of all output mapping tables, that is with all output mapping columns exhibited in Exemplar 2, for equal effect. Since the output mapping column of Exemplar 5 is not identical to any previously generated active output mapping column, the column header of this output mapping column ($0_1$) is declared active and its column is entered in the output mapping table 116 corresponding to the first state-machine output function, that state-machine output function which was used to create the output mapping column of Exemplar 5. The two output mapping tables with the new column entry is exhibited in Exemplar 6.

Exemplar 6

Output Mapping Table Created at Step 136

| $/\backslash_1$ | $0_1$ |
| --- | --- |
| 0 | 1 |
| 1 | 0 |

-continued

| $/\backslash_2$ |
| --- |
| 1 |
| — |

Since the header of the new output mapping column created at step 134 (Exemplar 5) is declared active, then the input sequence determined at step 128 is also declared active and its associated column of internal state entries determined at step 130 (Exemplar 4) is entered into the Compilation Table 106, the new Compilation Table exhibited as Exemplar 7.

Exemplar 7

New Compilation Table Created at Step 136

| $/\backslash$ | $0$ |
| --- | --- |
| a | b |
| b | a |

Since the header of the new output mapping column created at step 134 (Exemplar 5) is declared active, then this column header, $0_1$, is entered as the antecedent sequence 152 of the column header of the output mapping column chosen at step 132, $/\backslash$, under input character 0. There are two rows 148 of the antecedent table, each row corresponding to a unique input character of the input alphabet of the state-machine. The top row of the antecedent table corresponds to the input character 0, whereas the bottom row of the antecedent table corresponds to the input character 1. Hence, the column header of the column created at step 134, $0_1$, is entered in the top row, column headed by $/\backslash_1$ of the antecedent table. Finally, since the column header of the output mapping column of Exemplar 5 is declared active, a new column of the antecedent table is created by entering this active column header as a new column header of the antecedent table. The antecedent table, with new entries, is exhibited in Exemplar 8. Control now transfers to step 132.

Exemplar 8

New Antecedent Table Created at Step 136

| | $/\backslash_1$ | $/\backslash_2$ | $0_1$ |
| --- | --- | --- | --- |
| 0 | $0_1$ | | |
| 1 | | | |

At step 132, the header of the second output mapping column of Exemplar 6, the remaining output mapping column derived from the $/\backslash$ input sequence, is selected and marked as tried. Also, the state-machine output function used to create the selected output mapping column, the second output function, is noted.

At step 134, a new output mapping column is created, as before. This new output mapping column is determined by applying the state-machine output function noted at step 132 (the second state-machine output function) to the column of internal states created at step 130 (Exemplar 4) as if each entry were a present state entry of the state-machine. As before, the top entry of Exemplar 4 is "b" and its mapping under the second state-machine output function is "—" or "unspecified". The bottom entry of Exemplar 4 is "a" and its mapping under the second state-machine output function is "1". This new column is exhibited in Exemplar 9. Note that the column header of Exemplar 9 is the input sequence determined at step 128 distinguished by the state-machine output function noted at step 132, $0_2$, that input sequence and state-machine output function used to create the new output mapping column.

Exemplar 9

Output Mapping Column Determined at Step 134

| $0_2$ |
|---|
| — |
| 1 |

At step 136, the output mapping column of Exemplar 9 is compared with all output mapping columns of Exemplar 6, the output mapping columns of all previously generated output mapping tables, for equal effect. Since the output mapping column of Exemplar 9 is unique—it is not identical to any output mapping column of Exemplar 6, the column header of Exemplar 9 is declared active and this column header is placed as a column header to initiate a new column of the antecedent table. Furthermore, the column header of Exemplar 9 is designated the antecedent sequence of the column header of the output mapping column selected at step 132, the only column header of the second output mapping table of Exemplar 6, $/\backslash_2$, under the input character 0. Hence, the column header of Exemplar 9, $0_2$, is entered as an element in the antecedent table in that column having as a column header $/\backslash_2$, in the row associated with the input character selected at step 126, the input character 0. The new antecedent table is exhibited in Exemplar 10.

Exemplar 10

New Antecedent Table Created at Step 136

|   | $/\backslash_1$ | $/\backslash_2$ | $0_1$ | $0_2$ |
|---|---|---|---|---|
| 0 |   | $0_1$ | $0_2$ |   |
| 1 |   |   |   |   |

Since the column header of the output mapping column of Exemplar 9 is declared active, then the output mapping column of Exemplar 9 is entered as a new column of the second output mapping table, that output mapping table of Exemplar 6 associated with the second state-machine output function. The output mapping tables with the new column added is exhibited in Exemplar 11.

Exemplar 11

Output Mapping Tables

| $/\backslash_1$ | $0_1$ |
|---|---|
| 0 | 1 |
| 1 | 0 |
| $/\backslash_2$ | $0_2$ |
| 1 | — |
| — | 1 |

Since the column header of Exemplar 9 is declared active, then the new input sequence determined at step 128 is declared active and its associated column, that column exhibited in Exemplar 4, is entered into the Compilation Table. However, the column of Exemplar 4 has already been entered into the Compilation Table, as exhibited in Exemplar 7 and, therefore, it need not be re-entered. Control returns to step 132.

At step 132, no further untried active output mapping column headers derived from the input sequence selected at step 124 ($/\backslash$ ) exist (the column headers of the first output mapping columns of both output mapping tables of Exemplar 11 having been tried), control returns to step 126.

At step 126, the character 1 is selected from the state-machine input alphabet and marked as tried.

At step 128, the new input sequence 1 (the input character 1 appended to the old active input sequence $/\backslash$ ) is created.

At step 130, a new column is created for possible entry into the Compilation Table. This new column is headed by the new active input sequence, 1. In this case, the new column is identical to the column in Table 4 under the 1 input state entry, exhibited in Exemplar 12. Finally, at step 130, all active column headers of the output mapping tables exhibited in Exemplar 11 derived from the $/\backslash$ input sequence ($/\backslash_1$, $/\backslash_2$) are marked untried and control proceeds at stop 132.

Exemplar 12

Column Created at Step 130

| 1 |
|---|
| a |
| — |

At step 132, an untried active output mapping column header of Exemplar 11 associated with the $/\backslash$ input sequence, that input sequence selected at step 124, is selected and marked as tried. We select the column header of the first column, $/\backslash$ , of the first output mapping table, and mark it as tried. Also, we note the state-machine output function which distinguishes the selected output mapping column header, in this case the first state-machine output function.

At step 134, a new output mapping column is created. This new output mapping column is determined by applying the state-machine output function noted at step 132 (the first state-machine output function), to the column of internal states created at step 130 (Exemplar 12) as if each entry were a present state entry of the state-machine. The top entry of Exemplar 12 is "a" and its output mapping under the first state-machine output function is "0". The bottom entry of Exemplar 12 is "—", or "unspecified" resulting in a "—" or "unspecified" output value. This new column is exhibited in Exemplar 13. Note that the column header of Exemplar 13 is the input sequence determined at step 128 distinguished by the state-machine output function noted at step 132, 1, that input sequence and state-machine output function used to create the output mapping column.

Exemplar 13

Output Mapping Column Created at Step 134

| $1_1$ |
|---|
| 0 |
| — |

At step 136, the output mapping column exhibited in Exemplar 13 is compared with all previously generated output mapping columns of all output mapping tables, that is, with all output mapping columns exhibited in Exemplar 11, for equal effect. Since the output mapping column of Exemplar 13 is not identical to any previously generated output mapping column, the column header of this output mapping column ($1_1$) is declared active and it is entered as a column header for a new column of the antecedent table. Furthermore, the column header of Exemplar 13 is designated the antecedent sequence of the column header of the output mapping column selected at step 132 ($/\!\!\setminus$ ), under the input character 1, that input character selected at step 126. Hence, the column header of Exemplar 13 is entered as an element of the antecedent table in that column having as a column header $/\!\!\setminus$ , in the row associated with the input character 1, the bottom row. The new antecedent table is exhibited in Exemplar 14.

Exemplar 14

Antecedent Table Created at Step 136

| | $/\!\!\setminus_1$ $/\!\setminus_2$ | $0_1$ | $0_2$ | $1_1$ |
|---|---|---|---|---|
| 0 | $0_1$ | $0_2$ | | |
| 1 | $1_2$ | | | |

Since the column header of the output mapping column of Exemplar 13 is declared active, then the output mapping column of Exemplar 13 is entered as a new column of the first output mapping table, that output mapping table of Examplar 11 associated with the first state-machine output function, that state-machine output function noted at step 132. The output mapping tables with the new column added is exhibited in Exemplar 15.

Exemplar 15

Output Mapping Table Created at Step 136

| | $/\!\!\setminus_1$ | $0_1$ | $1_1$ |
|---|---|---|---|
| 0 | | 1 | 0 |
| 1 | | 0 | — |
| | $/\!\setminus_2$ | $0_2$ | |
| 1 | | — | |
| — | | 1 | |

Since the column header of Examplar 13 is declared active, then the new input sequence determined at step 128 is declared active and its associated column, that column exhibited in Exemplar 12, is entered into the Compilation Table. The new Compilation Table is exhibited in Exemplar 16.

Exemplar 16

Compilation Table Created at Step 136

| $/\!\setminus$ | 0 | 1 |
|---|---|---|
| | a | b | a |
| | b | a | — |

Control returns to step 132.

At step 132, the column header of the first output mapping column of the second output mapping table of Exemplar 15 ($/\!\setminus_2$), the remaining untried output mapping column header derived from the input sequence determined at step 124 ($/\!\setminus$ ), is selected and marked as tried. Also, the state-machine output function used to create the selected output mapping column, the second state-machine output function, is noted.

At step 134, a new output mapping column is created. This new output mapping column is determined by applying the state-machine output function noted at step 132 (the second state-machine output function) to the column of internal states created at step 130 (Exemplar 12) as if each entry were a present state entry of the state-machine, resulting in the output mapping column exhibited in Exemplar 17. Note that the column header of Exemplar 17 is the input sequence determined at step 128 distinguished by the state-machine output function noted at step 132, $1_2$, that input sequence and state-machine output function used to create the new output mapping column.

Exemplar 17

Output Mapping Column Created at Step 134

| | $1_2$ |
|---|---|
| | 1 |
| | — |

At step 136, the output mapping column of Exemplar 17 is compared with all output mapping columns of Exemplar 15, the output mapping columns of all previously generated output mapping tables, for equal effect. It is noted that the output mapping column of Exemplar 17 is identical to the initial output mapping column of the second output mapping table of Exemplar 15, that output mapping column having the column header $/\!\setminus_2$. Hence, the column header $/\!\setminus_2$ is designated the antecedent sequence of the column header of the output mapping column selected at step 132, $/\!\setminus_2$, under input state 1, the input state selected at step 126 (that is, $/\!\setminus_2$ is its own antecedent sequence under input state 1) and this input sequence, $/\!\setminus_2$, is entered in the antecedent table in that column having as a column header $/\!\setminus_2$, in the row associated with the input character 1, the bottom row. The new antecedent table is exhibited in Exemplar 18. Control returns to step 132.

Exemplar 18

Antecedent Table Created at Step 136

| | $/\!\setminus_1$ $/\!\setminus_2$ | $0_1$ | $0_2$ | $1_1$ |
|---|---|---|---|---|
| 0 | $0_1$ | $0_2$ | | |
| 1 | $1_1$ $/\!\setminus_2$ | | | |

At step 132, since no remaining untried active column headers derived from the input sequence $/\!\setminus$ , that input sequence selected at step 124, exist in the output mapping tables, Exemplar 15, control returns to step 126.

At step 126, since no untried input character from the state-machine input alphabet remains, control returns to step 124.

At step 124, an active sequence is selected from the Compilation Table, Exemplar 16, and marked as tried. The two untried active input sequences of Exemplar 16 are 0 and 1. We choose the first such sequence, 0. Also, every character of the state-machine input alphabet is marked untried.

At step 126, the character 0 is selected from the state-machine input alphabet and marked as tried.

At step 128, the new input sequence 00 (the 0 input character selected at step 126 appended to the old active input sequence 0 selected at step 124) is created. This new input sequence is marked untried.

At step 130, a new column is created for possible entry into the Compilation Table. This new column is headed by the new input sequence, 00, and it is determined by applying the new input sequence 00, character at a time, in reverse order, to the present state entries of the state-table under consideration (Table 4). Since the column entries for the input sequence 0 already exist (the column headed by 0 in Exemplar 16), the desired new column is obtained by applying the input state 0 to the existing 0 column as if the entries in the existing 0 column were present state entries. The top entry in the existing 0 column is "b"; applying the input state 0 to the present state "b" (entry under input state 0 for present state "b" in Table 4), yields internal state "a" as the top entry of the new input sequence 00 column. The second entry in the existing 0 column is "a"; applying the input state 0 to present state "a" yields internal state "b" as the second entry of the 00 column. Exemplar 19 exhibits the 00 column.

Exemplar 19

Column Created at Step 130

| 00 |
|---|
| a |
| b |

Finally, at step 130, all active column headers of output mapping columns of Exemplar 15 ($0_1$ and $0_2$) derived from the input sequence selected at step 124 (0) are marked untried.

At step 132, an untried active output mapping column header of Exemplar 15 derived from the input sequence selected at step 124 (the 0 sequence) is selected and marked as tried. We select the column header of the first output mapping table, $0_1$. Also, we note the state-machine output function which distinguishes the selected output mapping column header, which is the first state-machine output function.

At step 134, a new output mapping column is created, this new output mapping column determined by applying the state-machine output function noted at step 132 (the first state-machine output function) to the column of internal states created at step 130 (Exemplar 19), as if each entry were a present state entry of the state-machine, resulting in Exemplar 20.

Exemplar 20

Output Mapping Column Control at Step 134

| $00_1$ |
|---|
| 0 |
| 1 |

We note that the column header of the output mapping column of Exemplar 20 is the input sequence determined at step 128 distinguished by the state-machine output function noted at step 132, that input sequence and state-machine output function used to create the new output mapping column.

At step 136, the output mapping column of Exemplar 20 is compared with all output mapping columns of Exemplar 15 for equal effect. It is noted that the output mapping column of Exemplar 20 is identical to the output mapping column of Exemplar 15 having the $/\!\!\setminus_1$ input sequence as its column header. Hence, the column header $/\!\!\setminus_1$ is designated the antecedent sequence of the column header selected at step 132 ($0_1$), under the input character 0, that input character selected at step 126. Therefore, the $/\!\!\setminus_1$ input sequence is entered in the antecedent table in that column headed by $0_1$ in the row associated with the input character 0, the top row. The new antecedent table is exhibited in Exemplar 21.

Exemplar 21

Antecedent Table Created at Step 136

| | $/\!\!\setminus_1$ | $/\!\!/_2$ | $0_1$ | $0_2$ | $1_1$ |
|---|---|---|---|---|---|
| 0 | | | $0_1$ | $0_2$ | $/\!\!\setminus_1$ |
| 1 | | | $1_1$ | $/\!\!\setminus_2$ | |

Control returns to step 132.

At step 132, the remaining untried active column header of Exemplar 15 derived from the input sequence selected at step 124 (the 0 sequence) is selected and marked as tried, $0_2$. Also, the state-machine output function used to create the selected output mapping column, the second state-machine output function, is noted.

At step 134, a new output mapping column is created, as before, by applying the state-machine output function noted at step 132, the second state-machine output function, to the column of internal state entries in Exemplar 19, resulting in Exemplar 22.

Exemplar 22

Output Mapping Column Created at Step 134

| $00_2$ |
|---|
| 1 |
| — |

At step 136, the output mapping column of Exemplar 22 is compared with all output mapping columns of Exemplar 15 for equal effect. It is noted that the output mapping column of Exemplar 22 is identical to the output mapping column of Exemplar 15 having the column header $/\!\!\setminus_2$. Hence, $/\!\!\setminus_2$ is designated the antecedent sequence of the column header selected at step 132 ($0_2$) under the input character selected at step 126 (0) and $/_2$ is entered in the appropriate location of the antecedent table. The new antecedent table is exhibited in Exemplar 23. Control returns to step 132.

Exemplar 23

Antecedent Table Created at Step 136

| | $/\!\!\setminus_1$ | $/\!\!\setminus_2$ | $0_1$ | $0_2$ | $1_1$ |
|---|---|---|---|---|---|
| 0 | | | $0_1$ | $0_2$ | $/\!\!\setminus_1$ | $/\!\!/_2$ |
| 1 | | | $1_1$ | $/\!\!\setminus_2$ | |

At step 132, since all active output mapping headers derived from the input sequence selected at step 124 (the 0 input sequence), are marked as tried, control returns to step 126.

At step 126, the remaining untried input character, "1" is selected from the state-machine input alphabet and marked as tried.

At step 128, the new input sequence $0_1$ is created (the input character "1" selected at step 126 appended to the old active input sequence "0" selected at step 124, for possible entry into the Compilation Table 106.

At step 130, a new column of internal state entries is created, this new column having as a column header the input sequence determined at step 128. This new column is determined by applying the new input sequence 01, character at a time, in reverse order, to the present state entries of the state-machine under consideration. Since the column entries for the input sequence 1 already exist (the column headed by 1 in Exemplar 16), the desired new column is obtained by applying the input character 0 to the existing 1 column as if the entries in the existing 1 column were present state entries. The top entry in the existing 1 column is "a", applying the input state 0 to the present state "a" (entry under input state 0 for the present state "a" in Table 4) yields internal state "b" as the top entry of the new column. The second entry in the existing 1 column is "—". Hence, the next state entry of the present state "—" entry is also specified as a "—". This new column is exhibited in Exemplar 24.

Exemplar 24

Column Created at Step 130

| 01 |
|---|
| b |
| — |

Finally, at step 130, the two active column headers of the output mapping tables of Exemplar 15 ($0_1$ and $0_2$) which were derived from the input sequence chosen at step 124 (0) are marked untried.

At step 132, one of the untried active column headers ($0_1$ or $0_2$) of Exemplar 15 derived from the input sequence selected at step 124 (the 0 sequence) is selected and marked as tried. We choose the column header $0_1$. Also, we note the state-machine output function which distinguishes this sequence—the first state-machine output function.

At step 134, a new output mapping column is created by applying the state-machine output function noted at step 132 (the first state-machine output function) to the column of internal states created at step 130 (that column exhibited in Exemplar 24, yielding Exemplar 25.

Exemplar 25

Output Mapping Column Created at Step 134

| $01_1$ |
|---|
| 1 |
| — |

Note that the column header of the output mapping column of Exemplar 25 is the input sequence created at step 128 distinguished by the state-machine output function selected at step 132, that input sequence and state-machine output function used to create the output mapping column of Exemplar 25.

At step 136, the output mapping column of Exemplar 25 is compared with all output mapping columns of all previously generated output mapping tables, that is, with all output mapping columns of Exemplar 15, for equal effect. Since the column of Exemplar 25 is identical to the column headed by $/\!\backslash_2$ (the initial column of the second output mapping table of Exemplar 15), then the column header $/\!\backslash_2$ is designated the antecedent sequence of the column header selected at step 132 ($0_1$) and $/\!\backslash_2$ is entered in the antecedent table in that column having as a column header $0_1$ in the row associated with the input character selected at step 126 (input character 1), the bottom row. The new antecedent table is exhibited in Exemplar 26. Control returns to step 132.

Exemplar 26

Antecedent Table Created at Step 136

| | $/\!\backslash_1$ | $/\!\backslash_2$ | $0_1$ | $0_2$ | $1_1$ |
|---|---|---|---|---|---|
| 0 | $0_1$ | $0_2$ | $/\!\backslash_1$ | $/\!\backslash_2$ | |
| 1 | $1_1$ | $/\!\backslash_2$ | $/\!\backslash_2$ | | |

At step 132, the remaining untried active column header ($0_2$) derived from the input sequence selected at step 124 (the 0 sequence) is selected and marked as tried. Also, we note the state-machine output function which distinguishes this sequence, the second state-machine output function.

At step 134, a new output mapping column is created by applying the state-machine output function noted at step 132 (second state-machine output function) to the column of internal states created at step 130 (that column exhibited in Exemplar 24) yielding Exemplar 27. Note that the column header of Exemplar 27 is the input sequence created at step 128 distinguished by the state-machine output function selected at step 132, the input sequence and state-machine output function used to create the output mapping column of Exemplar 27.

Exemplar 27

Output Mapping Column Created at Step 134

| $01_2$ |
|---|
| — |
| — |

At step 136, the output mapping column exhibited in Exemplar 27 is compared with all previously generated output mapping columns of all output mapping tables, that is, with all output mapping columns of Exemplar 15 for equal effect. Since the output mapping column of Exemplar 27 is not identical to any previously generated output mapping column of Exemplar 15, the column header of the output mapping column ($01_2$) is declared active and it is entered as a column header for a new column of the antecedent table. Furthermore, the column header of Exemplar 27 ($01_2$) is designated the antecedent sequence of the column header of the output mapping column selected at step 132 ($0_2$) under the input character 1, that input character selected at step 126. Hence, the input sequence $01_2$ is entered as an element of the antecedent table in that column having as a column header $0_2$, in the row associated with the input character 1, the bottom row. The new antecedent table is exhibited in Exemplar 28.

Exemplar 28

Antecedent Table Created at Step 136

| | $/\!\backslash_1$ | $/\!\backslash_2$ | $0_1$ | $0_2$ | $1_1$ | $01_2$ |
|---|---|---|---|---|---|---|
| 0 | $0_1$ | $0_2$ | $/\!\backslash_1$ | $/\!\backslash_2$ | | |
| 1 | $1_1$ | $/\!\backslash_2$ | $/\!\backslash_2$ | $01_2$ | | |

Since the column header of the output mapping column in Exemplar 27 is declared active, then the output mapping column of Exemplar 27 is entered as a new column of the second output mapping table, that output mapping table associated with the output mapping function noted at step 132. The new output mapping tables are exhibited in Exemplar 29.

Exemplar 29

Output Mapping Tables Created at Step 136

| $\wedge_1$ | $0_1$ | $1_1$ |
|---|---|---|
| 0 | 1 | 0 |
| 1 | 0 | — |
| $\wedge_2$ | $0_2$ | $01_2$ |
| 1 | — | — |
| — | 1 | — |

Since the column header of the output mapping column of Exemplar 27 is declared active, then the new input sequence determined at step 128 (01) is declared active and its associated column, that column exhibited in Exemplar 24, is entered as a new column of the Compilation Table. The new Compilation Table is exhibited in Exemplar 30. Control proceeds at step 132.

Exemplar 30

Compilation Table Created at Step 136

| $\wedge$ | 0 | 1 | 01 |
|---|---|---|---|
| a | b | a | b |
| b | a | — | — |

At step 132, since no remaining untried active column headers derived from the input sequence 0 (that input sequence selected at step 124) exist in the output mapping tables, control returns to step 126.

At step 126, since no untried input character from the input alphabet remains (both input characters 0 and 1 are marked as tried), control returns to step 124.

At step 124, two untried active input strings exist in the Compilation Table, Exemplar 30, 1 and 01. We choose the leftmost active input string, 1, and mark it as tried. Also, every character of the state-machine input alphabet is marked untried.

At step 126, the character 0 is selected from the state-machine input alphabet and marked as tried.

At step 128, the new input sequence 10 (the 0 input character selected at step 126 appended to the old active input sequence 1 selected at step 124) is created. This new input sequence is marked untried.

At step 130, a new column is created for possible entry into the Compilation Table. This new column is headed by the new input sequence 10, and it is created by applying this new input sequence created at step 128, one character at a time, in character reverse order, to the present state entries of the state table under consideration, Table 4, resulting in Exemplar 31. Finally, at step 130, the single active column header of the output mapping tables of Exemplar 29 ($1_1$) derived from the input sequence selected at step 124 (1) is marked untried.

Exemplar 31

Column Created at Step 130

| 10 |
|---|
| — |

-continued

| a |
|---|

At step 132, an untried active output column header of Exemplar 29 which is derived from the input sequence selected at step 124 (the 1 input sequence) is selected and marked as tried. Only one such untried active column header exists in Exemplar 29, $1_1$. We choose $1_1$ and mark it as tried. Also, we note the state-machine output function which distinguishes the selected output mapping column header, the first state-machine output function.

At step 134, a new output mapping column is created by applying the state-machine output function noted at step 132 (the first state-machine output function) to the column of internal state entries created at step 130 (Exemplar 31) as if each entry in Exemplar 31 were a present state entry of the state-machine, resulting in Exemplar 32.

Exemplar 32

Output Mapping Column Created at Step 134

| $10_1$ |
|---|
| — |
| 0 |

Note that the column header of the output mapping column of Exemplar 32 is the input sequence determined at step 28 distinguished by the state-machine output function noted at step 132, that input sequence and state-machine output function used to create the new output mapping column.

At step 136, the output mapping column of Exemplar 32 is compared with all output mapping columns of all previously generated output mapping tables, that is, with all output mapping columns of Exemplar 29, for equal effect. Since the output mapping column of Exemplar 32 is not identical to any previously generated output mapping column, the column header of the output mapping column of Exemplar 32 ($10_1$) is entered as a new column header of the antecedent table. Furthermore, this column header ($10_1$) is designated the antecedent sequence of the column header of the output mapping column selected as step 132 ($1_1$), under the input character selected at step 126 (0). Hence, the column header $10_1$ is entered as an element of the antecedent table in that column having as a column header $1_1$ in that row associated with the input character 0, pthe top row.

The new antecedent table is exhibited in Exemplar 33.

Exemplar 33

Antecedent Table Created at Step 136

| $\wedge_1$ | $\wedge_2$ | $0_1$ | $0_2$ | $1_1$ | $1_2$ | $10_1$ |
|---|---|---|---|---|---|---|
| 0 | $0_1$ | $0_2$ | $\wedge_1$ | $\wedge_2$ | $10_1$ | |
| 1 | $1_1$ | $\wedge_2$ | $\wedge_2$ | $01_2$ | | |

Since the column header of the output mapping column of Exemplar 32 is declared active, then the output mapping column of Exemplar 32 is entered as a new column of the first output mapping table, that output mapping table associated with the output function noted at step 132, the first output function. The new output mapping tables are exhibited in Exemplar 34.

Exemplar 34

Output Mapping Tables Created at Step 136

| $\wedge_1$ | $0_1$ | $1_1$ | $10_1$ |
|---|---|---|---|
| 0 | 1 | 0 | — |
| 1 | 0 | — | 0 |
| $\wedge_2$ | $0_2$ | $01_2$ | |
| 1 | — | — | |
| — | 1 | — | |

Since the column header of the output mapping column of Exemplar 32 is declared active, then the new input sequence determined at step 128 (10) is declared active and its associated column, that column exhibited in Exemplar 31, is entered as a new column of the Compilation Table. The new Compilation Table is exhibited in Exemplar 35. Control then proceeds at step 132.

Exemplar 35

Compilation Table Created at Step 136

| /\ | 0 | 1 | 01 | 10 |
|---|---|---|---|---|
| a | b | a | b | — |
| b | [u] | a | — — | a |

At step 132, since no remaining untried active column headers derived from the input sequence 1 (that input sequence selected at step 124) exist, control returns to step 126.

At step 126, the remaining untried input character, "1" is selected from the state-machine input alphabet and marked as tried.

At step 128, the new input sequence 11 is created, (the input character "1" selected at step 126 appended to the old active input sequence "1" selected at step 124).

At step 130, a new column is created for possible entry into the Compilation Table. This new column is headed by the new input sequence 11, and it is created by applying this new input sequence created at step 128, one character at a time, in character reverse order, to the present state entries of the state table under consideration, Table 4, resulting in Exemplar 36.

Exemplar 36

Column Created at Step 130

| 11 |
|---|
| a |
| — |

Finally, at step 130, all active column headers of output mapping columns of Exemplar 34 ($1_1$) derived from the input sequence selected at step 124 (1) are marked untried.

At step 132, an untried active output column header of Exemplar 34 which is derived from the input sequence selected at step 124 (the 1 input sequence) is $1_1$ selected and marked as tried. Only one such untried active column header exists in Exemplar 34, $1_1$. We choose $1_1$ and mark it as tried. Also, we note the state-machine output function which distinguishes the selected output mapping column header, the first state-machine output function.

At step 134, a new output mapping column is created by applying the state-machine output function noted at step 132 (the first state-machine output function) to the column of internal state entries created at step 130 (Exemplar 36) as if each entry in Exemplar 36 were a present state entry of the state-machine, resulting in Exemplar 37.

Exemplar 37

Output Mapping Column Created at Step 134

| [11] | $11_1$ |
|---|---|
| | 0 |
| | — |

Note that the column header of the output mapping column of Exemplar 37 is the input sequence determined at step 128 distinguished by the state-machine output function noted at step 132, that input sequence and state-machine output function used to create the new output mapping column.

At step 136, the output mapping column of Exemplar 37 is compared with all output mapping columns of all previously generated output mapping tables, that is, with all output mapping columns of Exemplar 34, for equal effect. It is noted that the output mapping column of Exemplar 37 is identical to that output mapping column of the first output mapping table of Exemplar 34 having as its column header the input sequence $1_1$. Hence, the column header $1_1$ is designated the antecedent sequence of the column header of the output mapping column selected at step 132, $1_1$, under the state-machine input character selected at step 126, the input character 1 (that is, $1_1$ is its own antecedent sequence under the state-machine input character 1) and this input sequence, $1_1$, is entered in the antecedent table in that column having as a column header $1_1$, in the row associated with the input character 1, the bottom row. The new antecedent table is exhibited in Exemplar 38. Control returns to step 132.

Exemplar 38

Antecedent Table Created at Step 136

| | $\wedge_1$ | $\wedge_2$ | $0_1$ | $0_2$ | $1_1$ | $01_2$ | $10_1$ |
|---|---|---|---|---|---|---|---|
| 0 | $0_1$ | $0_2$ | $\wedge_1$ | $\wedge_2$ | $10_1$ | | |
| 1 | $1_1$ | $\wedge_2$ | $\wedge_2$ | $01_2$ | $1_1$ | | |

At step 132, since no remaining untried active column headers associated with the input sequence 1, that input sequence selected at step 124, exist in the output mapping tables, Exemplar 34, control returns to step 126.

At step 126, since no untried input character from the state-machine input alphabet remains, control returns to step 124.

At step 124, an active sequence is selected from the compilation table, Exemplar 35, and marked as tried. The two untried active input sequences of Exemplar 35 are 01 and 10. We choose the first such sequence, 01, and designate it the old active input sequence. Also, every character of the state-machine input alphabet is marked untried.

At step 126, the character 0 is selected from the state-machine input alphabet and marked as tried.

At step 128, the new input sequence 010 (the 0 input character selected at step 126 appended to the old active input sequence 01 selected at step 124) is created. This new input sequence is marked untried.

At step 130, a new column is created for possible entry into the Compilation Table. This new column is headed by the new active input sequence, 010, and it is determined by applying the new input sequence 010, character at a time, in character reverse order, to the present state entries of the state-table under consideration (Table 4), resulting in Exemplar 39.

Exemplar 39

Column Created at Step 130

| 010 |
|---|
| — |
| b |

Finally, at step 130, all active column headers of output mapping columns of the output mapping tables, Exemplar 34, which are derived from the input sequence selected at step 124 (01), are marked untried. Only one such outpost mapping column header exists, $01_2$.

At step 132, an untried active output column header of Exemplar 34 which is derived from the input sequence selected at step 124 (the 01 input sequence) is selected and marked as tried. Only one such untried active column header exists in Exemplar 34, $01_2$. We choose $01_2$ and mark it as tried. Also, we note the state-machine output function which distinguishes the selected output mapping column header, the second state-machine output function.

At step 134, a new output mapping column is created by applying the state-machine output function noted at step 132 (the second state-machine output function) to the column of internal state entries created at step 130 (Exemplar 39) as if each entry in Exemplar 39 were a present state entry of the state-machine, resulting in Exemplar 40.

Exemplar 40

Output Mapping Column Created at Step 134

| $010_2$ |
|---|
| — |
| — |

Note that the column header of the output mapping column of Exemplar 40 is the input sequence determined at step 28 distinguished by the state-machine output function noted at step 132, that input sequence and state-machine output function used to create the new output mapping column.

At step 136, the output mapping column of Exemplar 40 is compared with all output mapping columns of all previously generated output mapping tables, that is, with all output mapping columns of Exemplar 34, for equal effect. It is noted that the output mapping column of Exemplar 40 is identical to that output mapping column of the second output mapping table of Exemplar 34 having as its column header the input sequence $01_2$. Hence, the column header $01_2$ is designated the antecedent sequence of the column header of the output mapping column selected at step 132, $01_2$, under the state-machine input character selected at step 126, the input character 0 (that is, $01_2$ is its own antecedent sequence under the state-machine input character 0) and this input sequence, $01_2$, is entered in the antecedent table in that column having as a column header $01_2$, in the row associated with the input character 0, the top row. The new antecedent table is exhibited in Exemplar 41. Control returns to step 132.

Exemplar 41

Antecedent Table Created at Step 136

| | $/\backslash_1$ | $/\backslash_2$ | $0_1$ | $0_2$ | $1_1$ | $01_2$ | $10_1$ |
|---|---|---|---|---|---|---|---|
| 0 | $0_1$ | $0_2$ | $/\backslash_1$ | $/\backslash_2$ | $10_1$ | $01_2$ | |
| 1 | $1_1$ | $/|_2$ | $/\backslash_2$ | $01_2$ | $1_1$ | | |

At step 132, since no remaining untried active column headers associated with the input sequence 01, that input sequence selected at step 124, exist in the output mapping tables, Exemplar 34, control returns to step 126.

At step 126, the untried input character "1" is selected from the state-machine input alphabet {0,1} and marked as tried.

At step 128, the new active input string 011 is created (the input character 1 selected at step 126 appended to the input string 01 created at step 124). This new input string is marked untried.

At step 130, a new column is created for possible entry into the Compilation Table. This new column is headed by the new input sequence, 011, and it is determined by applying this new input sequence 011, character at a time, in character reverse order, to the present state entries of the state-table under consideration (Table 4), resulting in Exemplar 42.

Exemplar 42

Column Created at Step 130

| 011 |
|---|
| b |
| — |

Finally, at step 130, all active column headers of output mapping columns of the output mapping tables, Exemplar 34, which are derived from the input sequence selected at step 124 (01), are marked untried. Only one such column header exists, $01_2$.

At step 132, an untried active output column header of Exemplar 34 which is derived from the input sequence selected at step 124 (the 01 input sequence) is selected and marked as tried. Only one such untried active output column header exists in Exemplar 34, $01_2$. We choose $01_2$ and mark it as tried. Also, we note the state-machine output function which distinguishes the selected output mapping column header, the second state-machine output function.

At step 134, a new output mapping column is created by applying the state-machine output function noted at step 132 (the second state-machine output function) to the column of internal state entries created at step 130 (Exemplar 42) as if each entry in Exemplar 42 were a present state entry of the state-machine, resulting in Exemplar 43.

Exemplar 43

Output Mapping Column Created at Step 134

| $011_2$ |
|---|
| — |

Note that the column header of the output mapping column of Exemplar 43 is the input sequence determined at step 128 distinguished by the state-machine output function noted at step 132, that input sequence and state-machine output function used to create the new output mapping column.

At step 136, the output mapping column of Exemplar 43 is compared with all output mapping columns of all previously generated output mapping tables, that is, with all output mapping columns of Exemplar 34, for equal effect. It is noted that the output mapping column of Exemplar 43 is identical to that output mapping column of the second output mapping table of Exemplar 34 having as its column header the input sequence $01_2$. Hence, the column header $01_2$ is designated the antecedent sequence of the column header of the output mapping column selected at step 132, $01_2$, under the state-machine input character selected at step 126, the input character 1 (that is, $01_2$ is its own antecedent sequence under the state-machine input character 1) and this input sequence, $01_2$, is entered in the antecedent table in that column having as a column header $01_2$, in the row associated with the input character 1, the bottom row. The new antecedent table is exhibited in Exemplar 44. Control returns to step 132.

Exemplar 44

Antecedent Table Created at Step 136

| | $/\!_1$ | $/\!_2$ | $0_1$ | $0_2$ | $1_1$ | $01_2$ | $10_1$ |
|---|---|---|---|---|---|---|---|
| 0 | $0_1$ | $0_2$ | $/\!_1$ | $/\!_2$ | $10_1$ | $01_2$ | |
| 1 | $1_1$ | $/\!_2$ | $/\!_2$ | $01_2$ | $1_1$ | $01_2$ | |

At step 132, since no remaining untried active column headers derived from the input sequence 01, that input sequence selected at step 124, exist in the output mapping tables, Exemplar 34, control returns to step 126.

At step 126, since no untried input character from the state-machine input alphabet remains, control returns to step 124.

At step 124, an untried active input sequence is selected from the Compilation Table, Exemplar 35, and marked as tried. The only untried active column header remaining in Exemplar 35 is the 10 input sequence. The 10 input sequence is therefore selected and marked as tried. Also, every character of the state-machine input alphabet is marked untried.

At step 126, the character 0 is selected from the state-machine input alphabet and marked as tried.

At step 128, the new input sequence 100 (the 0 input character selected at step 126 appended to the old active input sequence 10 selected at step 124) is created. This new input sequence is marked untried.

At step 130, a new column is created for possible entry into the Compilation Table. This new column is headed by the new active input sequence, 100, and it is determined by applying the new input sequence 100, character at a time, in character reverse order, to the present state entries of the state-table under consideration (Table 4), resulting in Exemplar 45.

Exemplar 45

Column created at Step 130

| 100 |
|---|
| a |
| — |

Finally, at step 130, all active column headers of output mapping columns of the output mapping tables, Exemplar 34, which are derived from the input sequence selected at step 124 ($10_1$), are marked untried. Only one such active output mapping column header exists, 10.

At step 132, an untried active output column header of Exemplar 34 which is derived from the input sequence selected at step 124 (the 10 input sequence) is selected and marked as tried. Only one such untried active column header exists in Exemplar 34, $10_1$. We choose $10_1$ and mark it as tried. Also, we note the state-machine output function which distinguishes the selected output mapping column header, the first state-machine output function.

At step 134, a new output mapping column is created by applying the state-machine output function noted at step 132 (the first state-machine output function) to the column of internal state entries created at step 130 (Exemplar 45) as if each entry in Exemplar 45 were a present state entry of the state-machine, resulting in Exemplar 46.

Exemplar 46

Output Mapping Column Created at Step 134

| $100_1$ |
|---|
| 0 |
| — |

Note that the column header of the output mapping column of Exemplar 46 is the input sequence determined at step 128 distinguished by the state-machine output function noted at step 132, that input sequence and state-machine output function used to create the new output mapping column.

At step 136, the output mapping column of Exemplar 45 is compared with all output mapping columns of all previously generated output mapping tables, that is, with all output mapping columns of Exemplar 34, for equal effect. It is noted that the output mapping column of Exemplar 46 is identical to that output mapping column of the first output mapping table of Exemplar 34 having as its column header the input sequence $1_1$. Hence, the column header $1_1$ is designated the antecedent sequence of the column header of the output mapping column selected at step 132, $10_1$, under the state-machine input character selected at step 126, the input character 0, and this input sequence, $1_1$, is entered in the antecedent table in that column having as a column header $10_1$, in the row associated with the input character 0, the top row. The new antecedent table is exhibited in Exemplar 47. Control returns to step 132.

Exemplar 47

Antecedent Table Created at Step 136

| | $/\!_1$ | $/\!_2$ | $0_1$ | $0_2$ | $1_1$ | $01_2$ | $10_1$ |
|---|---|---|---|---|---|---|---|
| 0 | $0_1$ | $0_2$ | $/\!_1$ | $/\!_2$ | $10_1$ | $01_2$ | $1_1$ |

-continued

| 1 | $1_1$ | $/\!\backslash_2$ | $/\!\backslash_2$ | $01_2$ | $1_1$ | $01_2$ |
|---|---|---|---|---|---|---|

At step 132, since no remaining untried active column headers associated with the input sequence 10, that input sequence selected at step 124, exist in the output mapping tables, Exemplar 34, control returns to step 126.

At step 126, the untried character "1" is selected from the state-machine input alphabet {0,1} and marked as tried.

At step 128, the new active input sequence 101 is created (the input character 1 selected at step 126 appended to the input sequence 10 selected at step 124). This new active input sequence is marked untried.

At step 130, a new column is created for possible entry into the Compilation Table. This new column is headed by the new active input sequence, 101, and it is determined by applying the new input sequence 101, character at a time, in character reverse order, to the present state entries of the state-table under consideration (Table 4), resulting in Exemplar 48.

Exemplar 48

Column Created at Step 130

| 101 |
|---|
| — |
| — |

Finally, at step 130, all active column headers of output mapping columns of the output mapping tables, Exemplar 34, which are derived from the input sequence selected at step 124 (10), are marked untried. Only one such active output mapping column header exists, $10_1$.

At step 132, an untried active output column header of Exemplar 34, which is derived from the input sequence selected at step 124 (the 10 input sequence) is selected and marked as tried. Only one such untried active column header exists in Exemplar 34, $10_1$. We choose $10_1$ and mark it as tried. Also, we note the state-machine output function which distinguishes the selected output mapping column header, the first state-machine output function.

At step 134, a new output mapping column is created by applying the state-machine output function noted at step 132 (the first state-machine output function) to the column of internal state entries created at step 130 (Exemplar 48) as if each entry in Exemplar 48 were a present state entry of the state-machine, resulting in Exemplar 49. It is noted that, since each entry of the column of internal states exhibited in Exemplar 48 is a "—", then each entry in that column which results in an output assignment applied to the column of internal states exhibited in Exemplar 48 is trivially a "—".

Exemplar 49

Output Mapping Column Created at Step 134

| $101_1$ |
|---|
| — |
| — |

Note that the column header of the output mapping column of Exemplar 49 is the input sequence determined at step 128 distinguished by the state-machine output function noted at step 132, that input sequence and state-machine output function used to create the new output mapping column.

At step 136, the output mapping column of Exemplar 49 is compared with all output mapping columns of all previously generated output mapping tables, that is, with all output mapping columns of Exemplar 34, for equal effect. It is noted that the output mapping column of Exemplar 49 is identical to that output mapping column of the second output mapping table of Exemplar 34 having as its column header the input sequence $01_2$. Hence, the column header $01_2$ is designated the antecedent sequence of the column header of the output mapping column selected at step 132, $10_1$, under the state-machine input character selected at step 126, the input character 1, and this input sequence, $01_2$, is entered in the antecedent table in that column having as a column header $10_1$, in the row associated with the input character 1, the bottom row. The new antecedent table is exhibited in Exemplar 50. Control returns to step 132.

Exemplar 50

Antecedent Table Created at Step 136

| | $/\!\backslash_1$ | $/\!\backslash_2$ | $0_1$ | $0_2$ | $1_1$ | $01_2$ | $10_1$ |
|---|---|---|---|---|---|---|---|
| 0 | $0_1$ | $0_2$ | $/\!\backslash_1$ | $/\!\backslash_2$ | $10_1$ | $01_2$ | $1_1$ |
| 1 | $1_1$ | $/\!\backslash_2$ | $/\!\backslash_2$ | $01_2$ | $1_1$ | $01_2$ | $01_2$ |

At step 132, since no remaining untried active column headers derived from the input sequence 10, that input sequence selected at step 124, exist in the output mapping tables, Exemplar 34, control returns to step 126.

At step 126, since no untried input character from the state-machine input alphabet remains, control returns to step 124.

At step 124, since no untried active input sequences remain as column headers of the Compilation Table, Exemplar 35, control proceeds at step 138.

Figure 5:
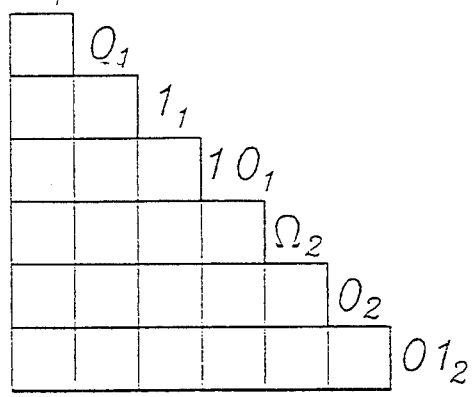
FIG. 5 is an example of an initial pair chart.

At step 138, an initial pair chart is constructed, exhibited in FIG. 5. As indicated, the number of columns of the pair chart is 7, the number of unique column headers of the antecedent table, Exemplar 50. Each such column header of Exemplar 50 resides on a diagonal entry, representing both a row and a column of the pair chart. There is a location in the pair chart allowing an entry indicating compatibility or incompatibility for every pair of unique column headers of Exemplar 50, one such column header heading the column of that entry in the pair chart and the other such column header labelling the row of that entry in the pair chart.

At step 140, each pair of unique column headers of the pair chart of FIG. 5, corresponding to each pair of unique column headers of the Antecedent Table of Exemplar 50, is compared for compatibility. We begin with the leftmost two column headers in FIG. 5, $/\!\backslash$, and $0_1$, and compare their two associated columns in the output mapping tables, Exemplar 34. The top entry in the $/\!\backslash_1$ column contains a 0, whereas the top entry in the $0_1$ column contains a 1; hence, the two input sequences, $/\!\backslash_1$, and $0_1$, are incompatible and an X is entered as the topmost entry in the leftmost column of the pair chart, exhibited in FIG. 6.

Equivalently, we observe the leftmost column header and the column header third from the left ($/\!\backslash_1$ and $1_1$) in the initial pair chart, FIG. 5, and compare their two associated columns in Exemplar 34. The top entries of both columns contain 0 whereas the second entry of the $\wedge_1$ column contains a 1 and the second entry of the $1_1$ column contains a "—". In no instance is there a row of Exemplar 34 in which the $\wedge_1$ column is specified as either a 1 or 0 and that same row of the $1_1$ column is specified as the complementary value; hence, the two input sequences, $\wedge_1$ and $1_1$, are compatible and the second entry of the leftmost column of the pair chart (column headed by $\wedge_1$ and row labelled with $1_1$) is left blank.

The remaining elements of the pair chart are completed accordingly. Note that, in the pair chart, there exists a location corresponding to every pair of unique column headers of the antecedent table, Exemplar 50, one such column header heading a column of the pair chart and the other such column header labelling a row of the pair chart. The pair chart, with the outputs of step 140 entered, is exhibited in FIG. 6.

Figure 6:
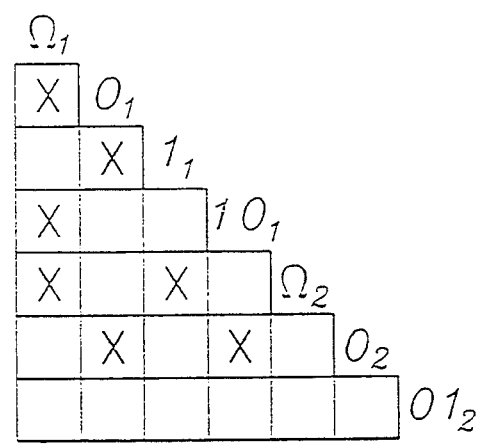
FIG. 6 is an example of a pair chart with pair compatibles indicated.

At step 142, for each compatible pair of input sequences exhibited in FIG. 6, and for each input character of the state-machine, an antecedent pair of input sequences is determined. Beginning with the topmost compatible pair in the leftmost column of the pair chart, $\wedge_1$ and $1_1$, the antecedent pair of this compatible pair under input state 0 is $0_1$ and $10_1$. (The entry in the column of the antecedent table of Exemplar 50, having the column header $\wedge_1$, in that row $1o$ corresponding to the 0 state-machine input character, the top row, is $0_1$. Equivalently, the entry in the column of the antecedent table of Exemplar 50, having the column header $1_1$ in that row corresponding to the 0 input character, the top row, is $10_1$). Now, observing the antecedent pair for the same compatible pair, $\wedge_1$ and $1_1$, under the 1 input state, we obtain $1_1$ and $1_1$ (the entry in the Antecedent Table of Exemplar 50, having the column header $\wedge_1$, in that row corresponding to the 1 state-machine input character is $1_1$. And, the entry in the Antecedent Table of Exemplar 50, having the column header $1_1$, in that row corresponding to the 1 state-machine input character, is $1_1$).

We now proceed to step 144 to derive pair implications for the compatible pair under consideration: $\wedge_1$ and $1_1$. We note that 2 antecedent pairs of input sequences have been generated for this compatible pair, one antecedent pair for each input state (or, equivalently, input character) of the sequential machine under consideration. However, the antecedent pair under input state 1 contains the input string $1_1$ twice; therefore, in accordance with the instructions accompanying step 144, the pair implication under input state 1 becomes the single entry $1_1$. We note, however, that the single entry $1_1$ is a subset of the compatible pair under consideration ($\wedge_1$, $1_1$) and, therefore, in accordance with the instructions accompanying step 144, the antecedent pair under input state 1 becomes the null set ($\phi$). The 2 pair implications (($0_1$, $10_1$) and $\phi$) for the designated compatible pair are entered in the appropriate location of the pair chart. This entry is exhibited in FIG. 7.

We now proceed to the next entry indicating compatibility in the leftmost column of the pair chart, FIG. 6. Compatibility is indicated for the input sequences $\wedge_1$ and $0_2$. At step 142, as before, we determine two antecedent pairs for the compatible pair under consideration, one antecedent pair for each state-machine input state. For input state 0, the antecedent pair is $0_1$ and $\wedge_2$ (as before, the entry in the antecedent table of Exemplar 50, having the column header $\wedge_1$, in that row corresponding to the 0 state-machine input character, the top row, is $0_1$. And, the entry in the Antecedent Table of Exemplar 50, having the column header $0_2$, in that row corresponding to the 0 state-machine input character, the top row, is $\wedge_2$). For input state 1, the antecedent pair is, by observing the appropriate entries in the Antecedent Table of Exemplar 50, as before, $1_1$ and $01_2$.

As before, we proceed to step 144 to derive pair implications for the compatible pair under consideration: $\wedge_1$ and $0_2$. The antecedent pair under the 0 input state, $0_1$ and $\wedge_2$, becomes a pair implication. However, under the 1 input state, the input sequence $01_2$, a member of the ($1_1$, $01_2$) antecedent pair, has an associated column in the its Output Mapping Table containing strictly "—" entries (refer to Exemplar 34); hence, in accordance with instructions accompanying step 144, the pair implication for the 1 state-machine input state becomes the single entry $1_1$. The 2 pair implications (($0_1$, $\wedge_2$) and $1_1$) for the designated compatible pair are entered in the appropriate location of the pair chart, FIG. 7.

Figure 7:
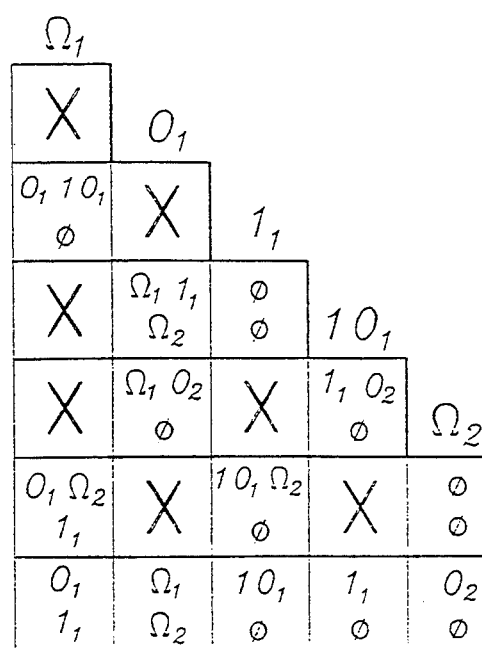
FIG. 7 is an example of a completed pair chart.

Proceeding through steps 142 and 144 for each compatible pair designated in the pair chart of FIG. 6, entering the derived pair implications into the appropriate locations of the pair chart, we obtain the completed pair chart, exhibited in FIG. 7.

At step 146, the set of maximal compatible sets is derived from the completed pair chart, FIG. 7. The procedure of deriving maximal compatible sets is exhibited in FIG. 2 and the accompanying narrative.

At step 222, the two rightmost column headers are chosen from the completed pair chart, FIG. 7, and marked as tried: $0_1$ and $01_2$.

At step 224, the two chosen input sequences (column headers of the completed pair chart) are determined to be compatible (there is no X in the corresponding location of the completed pair chart—bottom row, right hand entry).

At step 226, one trial maximal compatible set is created, consisting of both of the selected column headers. It is exhibited in Exemplar 51.

Exemplar 51

Initial Trial Maximal Compatible Set ($0_2$, $01_2$)

At step 230, there are 5 untried input sequences remaining (column headers of the completed pair chart): $\wedge_1$, $0_1$, $1_1$, $10_1$, and $\wedge_2$.

At step 234, the rightmost untried input sequence is selected and marked as tried: $\wedge_2$.

At step 236, a new trial maximal compatible set is created by determining those input sequences in the existing trial maximal compatible set which are compatible with the most recently selected column header: $\wedge_2$. This determination of compatibility is readily made by observing the $\wedge_2$ column of the completed pair chart, FIG. 7, and noting that input sequence $\wedge_2$ is compatible with $0_2$ and $01_2$ (there is no X in the $\wedge_2$ column of the completed pair chart). Hence, the new trial maximal compatible set is ($\wedge$, $0_2$, $01_2$).

At step 238, the new trial maximal compatible set created at step 236 is combined with the existing trial maximal compatible set to yield a new set of trial maximal compatible sets, exhibited in Exemplar 52.

Exemplar 52

Trial Maximal Compatibles Sets Created at Step 238

$(/\!\backslash\ _2, 0_2, 01_2), (0_2, 01_1)$

At step 240, any trial maximal compatible set which is a proper subset of another trial maximal compatible set is deleted from the set of trial maximal compatible sets. Hence, after step 240, the single trial maximal compatible set remaining is exhibited in Exemplar 53.

Exemplar 53

Trial Maximal Compatible Set Created at Step 240

$(/\!\backslash\ _2, 0_2, 01_2)$

Control now returns to step 230, where 4 untried column headers remain in the completed pair chart, FIG. 7: $/\!\backslash\ _1, 0_1, 1_1,$ and $10_1$.

At step 234, the rightmost untried input sequences is selected and marked as tried: $10_1$.

At step 236, a new trial maximal compatible set is created. The new trial maximal compatible set is created, as before, by combining the most recently selected column header ($10_1$) with those input sequences of the existing trial maximal compatible set which are compatible with it. We note, in FIG. 7, that the input sequence $10_1$, is compatible with the input sequence $/\!\backslash\ _2$ and $01_2$, but not with the input sequence $0_2$. Hence, the new trial maximal compatible is composed of $10_1$ and the two input sequences with which it is compatible, as indicated in Exemplar 54.

Exemplar 54

New Trial Maximal Compatible Sets Created at Step 236

$(10_1, /\!\backslash\ _2, 01_2)$

At step 238, the new trial maximal compatible set exhibited in Exemplar 54 is combined with the existing trial maximal compatible set exhibited in Exemplar 53, yielding Exemplar 55.

Exemplar 55

Trial Maximal Compatible Sets Created at Step 238

$(10_1, /\!\backslash\ _2, 01_2), (/\!\backslash\ _2, 0_2, 01_2)$

At step 240, all proper subsets are deleted to form the set of trial maximal compatible sets. No proper subsets exist in Exemplar 55; hence, the set of trial maximal compatible sets at step 240 remains as exhibited in Exemplar 55. Control then returns to step 230.

At step 230, three untried column headers remain in the completed pair chart: $/\!\backslash\ _1, 0_1,$ and $1_1$.

At step 234, the rightmost untried column header is selected and marked as tried: $1_1$.

At step 236, two new trial maximal compatible sets are created, as before, one for each existing trial maximal compatible set of Exemplar 55. Observing the $1_1$ column of the completed pair chart, FIG. 7, we note that the most recently selected column header, $1_1$, is not compatible with the input sequence $/\!\backslash\ _2$, but $1_1$ is compatible with all remaining input sequences composing the two existing trial maximal compatible sets. Each new trial maximal compatible set created at step 236 consists of the input sequence $1_1$ combined with those input sequences of an existing trial maximal compatible set with which $1_1$ is compatible. These two trial maximal compatible sets are exhibited in Exemplar 56.

Exemplar 56

New Trial Maximal Compatible Sets Created at Step 236

$(1_1, 10_1, 01_2), (1_1, 0_2, 01_2)$

At step 238, the new trial maximal compatible sets exhibited in Exemplar 56 are combined with the existing trial maximal compatible sets exhibited in Exemplar 55, yielding Exemplar 57.

Exemplar 57

Trial Maximal Compatible Sets Created at Step 238

$(1_1, 10_1, 01_2), (1_1, 0_2, 01_2) (10_1, /\!\backslash\ _2, 01_2), (/\!\backslash\ _2, 0_2, 01_2)$ At step 240, any trial maximal compatible set in Exemplar 57 which is a proper subset of another trial maximal compatible set is deleted from consideration. Since no proper subsets exist, the set of trial maximal compatible set remains as exhibited in Exemplar 57, without alteration, and control returns to step 230.

At step 230, two untried column headers remain: $/\!\backslash\ _1$ and $0_1$.

At step 234, the rightmost untried column header is selected and marked as tried: $0_1$.

At step 236, four new trial maximal compatible sets are created. Each new trial maximal compatible set is created, as before, by combining the most recently selected column header, $0_1$, with those input sequences of an existing trial maximal compatible set which are compatible with it. These four new trial maximal compatible sets are exhibited in Exemplar 58.

Exemplar 58

New Trial Maximal Compatible Sets Created at Step 236

$(0_1, 10_1, 01_2), (0_1, 01_2) (0_1, 10_1, /\!\backslash\ _2, 01_2), (0_1, 01_2)$ At step 238, the set of new trial maximal compatible sets, exhibited in Exemplar 58, is combined with the set of existing trial maximal compatible sets exhibited in Exemplar 57, yielding Exemplar 59.

Exemplar 59

Trial Maximal Compatible Sets Created at Step 238

$(0_1, 10_1, 01_2), (0_1, 01_2) (0_1, 10_1, /\!\backslash\ _2, 01_2), (0_1, /\!\backslash\ _2, 01_2)$
$(1_1, 10_1, 01_2), (1_1, 0_2, 01_2) (10_1, /\!\backslash\ _1, 01_2), (/\!\backslash\ _2, 0_2, 01_2)$ At step 240, all proper subsets are deleted from Exemplar 59. We note that the following trial maximal compatible sets are proper subsets of other trial maximal compatible sets in Exemplar 59: $(0_1, 10_1, 01_2), (0_1, 01_2), (0_1, /\!\backslash\ _2, 01_2)$ and $(10_1, /\!\backslash\ _1, 01_2)$. The remaining trial maximal compatible sets in Exemplar 59 are retained and exhibited in Exemplar 60. Control then returns to step 230.

Exemplar 60

Trial Maximal Compatible sets Created at Step 240

$(0_1, 10_1, /\!\backslash\ _2, 01_2), (1_1, 10_1, 01_2) (1_1, 0_2, 01_2), (/\!\backslash\ _2, 0_2, 01_2)$ At step 230, one remaining untried column header exists: $/\!\backslash\ _1$.

At step 234, the $/\!\backslash\ _1$ input sequences is selected and marked as tried.

At step 236, four new trial maximal compatible sets are created. Each new trial maximal compatible set is created, as before, by combining the most recently selected column header, $\bigwedge_1$, with those input sequences of an existing trial maximal compatible set which are compatible with it. These four new trial maximal compatible sets are exhibited in Exemplar 61.

Exemplar 61

New Trial Maximal Compatible Sets Created at Step 236

$(\bigwedge_1, 01_2), (\bigwedge_1, 1_1, 01_2) (\bigwedge_1, 1_1, 0_2, 01_2), (\bigwedge_1, 0_2, 01_2)$ At step 238, the set of new trial maximal compatible sets exhibited in Exemplar 61 is combined with the set of existing trial maximal compatible sets exhibited in Exemplar 60, yielding Exemplar 62.

Exemplar 62

Trial Maximal Compatible Sets Created at Step 238

$(\bigwedge_1, 01_2), (\bigwedge_1, 1_1, 01_2) (\bigwedge_1, 1_1, 0_2, 01_2), (\bigwedge_1, 0_2, 01_2) (0_1, 10_1, \bigwedge_2, 01_2), (1_1, 10_1, 01_2) (1_1, 0_2, 01_2), (\bigwedge_2, 0_2, 01_2)$ At step 240, all proper subsets are deleted from the set of trial maximal compatible sets exhibited in Exemplar 62. We note, in Exemplar 62, that the following trial maximal compatible sets are proper subsets of others: $(\bigwedge_1, 01_2), (\bigwedge_1, 1_1, 01_2), (\bigwedge_1, 0_2, 01_2)$, and $(1_1, 0_2, 01_2)$. The remaining trial maximal compatible sets in Exemplar 62 are retained and exhibited in Exemplar 63. Control then returns to step 230.

Exemplar 63

Maximal Compatible sets $(\bigwedge_1, 1_1, 0_2, 01_2), (\bigwedge_2, 0_2, 01_2) (0_1, 10_1, \bigwedge_2, 01_2), (1_1, 10_1, 01_2)$ At step 230, no untried input sequences remain. Control transfers to step 232.

At step 232, the trial maximal compatible sets exhibited in Exemplar 63 become the set of maximal compatible sets for our example. Control then returns to step 148.

At step 148, all prime compatible sets are derived. Each proper subset of each maximal compatible set is labelled a test compatible set and is considered along with its two associated implication sets (one implication set for each input state), for elimination. As indicated in the instructions accompanying step 148, a test compatible set is eliminated if it is contained as a proper subset of a second test (or maximal) compatible set and simultaneously, the two implication sets of the second test (or maximal) compatible set are contained as subsets (not necessarily proper subsets) of either one or both implication sets of the initial test compatible set under consideration. A test compatible set which is not eliminated is labelled a prime compatible set.

As indicated in the instructions accompanying step 148, each implication set consists of all input sequences which are members of pair implications, for the given input state-machine, associated with compatible pairs which comprise the test compatible set. Also, as indicated in the instructions accompanying step 148, each maximal compatible set is a trivial subset of itself and is, therefore, considered as a test compatible set. Also it is noted that each maximal compatible set becomes a prime compatible set.

We begin with the maximal compatible set $(\bigwedge_1, 1_1, 0_2, 01_2)$ as exhibited in Exemplar 63, label it a test compatible set, and derive its two implication sets. For input state 0, we observe the pair implications associated with the first two elements, $\bigwedge_1$, and $1_1$, from the appropriate entry in the completed pair chart, FIG. 7. The pair implication is $(0_1, 10_1)$. Hence, $0_1$ and $10_1$ are members of the implication set associated with this test compatible set and input state 0. We now observe, for input state 0, the pair implications associated with the first and third elements of the test compatible set, $\bigwedge_1$ and $0_2$, from the appropriate entry in the pair chart, FIG. 7. This pair implication is $(0_1, \bigwedge_2)$. Hence, $\bigwedge_2$ is included as a member of the implication set associated with this test compatible and input state 0. We continue, as before, to determine all pair implications for input state 0 and for all pairs of input strings comprising the test compatible set. The pair implication associated with $\bigwedge_1$ and $01_2$ is the single input string $0_1$, which has already been included in the implication set. The pair implication associated with $1_1$ and $0_2$ is $(10_1, \bigwedge_2)$, both strings having already been included. The pair implication associated with $1_1$ and $01_2$ is the single element $10_1$, which, as before, has already been included. Finally, the pair implication associated with the pair $0_2$ and $01_2$ is $\bigwedge_2$, which also has already been included. The implication set associated with this test compatible set and input state 0 is therefore $(0_1, 10_1, \bigwedge_2)$.

Note that, for the maximal compatible set $(\bigwedge_1, 1_1, 0_2, 01_2)$ and input state 1, the singleton entry $1_1$ is initially determined to be a valid implication set. However, in accordance with the instructions accompanying step 148, the input sequence $1_1$ is a member of the maximal compatible set $(\bigwedge_1, 1_1, 0_2, 01_2)$ and it is therefore eliminated and replaced by the null set.

We now consider each proper subset of the maximal compatible set $(\bigwedge_1, 1_1, 0_2, 01_2)$, label each such proper subset a test set, and determine its two implication sets.

Beginning with its proper subset consisting of its first three elements $(\bigwedge_1, 1_1, 0_2)$, the implication set associated with this proper subset and input state 0 is (by observing, as before, the completed pair chart—FIG. 7) $(0_1, 10_1, \bigwedge_2)$. Equivalently, the implication set associated with this proper subset and input state 1 is the null set. Note that this test compatible $(\bigwedge_1, 1_1, 0_2)$ is eliminated since it is contained as a proper subset of the prime compatible set $(\bigwedge_1, 1_1, 0_2, 01_2)$ and, simultaneously, the implication sets of the prime (maximal) compatible set (the implication sets $(0_1, 10_1, \bigwedge_2)$ and the null set) are contained as subsets of the implication sets of the test compatible under consideration.

We now observe the proper subset of the maximal compatible set $(\bigwedge_1, 1_1, 0_2, 01_2)$ consisting of the first, second, and fourth elements, $(\bigwedge_1, 1_1, 01_2)$, and label this proper subset a test set; the implication set associated with this proper subset and input state 0 is $(0_1, 10_1)$. And the implication set associated with this proper subset and input state 1 is the null set. Note that this test set $(\bigwedge_1, 1_1, 01_2)$ is not eliminated by the maximal compatible set $(\bigwedge_1, 1_1, 0_2, 01_2)$ in Table 5 since this only maximal compatible which contains this test set as a subset (the maximal compatible set $(\bigwedge_1, 1_1, 0_2, 01_2)$) has for input state 0 an implication set $(0_1, 10_1, \bigwedge_2)$ which is not contained as a subset of the implication set of the test compatible set under consideration. This subset test compatible set may possibly be eliminated by a future test compatible set under consideration, but for now it is retained.

All proper subsets of maximal compatible sets are considered, in turn, as test compatible sets; any test compatible set not eliminated by an existing maximal compatible set or by another test compatible set is labelled, along with each existing maximal compatible set, as a prime compatible set and it is retained for possible inclusion in the Minimal Cover Tree. The list of prime compatible sets, along with their associated implication sets, is exhibited in Table 5.

TABLE 5 [6]

Prime [Compatibles] Compatible Sets With Implication Sets

| prime compatible | implication sets |
|---|---|
| $(/\!\!\setminus_1, 1_1, 0_2, 01_2)$ | |
| input state 0 | $(0_1, 10_1, /\!\setminus_2)$ |
| input state 1 | $\phi$ |
| $(/\!\!\setminus_1, 1_1, 01_2)$ | |
| input state 0 | $(0_1, 10_1)$ |
| input state 1 | $\phi$ |
| $(/\!\!\setminus_1, 0_2, 01_2)$ | |
| input state 0 | $(0_1, /\!\setminus_2)$ |
| input state 1 | $\phi$ |
| $(1_1, 0_2, 01_2)$ | |
| input state 0 | $(10_1, /\!\setminus_2)$ |
| input state 1 | $\phi$ |
| $(/\!\!\setminus_1, 01_2)$ | |
| input state 0 | $0_1$ |
| input state 1 | $1_1$ |
| $(0_1, 10_1, /\!\setminus_2, 01_2)$ | |
| input state 0 | $(/\!\setminus_1, 1_1, 0_2)$ |
| input state 1 | $\phi$ |
| $(0_1, /\!\setminus_2, 01_2)$ | |
| input state 0 | $(/\!\setminus_1, 0_2)$ |
| input state 1 | $\phi$ |
| $(0_1, 10_1, 01_2)$ | |
| input state 0 | $(/\!\setminus_1, 1_1)$ |
| input state 1 | $/\!\setminus_2$ |
| $(10_1, /\!\setminus_2, 01_2)$ | |
| input state 0 | $(1_1, 0_2)$ |
| input state 1 | $\phi$ |
| $(0_1, 01_2)$ | |
| input state 0 | $/\!\setminus_1$ |
| input state 1 | $/\!\setminus_2$ |
| $(1_1, 10_1, 01_2)$ | |
| input state 0 | $\phi$ |
| input state 1 | $\phi$ |
| $(/\!\setminus_2, 0_2, 01_2)$ | |
| input state 0 | $\phi$ |
| input state 1 | $\phi$ |

At step 154, the Candidate Minimal Cover Trees are constructed, from which a minimal cover path is derived, in accordance with Exemplar 3 and the accompanying narrative. The number of nodes of the Minimal Cover path yields the minimal size cellular array for the application under consideration.

At step 322 (Exemplar 3), the Covering Table is constructed. The Covering Table consists of two columns, each row of the leftmost column containing a unique input Sequence derived at step 136, and each row of the rightmost column containing the number of prime compatible sets in Table 5 having the input sequence of that row as an element. The Covering Table is exhibited as Table 7.

TABLE 6 [7]

Covering Table

| input string | # of prime compatibles containing input string |
|---|---|
| $/\!\setminus_1$ | 4 |
| $0_1$ | 4 |
| $1_1$ | 4 |
| $10_2$ | 4 |
| $/\!\setminus_2$ | 4 |

TABLE 6 [7]-continued

Covering Table

| input string | # of prime compatibles containing input string |
|---|---|
| $0_2$ | 4 |
| $01_2$ | 12 |

At step 324, the input sequence which is contained in the fewest number of prime compatible sets is chosen from the Covering Table. We note that all input sequences with the exception of $01_2$ are contained in exactly 4 prime compatible sets, the fewest number in Table 7. We choose the first input sequence, $/\!\setminus_1$, to form the root nodes of the Candidate Minimal Covering Trees.

At step 326, each prime compatible set from Table 6 which contains the selected input sequence $/\!\setminus_1$ as an element is listed as a root node of a Candidate minimal covering tree. These 4 root nodes are exhibited in Exemplar 35.

Exemplar 35

Root Nodes $(/\!\setminus_1, 1_1, 0_2, 01_2)$
$(/\!\setminus_1, 1_1, 01_2)$
$(/\!\setminus_1, 0_2, 01_2)$
$(/\!\setminus_1, 01_2)$ At step 328, a test path is chosen from the set of candidate minimal covering trees, Exemplar 35. This test path is the path having the fewest number of nodes of all paths. In Exemplar 35, all paths have only 1 node; consequently, any path in Exemplar 64 may be chosen as the initial test path. We choose the top node $(/\!\setminus_1, 1_1, 0_2, 01_2)$ and label it the test path.

At step 330, the question is posed: does the test path satisfy closure? In this case, is the single implication set $(0_1, 10_1, /\!\setminus_2)$ associated with the root node contained as a subset of at least one node of the test path. Clearly, the answer is no, since the single node comprising the test path is the prime compatible set associated with this implication set. Hence, the procedure goes to step 332.

At step 332, we determine all prime compatible sets which contain the uncovered implication set as a subset. In this case, only one prime compatible set from Table 6 contains the uncovered implication set $(0_1, 10_1, /\!\setminus_2)$. This prime compatible set is $(0_1, 10_1, /\!\setminus_2, 01_2)$. Hence, at step 332, the test path is extended to the right by adding a branch and node representing the prime compatible set which covers the uncovered implication set. The new set of candidate minimal covering trees, with the new extended path, is exhibited in Exemplar 36. Control then returns to step 328.

Exemplar 36

Candidate Minimal Covering Trees Generated at Step 332

$(/\!\setminus_1, 1_1, 0_2, 01_2)$ —— $(0_1, 10_1, /\!\setminus_2, 01_2)$
$(/\!\setminus_1, 1_1, 01_2)$
$(/\!\setminus_1, 0_2, 01_2)$
$(/\!\setminus_1, 01_2)$ At step 328, as before, the path containing the fewest number of nodes is selected from the set of candidate minimal covering trees, in this case from the set of candidate trees in Exemplar 36. There are 3 paths containing only 1 node. Hence, we choose the topmost path containing only one node $(/\backslash_1, 1_1, 01_2)$, and label it the test path.

At step 330, the question is posed: does the test path satisfy closure? Is the single implication set $(0_1, 10_1)$ associated with the prime compatible set $(/\backslash_1, 1_1, 01_2)$ contained as a subset of at least one node of the test path? As before, the answer in this case is clearly no; hence, control transfers to step 332.

At step 332, all prime compatible sets from Table 6 are selected which contain the uncovered implication set $(0_1, 10_1)$ as a subset. In this case, there are two such prime compatible sets: $(0_1, 10_1, /\backslash_2, 01_2)$ and $(0_1, 10_1, 01_2)$. The test path in Exemplar 36 is then extended to the right by adding a branch and node for each prime compatible set containing the uncovered implication set. The new set of candidate minimal covering trees, with the new extended path, is exhibited in Exemplar 37. The procedure then returns to step 328.

Exemplar 37

Candidate Minimal Covering Trees Generated at Step 332

$(/\backslash_1, 1_1, 0_2, 01_2)$ ——— $(0_1, 10_1, /\backslash_2, 01_2)$ $(/\backslash_1, 1_1, 01_2)$ ——— $(0_1, 10_1, /\backslash_2, 01_2)$ $(0_1, 10_1, 01_2)$ $(/\backslash_1, 0_2, 01_2)$ $(/\backslash_1, 01_2)$ At step 328, as before, the path containing the fewest number of nodes is selected from the set of candidate trees, in this case from the candidate trees exhibited in Exemplar 37. There are two paths containing only one node. We choose the topmost node representing the prime compatible set $(/\backslash_1, 0_2, 01_2)$ and label it the test path.

At step 330, as before, the question is posed: does the test path satisfy closure? In this case, are the two implication sets $(0_1, /\backslash_2)$ and $1_1$, associated with the prime compatible set $(/\backslash_1, 0_2, 01_2)$ contained as subsets of various nodes of the test path? As before, the answer is clearly no. Hence, control transfers to step 332.

At step 332, all combinations of prime compatible sets from Table 6 are selected which contain the two implication sets $(0_1, /\backslash_2)$ and $1_1$ as subsets. These combinations are then used to extend the test path, resulting in Exemplar 38.

Exemplar 38

Candidate Minimal Covering Trees Generated at Step 332

$(/_1, 1_1, 0_2, 01_2)$—$(0_2, 10_1, /\backslash_2, 01_2)$*

$(/_1, 1_1, 01_2)$⟨$(0_1, 10_1, /\backslash_2, 01_2)$ / $(0_1, 10_1, 01_2)$⟩

$(/\backslash_1, 0_2, 01_2)$——$(0_1, 10_1, /\backslash_2, 01_2)$⟨$(/\backslash_1, 1_1, 0_2, 01_2)$ / $(/\backslash_1, 1_1, 01_2)$ / $(1_1, 0_2, 01_2)$ / $(1_1, 10_1, 01_2)$⟩

$(0_1, /\backslash_2, 01_2)$⟨$(/\backslash_1, 1_1, 0_2, 01_2)$ / $(/\backslash_1, 1_1, 01_2)$ / $(1_1, 0_2, 01_2)$ / $(1_1, 10_1, 01_2)$⟩

$(/\backslash_1, 01_2)$

-continued

The procedure then returns to step 328.

At step 328, the path containing the fewest number of nodes is selected from the set of candidate trees, in this case from the set of candidate trees exhibited in Exemplar 38. One path contains a single node, that node representing the prime compatible set $(/\backslash_1, 01??)$. This path is selected as the test path.

At step 330, as before, the question is posed: does the test path satisfy closure? In this case, the two singleton implication sets $0_1$ and $1_1$ associated with the prime compatible set $(/\backslash_1, 01_2)$ must be covered. As before, neither implication set is covered by the prime compatible set associated with the single node of the test path. Control then transfers to step 332.

At step 332, all combinations of prime compatible sets from Table 6 are selected which contain the two singleton implication sets $0_1$ and $1_1$ as subsets. These combinations are then used to extend the test path, resulting in Exemplar 39.

Exemplar 39

Expansion of the Root Node $(/\backslash_1, 01_2)$ at Step 332

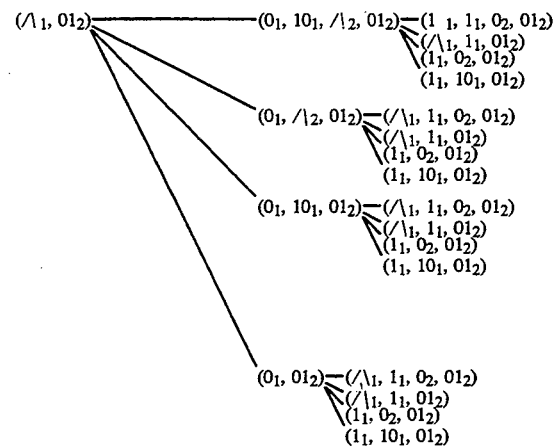

Control then returns to step 328.

At step 328, as before, the path containing the fewest number of nodes is selected from the set of candidate minimal covering trees, in this case from the set of candidate trees exhibited in Exemplars 45 and 46. As the top three paths of Exemplar 38 contain only two nodes each, whereas all other paths of Exemplars 45 and contain three nodes each, we choose one of the top three paths of Exemplar 38, arbitrarily the top path, as the test path.

At step 330, the question is posed, as before, does the test path satisfy closure? Is each implication set associated with each node of the test path included as a subset of at least one prime compatible set associated with the test path? In this case, there are two prime compatible set associated with the test path: $(/\backslash_1, 1_1, 0_2, 01_2)$ and $(0_1, 10_1, /\backslash_2, 01_2)$. The only implication set associated with the prime compatible set $(/\backslash_1, 1_1, 0_2, 01_2)$ is $(0_1, 10_1, /\backslash_2)$—the implication set for input state 1 is the null set—and this implication set is contained as a subset of the other prime compatible set of the test path. The implication set associated with the prime compatible set $(0_1, 10_1, /\backslash_2, 01_2)$ is $(/\backslash_1, 1_1, 0_2)$ and this implication set is contained as a subset of the prime compatible set which is the root node of the test path. Hence, all implication sets are contained as subsets of prime compatible sets associated with the test path and control proceeds at step 334.

At step 334, the question is posed: does the test path constitute a cover? Is each unique input sequence listed in the left hand column of the covering table, Table 6, contained as a member of at least one of the prime compatible sets associated with the test path? We note that the 7 input sequences listed in the left hand column of the covering table are indeed contained in the two prime compatible sets comprising the test path. Hence, the designated test path constitutes a minimal closed cover and control proceeds at step 340.

At step 340, the designated test path (the test path starred in Exemplar 38), which contains two prime compatible sets, is labelled the minimal cover path and it is used to encode the control memory for the minimal size cellular array which will emulate our application.

As indicated in the instructions accompanying step 340, the number of memory cells in multiple locations along the main diagonal of the cellular array which are to be used for this implementation is the number of nodes in the minimal cover path, in this case two. The number of output columns designated for this implementation is the number of output functions of the sequential machine being emulated—hence two additional columns, one column for each output function of Table 4, each column having a memory cell feeding directly into an output pin buffer, are added to the two columns containing memory cells in multiple locations along the main diagonal, yielding four memory cells total for this example.

As indicated in the instructions accompanying step 340, each memory cell of the cellular array used for the implementation, whether the memory cell occupies one of the multiple locations along the main diagonal or whether the memory cell occupies a location in one of the output columns, has associated with it a prime compatible set. A memory cell located in one of the multiple locations along the main diagonal has associated with it a unique prime compatible set represented in the minimal cover path. A memory cell located in one of the output columns has associated with it a prime compatible set which contains the $/\!\backslash$ sequence distinguished by the number of the output function which that output column generates.

For instance, the four memory cells in the above example are labelled in accordance with Exemplar 40: each memory cell occupying one of the multiple locations of the main diagonal has associated with it a unique prime compatible set representing a node of the minimal cover path, whereas the memory cell residing in the leftmost output column, that output column which realizes output function $Z_1$, has associated with it the prime compatible set $(/\!\backslash\ _1, 1_1, 0_2, 01_2)$, the prime compatible set of the minimal cover path containing $/\!\backslash\ _1$ the input sequence, and the memory cell residing in the rightmost output column, that output column which realizes output function $Z_2$, has associated with it the prime compatible set $(0_1, 10_1, /\!\backslash\ _2, 01_2)$, the prime compatible set of the minimal covering path containing the $/\!\backslash\ _2$ input sequence.

Exemplar 69

Memory Cell Labelling

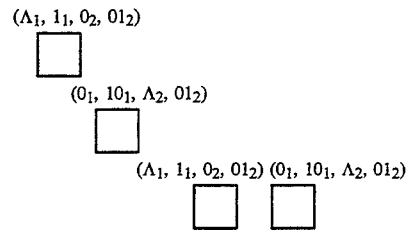

$(A_1, 1_1, 0_2, 01_2)$ $(0_1, 10_1, A_2, 01_2)$ $(A_1, 1_1, 0_2, 01_2)$  $(0_1, 10_1, A_2, 01_2)$

At step 56, a control memory array is constructed. The number of bytes of data required in the control memory array is the number of memory cells used in the cellular array times the number of input states of the sequential machine being emulated, hence eight bytes of control memory data are required—four memory cells total, two memory cells occupying multiple locations along the main diagonal and two memory cells occupying locations in output columns, times two input states of the sequential machine being emulated. In the case that the control memory is implemented as a programmable logic array rather than as random access memory, 8 unique bytes of data are generated by the programmable logic array, as a function of the sequential machine input lines, rather than the 8 bytes occupying physical memory, as in the above case of random access control memory. The two dimensional array representing the control memory—or the output of the control memory programmable logic array—is exhibited in Table 7. The two dimensional array is indexed on its ordinate by each input state of the sequential machine being emulated and on its abscissa by a number corresponding to a unique memory cell of the cellular array.

TABLE 8

| Control Memory Array | | | | |
|---|---|---|---|---|
| input state 0 | 1 | 0 | 1 | 0 |
| input state 1 | 0 | 1 | 0 | 1 |
| memory cell number: | 0 | 1 | $Z_1$ | $Z_2$ |

In Table 8, memory cell number 0—the leftmost horizontal index—refers to the memory cell occupying the leftmost column, the top left diagonal location, whereas memory cell number 1 refers to the memory cell occupying the second to leftmost column, the bottom right diagonal location. This numerical labelling of the memory cells in multiple locations along the main diagonal has a physical significance, as the control lines of a selector occupying a column of the cellular array (whether a column maintaining a memory cell occupying a location in the main diagonal or an output column) are set to the value 0 or 1 to specify which memory cell in the main diagonal is to have its binary value selected to enter the memory cell of the column of that selector at the occurrence of the next clock pulse. The memory cells occupying multiple locations along the main diagonal are the cells which have their binary contents routed to all parts of the cellular array at the occurrence of each clock pulse. The memory cells occupying the output columns, which directly feed output pin buffers, receive their next binary values from the memory cells occupying multiple locations along the main diagonal.

The memory cells occupying the two output column locations are labelled $Z_1$ and $Z_2$ in accordance with the output functions which they support.

Each location of the control memory of Table 8 is indexed on its abscissa by a column number, or a column labelling for the case of a column producing an output function, and on its ordinate by an input state of the sequential machine being emulated. The integer occupying a particular location in the array of Table 8 specifies which memory cell is to have its contents routed to the memory cell designated by its abscissa index under the input state designated by its ordinate index. The memory cell designated in that control memory location is the memory cell associated with the prime compatible set which covers the implication set of the prime compatible set associated with the abscissa index of that control memory location, under the input state designated by the ordinate index of that control memory location.

For instance, in the above case, the integer entry in the upper left corner in the array of Table 8, the entry indexed by memory cell 0, input state 0—that is, the entry which specifies which memory cell along the main diagonal is to be routed to memory cell 0 under input state 0—is that memory cell of the main diagonal corresponding to the prime compatible set which covers the implication set of the prime compatible set associated with memory cell 0 under input state 0.

Specifically, the prime compatible set associated with memory cell 0 (refer to Exemplar 40) is $(/\!\!\setminus_1, 1_1, 0_2, 01_2)$ and its implication set under input state 0 is $(0_1, 10_1, /\!\!\setminus_2)$. This implication set is covered by the prime compatible set which is the second node of the minimal cover tree $(0_1, 10_1, /\!\!\setminus_2, 01_2)$, that prime compatible set associated with memory cell number 1. Hence, the integer 1 is entered in the upper left location, specifying that the contents of memory cell number 1 is routed to memory cell number 0 under input state 0.

Again, we observe the entry in the control memory array, Table 8, indexed by memory cell 1, input state 0 (second to left entry, top row). The prime compatible set associated with memory cell 1 (refer to Exemplar 40) is $(0_1, 10_1, /\!\!\setminus_2, 01_2)$ and this prime compatible set has as an implication set, under input state 0 $(/\!\!\setminus_1, 1_1, 0_2)$. This implication set is covered by the prime compatible set which is the root node of the minimal covering tree $(/\!\!\setminus_1, 1_1, 0_2, 01_2)$, the prime compatible set associated with memory cell number 0. Hence the integer 0 is entered in this location, specifying that the contents of memory cell number 0 is routed to memory cell number 1 under input state 0.

We now observe the second to rightmost column in the control memory array, Table 8, that column indexed by memory cell $Z_1$. The prime compatible set associated with memory cell $Z_1$ is $(/\!\!\setminus_1, 1_1, 0_2, 01_2)$, the prime compatible set associated with the root node of the minimal covering tree. Since this prime compatible set is the same prime compatible set that is associated with memory cell 0, then the memory cell which routes to memory cell $Z_1$, under each input state, is the same memory cell which routes to memory cell 0 under that input state. That is, the prime compatible set which cover the implication sets of the prime compatible set associated with the root node of the minimal covering path cover those implication sets for both memory cell 0 and memory cell $Z_1$, the two memory cells associated with that prime compatible set. Hence, the $Z_1$ column of the control memory array is identical to the leftmost column, the 0 column.

We now observe the leftmost column, bottom entry of Table 8, that entry associated with memory cell 0, input state 1. As before, the prime compatible set associated with memory cell 0 is $(/\!\!\setminus_1, 1_1, 0_2, 01_2)$, the prime compatible set associated with the root node of the minimal cover tree. The implication set for this prime compatible set under input state 1 is the null set (refer to Table 6). Since the null set comes about when the implication set is contained as a subset of its associated prime compatible set (refer to the instructions for step 148), that is, the null set is specified when the prime compatible set covers its own implication set, then the memory cell associated with this prime compatible set must route to itself under the appropriate input state when the null set is indicated. Hence, the integer 0 is entered into this location of the control memory array.

The remaining entries of the control memory array are completed accordingly.

The schematic diagram indicating boundary value encoding and memory cell routing under input state 0, the routing designators extracted from the top row of the control memory array, is exhibited in FIG. 8 whereas the schematic diagram indicating boundary value encoding and memory cell routing under input state 1, the routing designators extracted from the bottom row of the control memory array, is exhibited in FIG. 9.

At step 160, the control memory of the cellular array is set to produce, for each unique binary representation of the state-machine input line, a unique row of binary encoded integer values of Table 7.

Each such binary encoded integer produced by the control memory occupies a unique column of the cellular array and designates, for a given state-machine input state (corresponding to a binary interpretation at the state-machine input lines), that memory cell number of a memory cell occupying a main diagonal location which is to have its binary contents routed to the memory cell occupying the column of said binary encoded integer.

The control memory may be implemented as a random access memory, addressed by the state-machine input lines. In such a case, each word of the random access memory is loaded with a memory econded row of the control memory array of Table 7. Alternatively, the control memory may be implemented as a programmable logic array, in which case the programmable logic array is programmed to produce the binary encoded integers of each row of the control memory array as a multi-output, combinational logic function of the state-machine input lines. This multi-output, combination logic function is to be produced as a two-level minimal gate count, AND/OR realization, as is well known in the art of programmable logic array implementation.

A step 162, the initial cellular array memory multiple locations along the main diagonal as well as for those memory cells occupying output columns. An internal state of the state-machine being implemented, Table 4, must be selected as an initial state. We assume for purposes of initial memory cell assignment that this initial state is state "a". At step 154, each memory cell of the cellular array is labelled with a prime compatible set associated with the minimal cover path, as exhibited in Exemplar 69. The prime compatible set which is used to label memory cell, the top left diagonal, memory cell number 0) is $(\wedge_1, 1_1, 0_2, 01_2)$. Each input sequence which is continued in this prime compatible set is a column header 124 of an output mapping column 120 exhibited in Exemplar 34. That row 118 of each such output mapping column corresponding to the initial state of the state-machine, state "a", (the top row) has as its entry 122 the initial value of memory cell 0. Beginning with the first input sequence of the said prime compatible set, $\wedge$ 1a, the top row entry 122 in the output mapping table having as its column header $\wedge_1$, is "0"-hence, the binary value "0" is the initial value of memory ce311 number 0. The top row entry of each output mapping column corresponding to the other input sequences of said prime compatible set must either be "0" or "—". For verification, the top row entry of the output mapping column having as its column header $1_1, 1_2$, "0", the top row entry of the output mapping column having as its column header $0_2$ is "—" and, finally, the top row entry of the output mapping column having as its column header 0/2 is "—".

For that memory cell occupying the bottom right diagonal location (memory cell number 1), its associated prime compatible set as exhibited in Exemplar 69 is $(0_1, 10_1, \wedge_2, 0/2)$. The top row entries of the output mapping columns which are headed by the input sequences contained in this prime compatible set are respectively "1", "—", "1", "—". Hence, the initial value of memory cell number 1 is "1".

The memory cell occyping the leftmost output column has an associated prime compatible set which is the same prime compatible set associated with memory cell number 0; here, the memory cell occupying the leftmost output column has an initial value which is the same initial value as memory cell 0—the initial value "0". Equivalently, the memory cell occupying the rightmost output column has an associated prime compatible set which is the same prime compatible set that is associated with that memory cell number 1; hence, the memory cell occupying the rightmost output column has an initial value which is the same initial value as memory cell number 1—the initial value "1". These initial memory cell values of the cellular array are exhibited in FIG. 9A.

A sub optimal application is described with reference to FIGS. 16 through 24 in relation to a bus arbiter system.

As a practical application of certain of the concepts exhibited in the present embodiment, a callular array implementation of a bus arbiter system is exhibited. The bus arbiter system which is exhibited is a standard memory interface for a Cuche/Memory Management Unit device and the arbitration scheme used for this practice application is prearbitration that is, arbitration occurs while the bus is being utilized, thus saving latency time between transfers. The cellular array is implemented for an arbiter to arbitrate between two bus masters and the state-machine description of this process is exhibited in FIG. 16.

There are three input lines into the statemachine, as exhibted in FIG. 16, MBRO, MBRI and MBB, which indicate, respectively, bus request for masternumber 0, bus request for masternumber 1, and bus busy. Two state-machine output functions are exhibited for the bus arbiter MBGO and MBGI which signify, repsectively, bus grant for master number 0 and bus grant for master number 1.

Each unique binary encoding at the three input lines of the state-machine constitute an input state, or input character, of the input alphabet of the state-machine—six such unique binary encodings being the final for this application. Hence, the state-machine exhibited in FIG. 16 has six input characters.

The initial step on the process of cellular array control memory encoding is to determine that state-machine having a minimal number of internal states which is equivalent (performs the identical process) to the state-machine which describes the application (that state-machine of FIG. 16. This "minimal" equivalent state-machine is exhibited in FIG. 17A and the procedure of claiming this minimal equivalent state-machine exhibited in FIG. 17A is well known in the art of state-machine theory.

Certain concepts of the present embodiment are now applied to the state-machine exhibited in FIG. 17A to obtain an efficient cellular array boundary value encoding.

Figure 18:
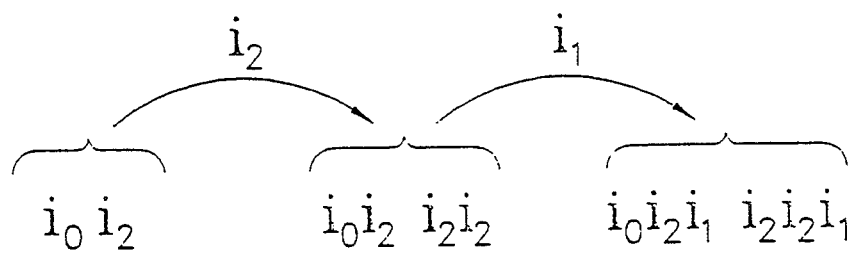
FIG. 18 are column implications for compatible pairs illustrating the antecedent pairs of sequences for each pair of sequences.
Figure 21:
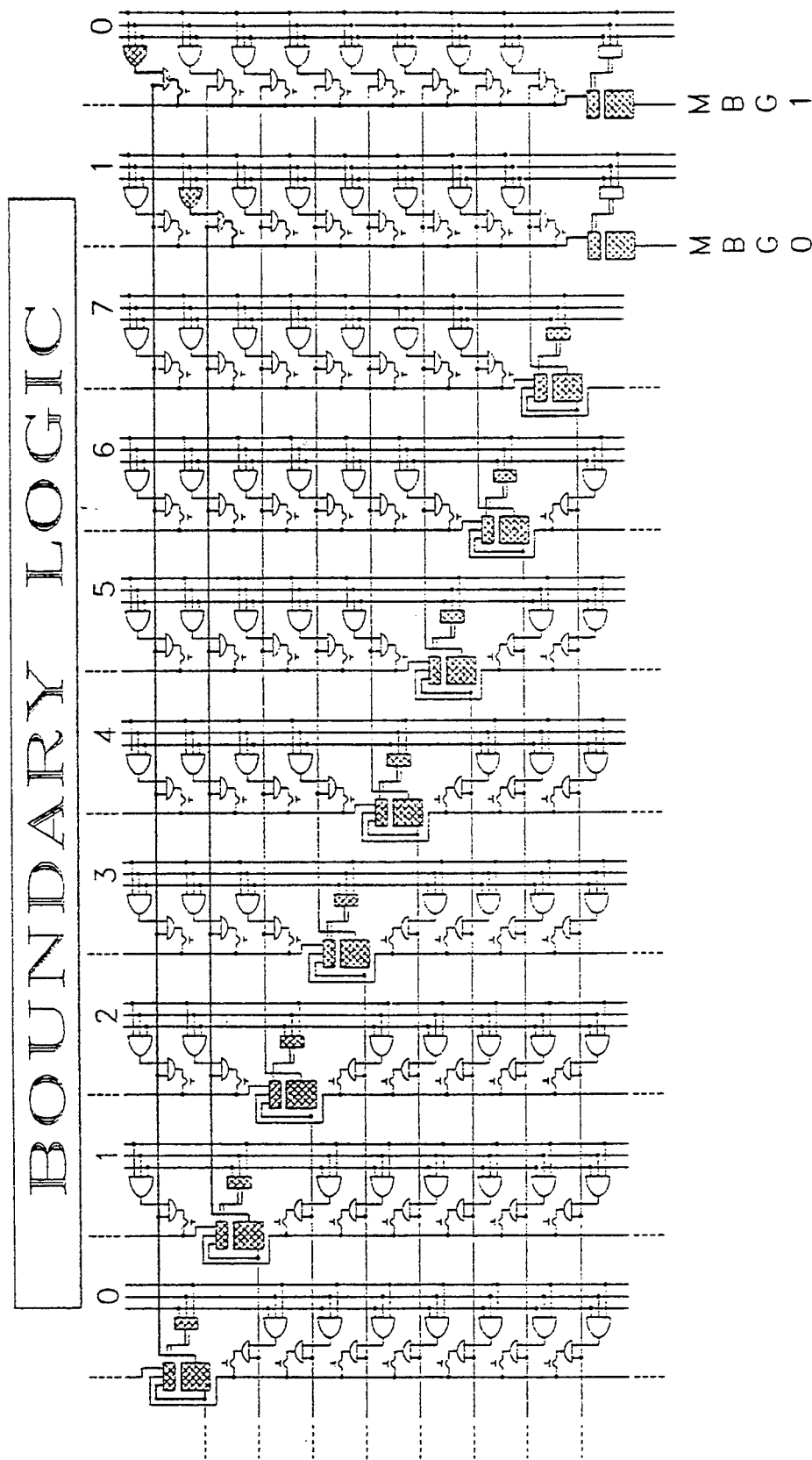
FIG. 21 is exemplary of a solution for the cellular array determined up to the implication sets for the maximal compatible sets for input states $i_0$, $i_1$.
Figure 22:
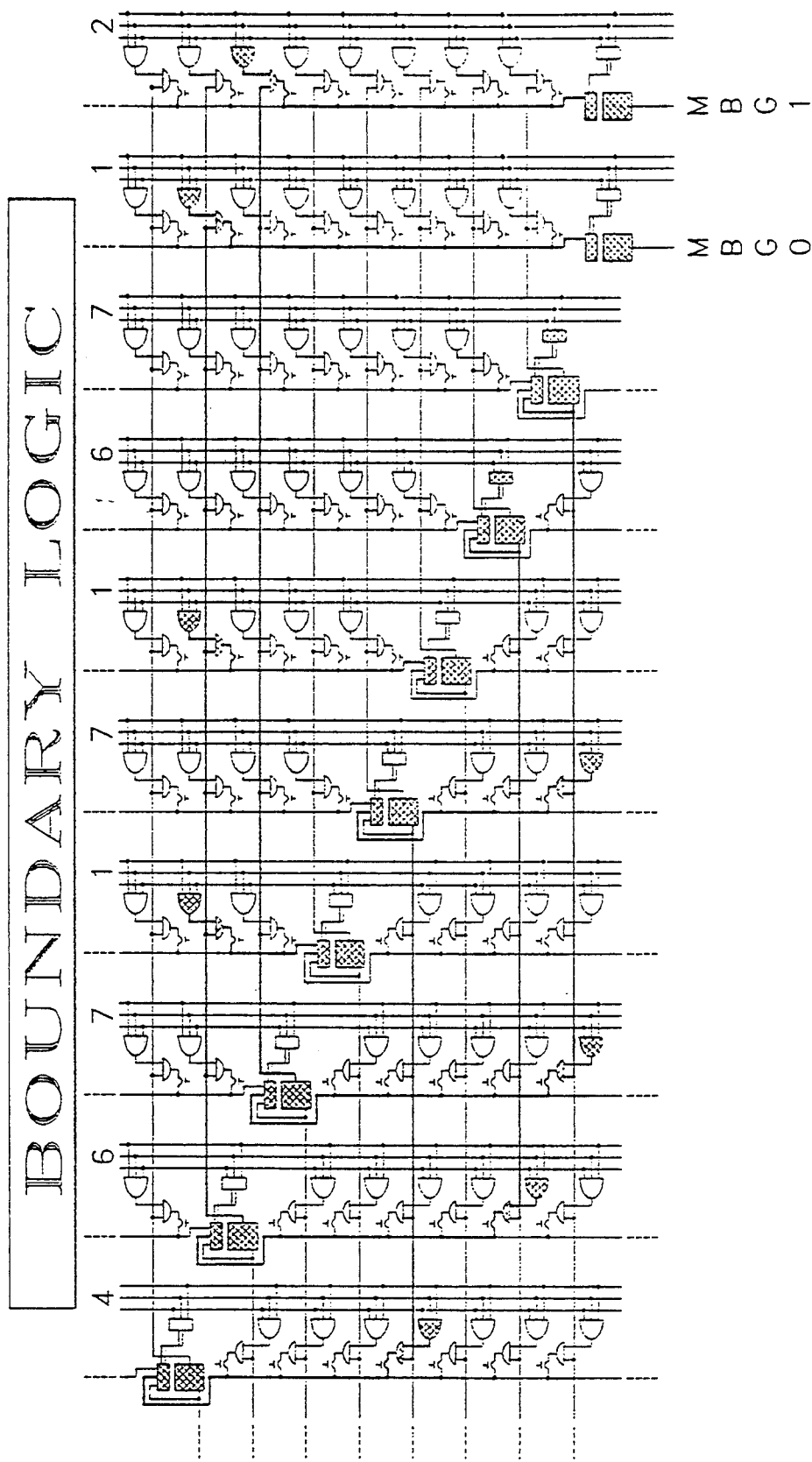
FIG. 22 is exemplary of a solution for the cellular array determined up to the implication sets for the maximal compatible sets for input states $i_2$, $i_3$.
Figure 23:
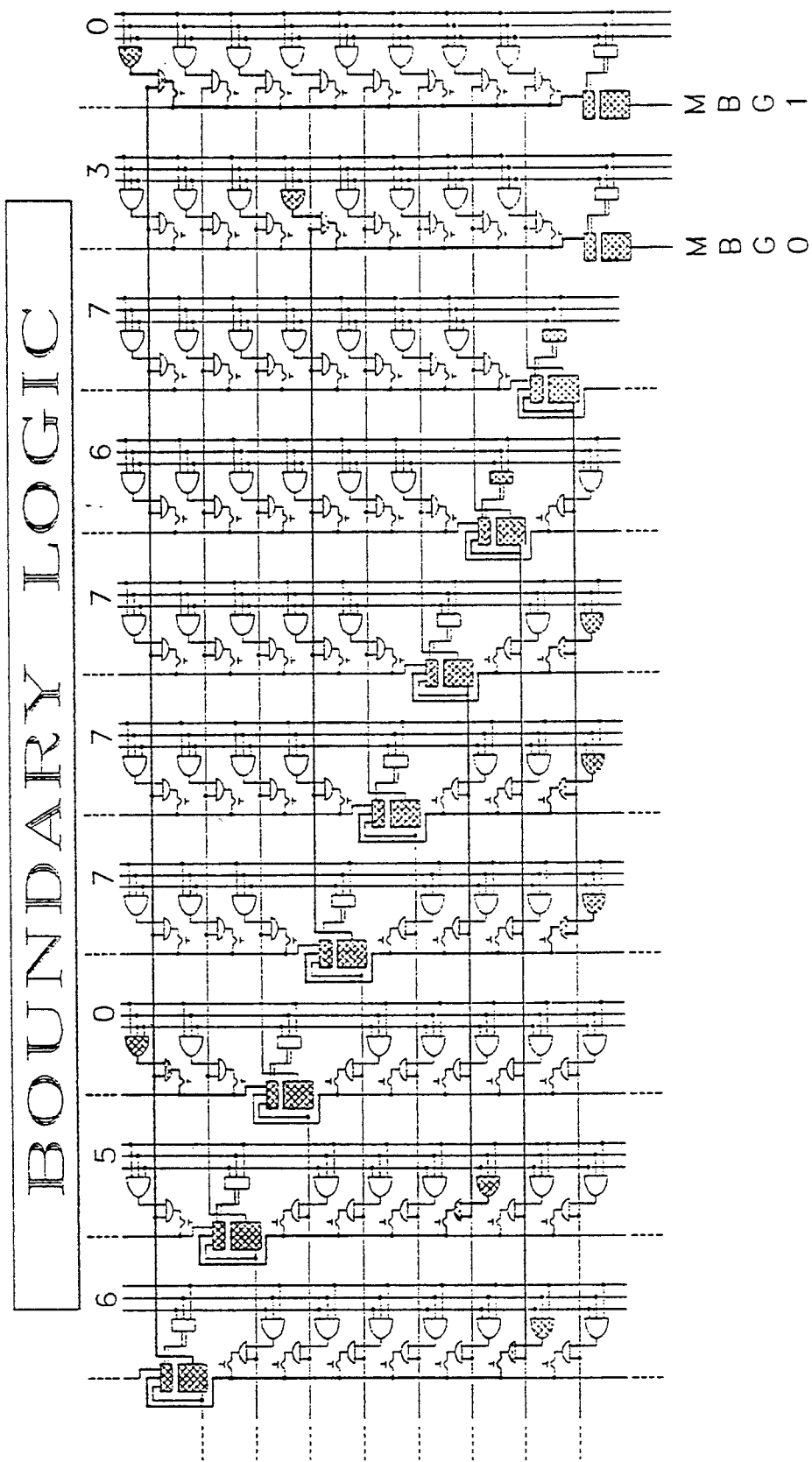
FIG. 23 is exemplary of a solution for the cellular array determined up to the implication sets for the maximal compatible sets for input states $i_4$, $i_5$.

FIG. 17B exhibits a portion of the Compilation Table 108, whereas FIGS. 17C and 17D together exhibit a portion of the output mapping tables 116. FIG. 18 exhibits the concept of a compatible pair of input sequences as well as the concept of a pair implication. FIG. 19 exhibits a portion of the pair chart 404 for this application with pair compatibles indicated and certain pair implications specified. FIG. 20 exhibits the maximal compatible sets and associated implication slots, each unique number included on a member of a maximal compatible set or implication set corresponding to a column header 124 of a unique output mapping column 120 (a column of an output mapping table which does not have equal effect on the state-machine as any other output mapping column) of an output mapping table, of which there are 57 total.

The control memory encoding for this statemachine application is a sub-opotion encoding, in that a portion of the encoding procedure of the present embodiment is used, rather than the complete encoding procedure. Certain maximal compatible sets exhibited in FIG. 20 to form an efficient closed cover implementation, rather than performing the additional steps of forming prime compatible sets, constitute minimal cover trees, and a minimal cover path. The maximal compatible sets chosen for the closed cover solution are those maximal compatible sets labelled with a unique integer in FIG. 20. Each such interger labelling (0-7) corresponds to a memory cell number of the main diagonal of memory cells. Ther are eight maximal compatible sets which form the closed cover implementation, hence there are eight memory cells occupying main diagonal locations of the cellular array for this implementation, as well as two additional output columns, one column for each state-machine output function.

Although there are six input characters of the sequential machine to be implemented, the control memory array for this application can be continued with only three unique rows, that is, three unique sets of routing designators, one set of routing designatores for a pair of input characters. These three rows of routing designators (outputs of boundary logic, or control memory) and schematic diagrams exhibiting the associated routings between memory cells occupying main diagonal locations as well as routings to the output column memory cells, are exhibited in FIGS. 21–23.

Figure 24:
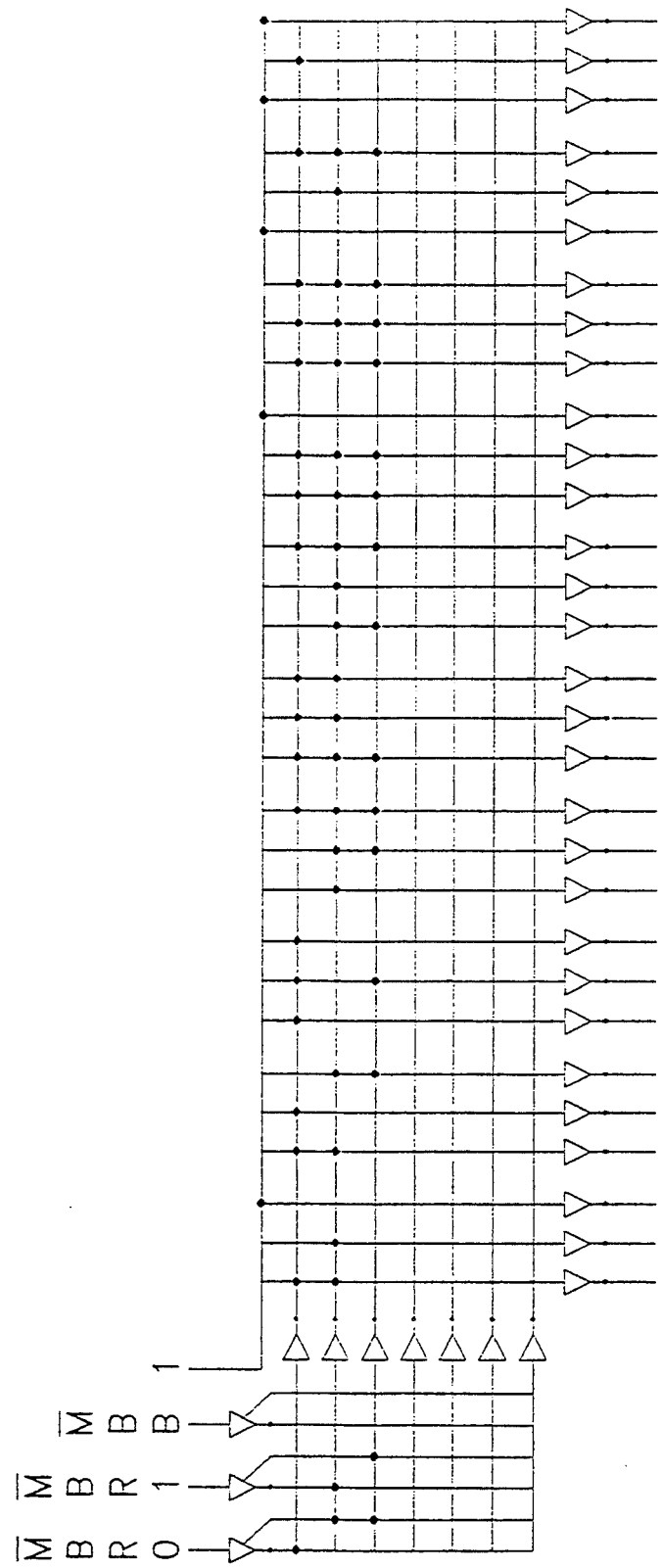
FIG. 24 is an illustration of the boundary logic applicable to the cellular array where the boundary logic is implemented as a programmable logic array.
Figure 25:
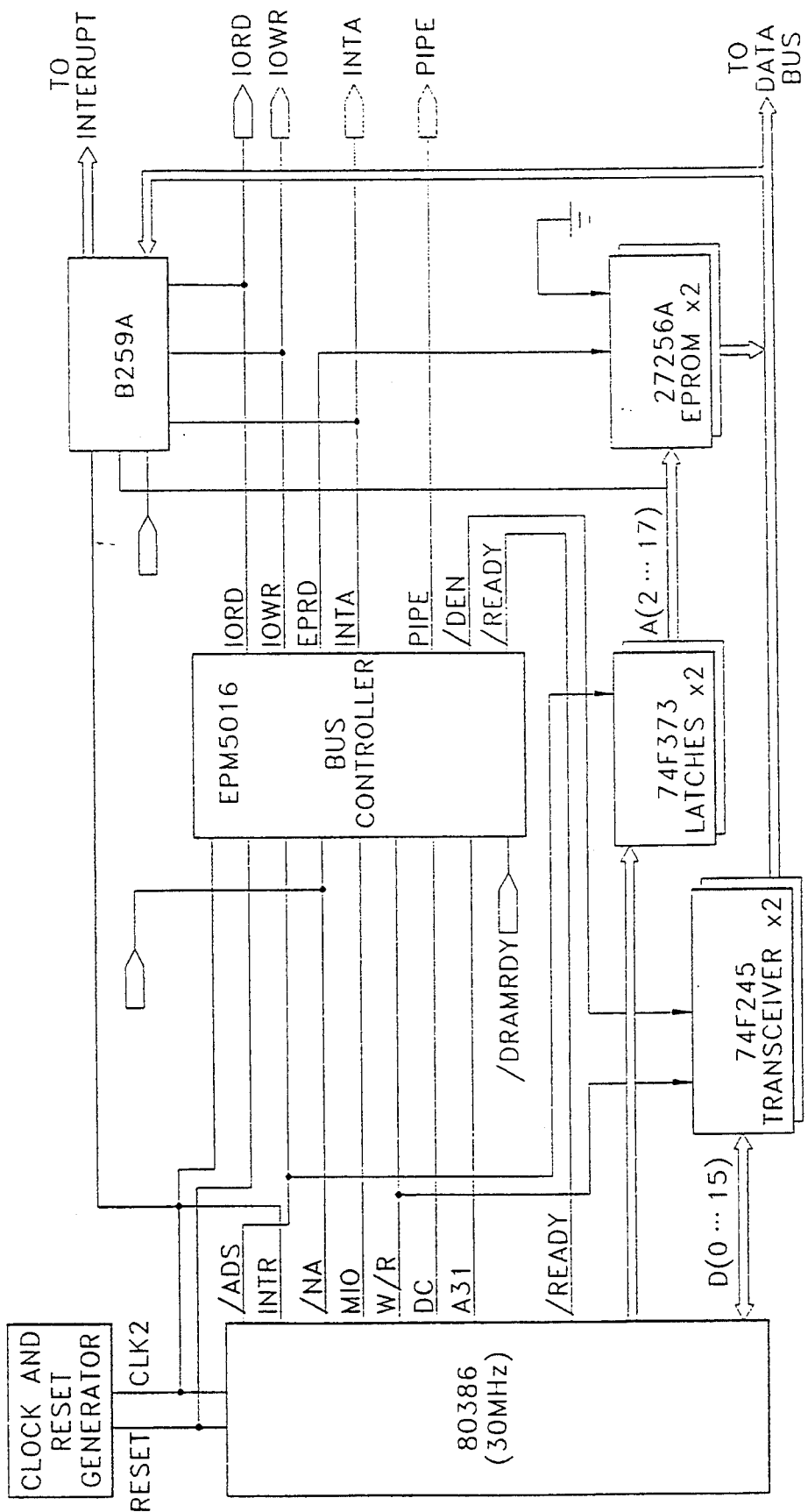
FIG. 25 is a prior art block diagram for a wide input line application exemplified by RAM or I/O controllers.

Finally, FIG. 24 exhibits the boundary logic (control memory) implemented as a programmable logic array.

Example of Cellular Array Application to a Wide Input Line Embodiment

A different format is described with regard to a wide input line embodiment in relation to FIGS. 25-72.

One type of state table application which permeates the programmable logic industry is the wide input line application, an example being an exemplary system of Altera Corporation in San Jose, California. This type of application, as exemplified by RAM or I/O controllers, consists typically of 10 or more input and output lines and is depicted by a sparse state table having a sizable number of input state columns, most entries being unspecified. For each input state column, only a few entries are typically specified.

Figure 26:
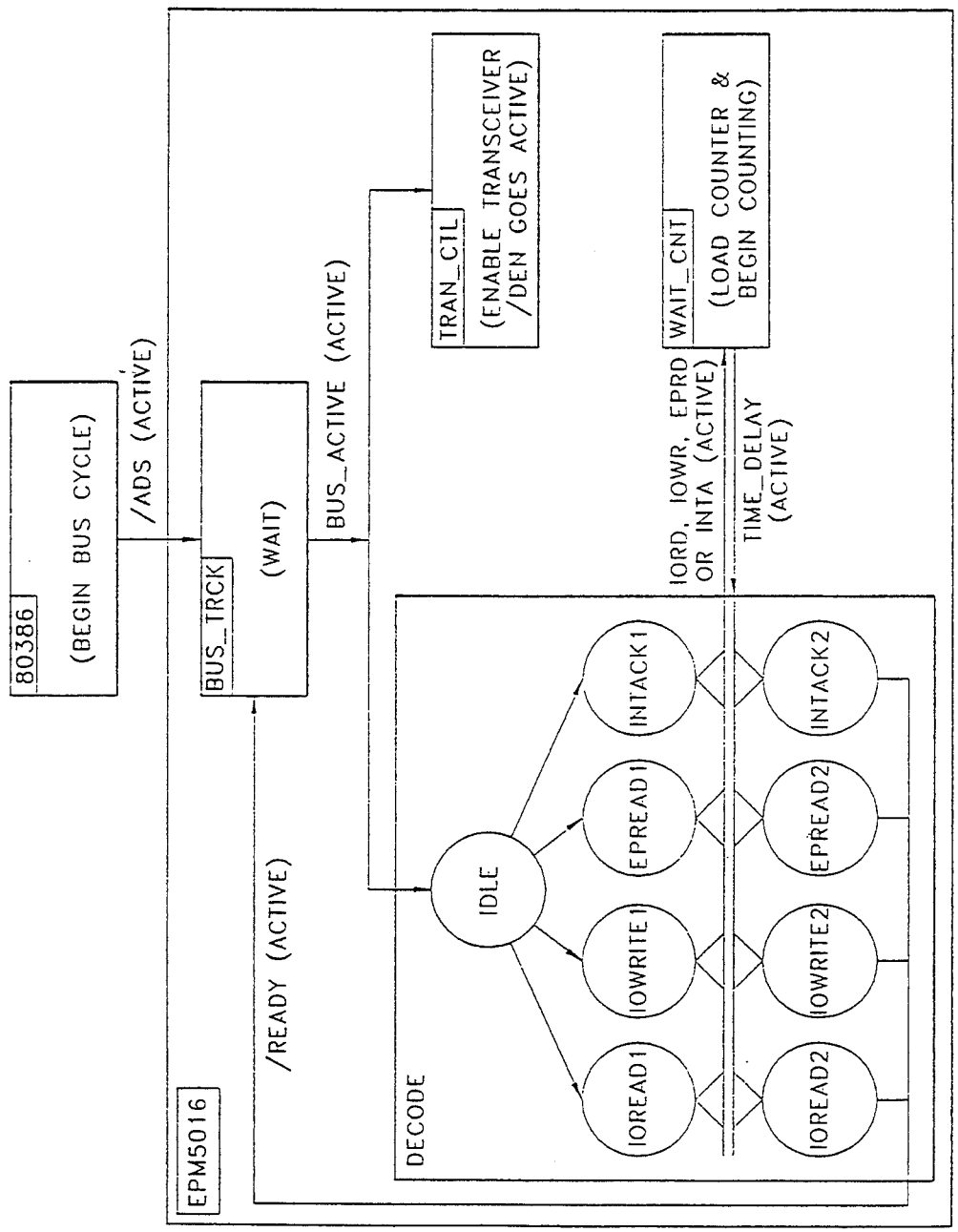
FIG. 26 is a prior art bus controller flow diagram exemplified by said RAM or I/O controller.

A third example exhibits an implementation of the prior art Altera embodiment of the present invention. The example is an 80386 Bus Controller, depicted in FIG. 25. This process is further segmented into four distinct processes, as depicted by FIG. 26. Of these four processes, three of them are simple state table applications, whereas one of them—DECODE—requires 8 input lines, 6 output lines and a reasonably complex process description as illustrated in FIG. 26a.

Figure 27:
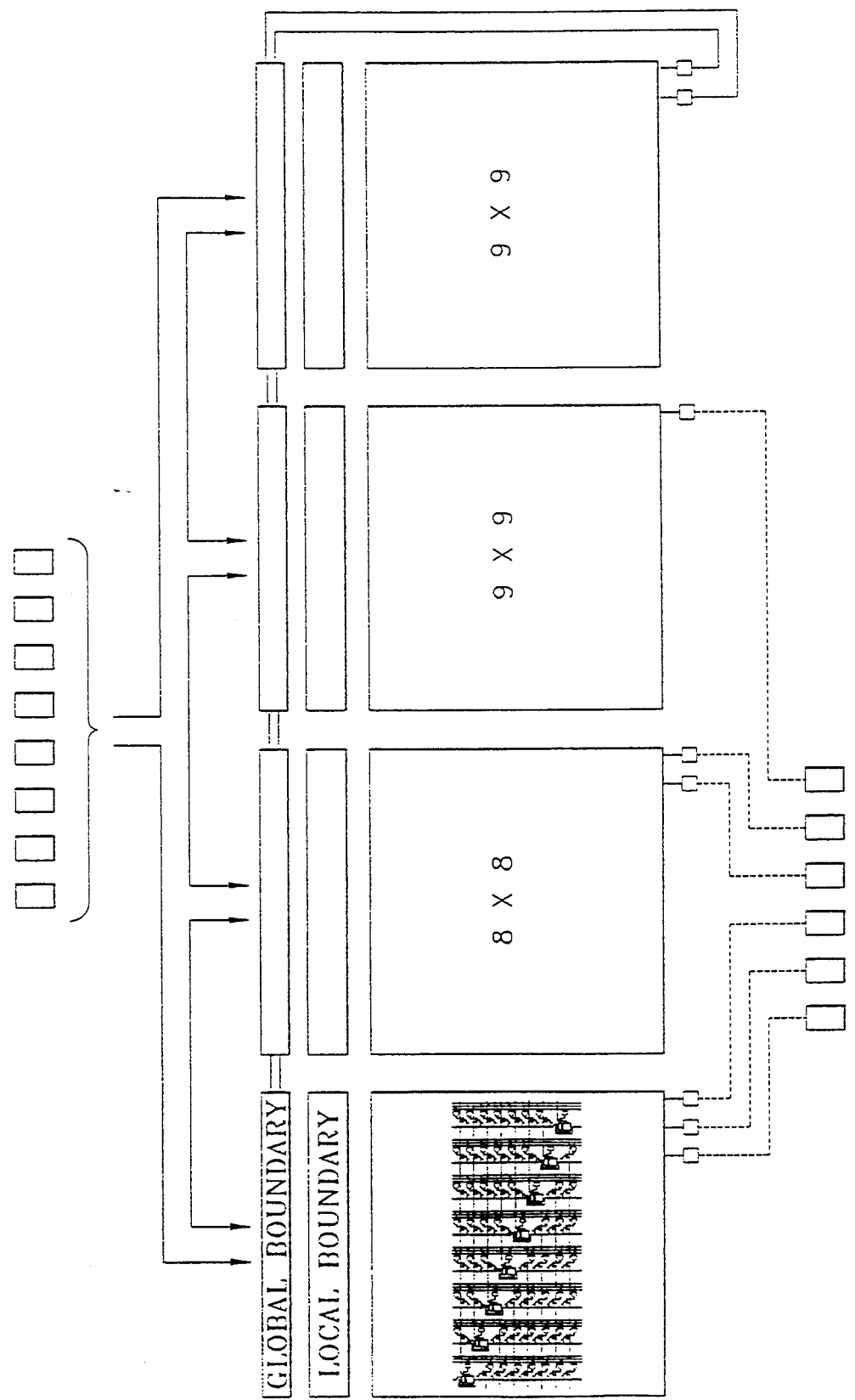
FIG. 27 is a system showing four different cellular arrays with a feedback system in accordance with the invention to implement the said prior art bus controller.
Figure 28:
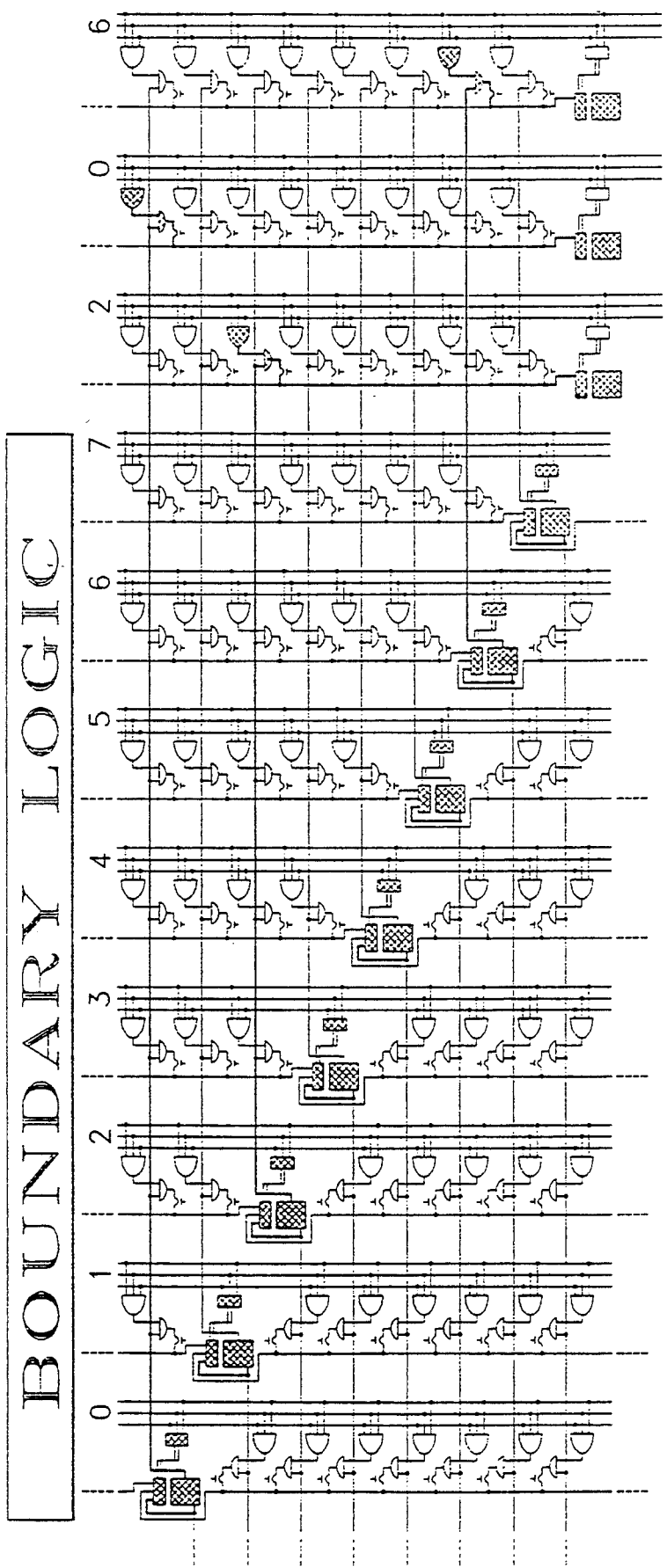
FIG. 28 shows the routings for the leftmost cellular array illustrated in FIG. 27 for the input state 00.
Figure 29:
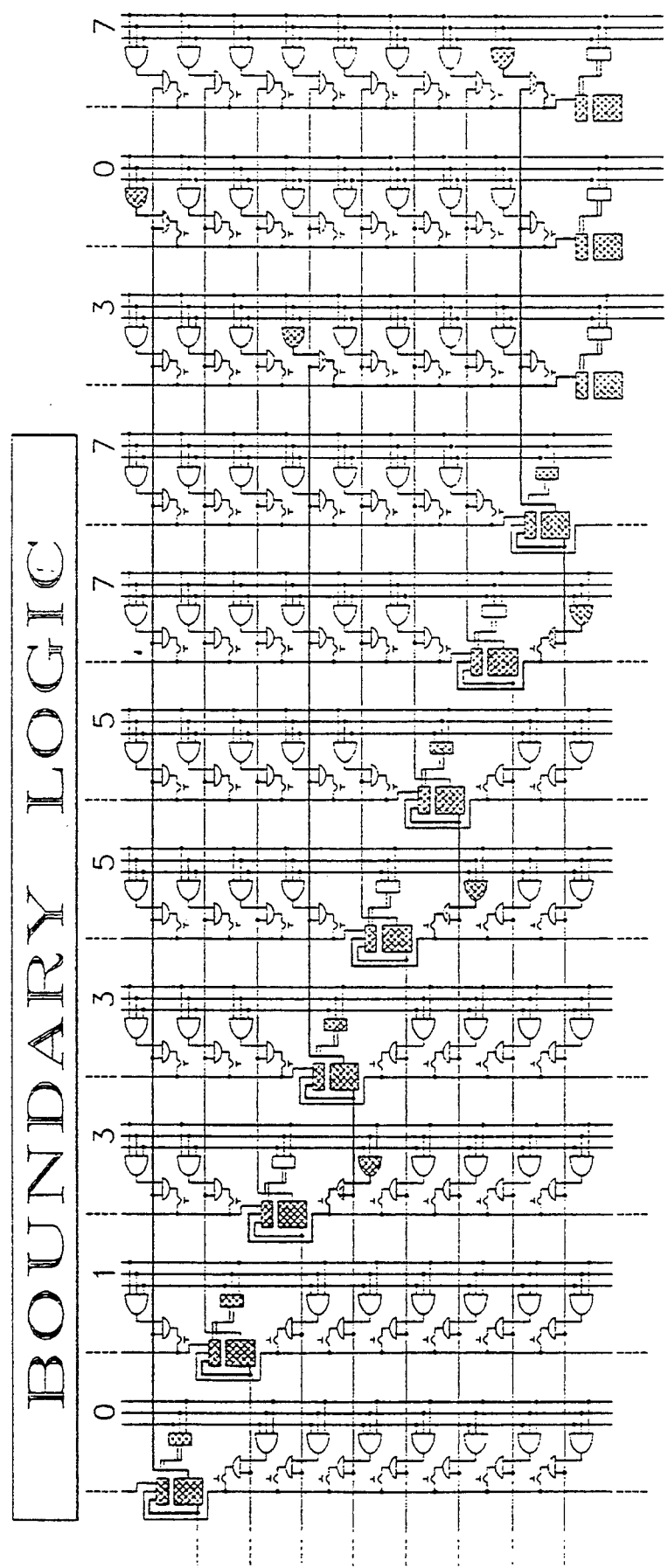
FIG. 29 shows the input state routings for the leftmost cellular array illustrated in FIG. 27 for 01.
Figure 30:
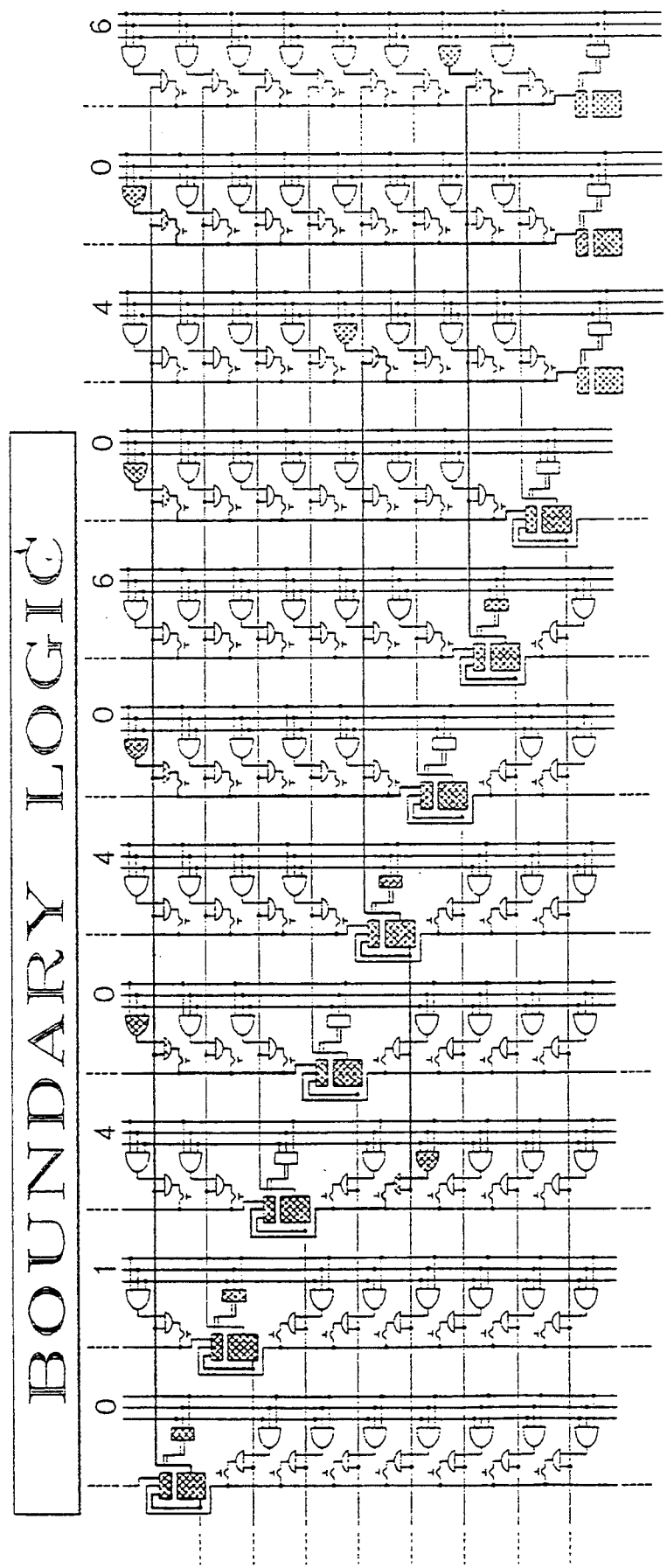
FIG. 30 shows the input state routings for the leftmost cellular array illustrated in FIG. 27 for 10.
Figure 31:
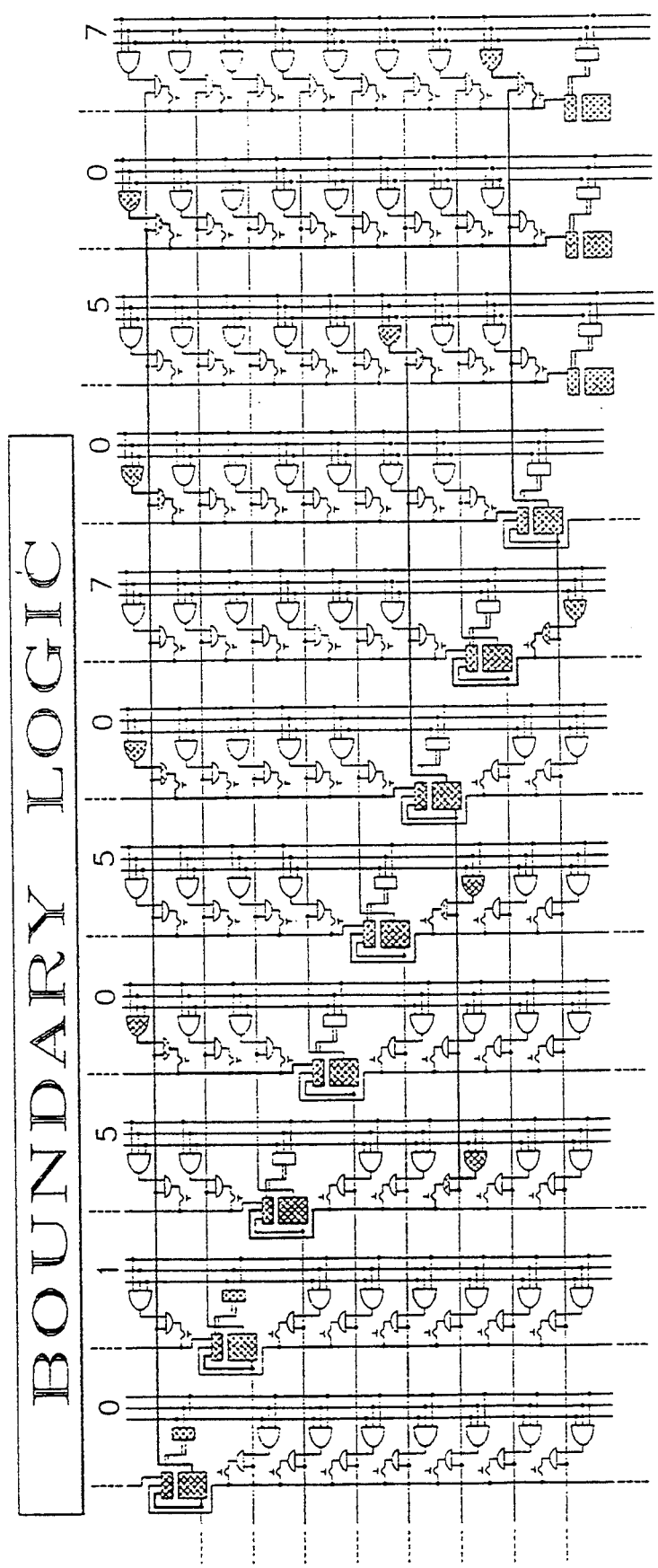
FIG. 31 shows the input state routings for the leftmost cellular array illustrated in FIG. 27 for 11.
Figure 32:
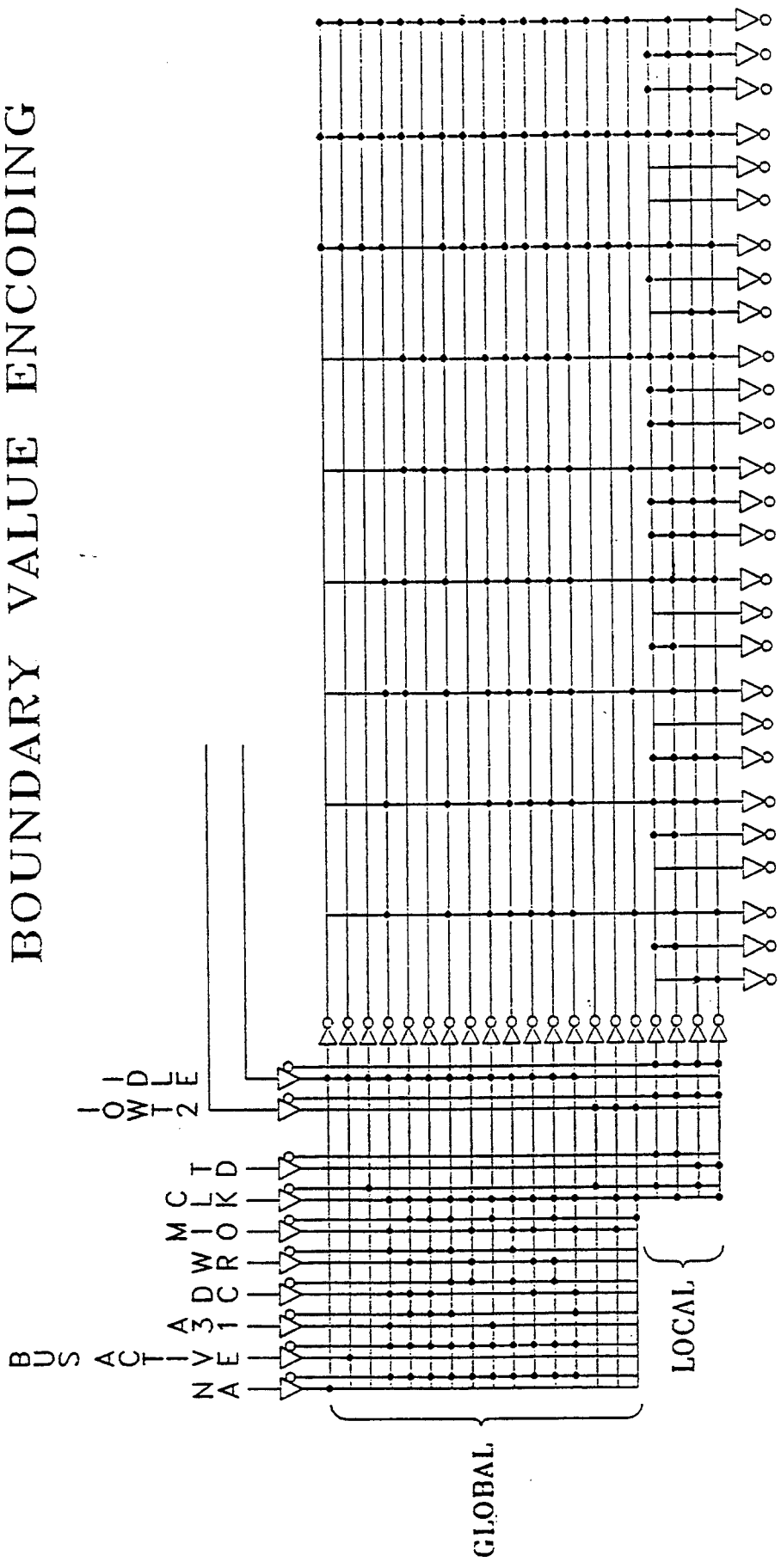
FIG. 32 is the boundary value encoding for the leftmost cellular array illustrated in FIG. 27.

The invented approach taken in implementing this wide input line application is one which maintains the positive aspects of the cellular array technology competitive propagation delay and favorable density—and one which yields an approach suitable for other wide input line, wide output line applications. The invented implementation of the DECODE device in the cellular array architecture is displayed in FIGS. 27-72. FIG. 27 exhibits a block diagram of the implementation. Four distinct "small" cellular array spaces are used to implement this application, as indicated in the figure: two 8×8 spaces and two 9×9 spaces. All four spaces operate simultaneously to produce the six output functions as well as two global feedback lines. These global feedback lines are, in turn, input data into the boundary logic block of each cellular array space.

To comprehend the approach, note in FIG. 26 the DECODE state diagram. Although it is a simplification of the actual processing, the flow of control through the various internal states is exhibited. Beginning in the "idle" state, the DECODE processor transfers to one of 4 internal states depending upon the value of 7 input lines (actually, control is passed to one of 6 internal states). Each such target internal state in the second exhibit initiates an I/O transfer. This I/O transfer is delayed by a time delay signal, after which time control is transferred to an appropriate I/O enable state. The two global feedback lines represent internal states "idle" and "iowrite2," whereas each cellular array implementation represents the computation required for the remaining portion of the state diagram on each of the six output functions as well as the computation required to compute the two global feedback lines.

As indicated in FIG. 27, three output bits are computed in the leftmost space, two output bits in the second to leftmost space, and one output bit computed in the third to leftmost space. The rightmost space computes the global feedback lines.

Each output function can be computed by its own state table implementation—hence its own cellular array implementation. The computation of most of the output functions requires such small sections of space that, in most instances, the computation of multiple output functions fit into one small cellular array.

The boundary logic block of each cellular array is further segmented into two sections—a global control section and a local control section, as exhibited in Exemplar 42. The global control section is a simplified boundary logic block requiring the encoding of only one boundary line per column whereas the local control section requires encoding the boundary value specifications for the complete space.

The global portion of each boundary logic block serves two purposes, the first purpose being the determination of which piece of the state diagram is being executed, the second purpose being which internal state is the next internal state in the process. The determination of next internal state requires the specification of a binary n-tuple for each space, i.e., a 0 or 1 for each column. This determination requires the programming of only one line per column.

The technique of using a simplified segment of each boundary logic block for global control is suitable for implementation of other wide input lines, wide output line applications as well. In the general case, the global control will determine which section of a sparse state table matrix the process is to reside in, as well as the next internal state, at the next clock pulse.

Exemplar 42 depicts the appropriate routing designations.

Clearly, the cellular array architecture is well suited to implement wide input line applications of this nature.

With the invention, a system designer does not necessarily have to custom create circuitry for performing each function. Using a systems flow approach, the end result function can be reached using the present invention under software control.

The benefits of the present invention include the creation of a simple replicable circuit design. The simplicity and uniformity of the design permits for producing chip designs of very high densities with lower reject rates and consequently, lower costs. Moreover, since there are fewer boundary values, few programming bits are required, thereby allowing a least-cost design. Further, the speed of operation is enhanced. The gate delays are independent of the functions selected and the size of the space used. The number of gate delays in a state transition is independent of the size of the cellular space.

Many other forms of the invention exist, each differing from others in matters of detail only. The invention is to be considered solely in terms of the following claims.

I claim:

1. A method of operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) locating cells in a rectilinear cellular array with multiple locations in a plurality of columns and rows, including providing locations along a main diagonal;

(b) locating in the cellular array, multiple memory cells in locations along the main diagonal, function cells in locations removed from the main diagonal for transferring information between the memory cells, and at least one column of cells for providing output values of the cellular array;

(c) generating a plurality of sequences of said input characters;

(d) applying said sequences of step (c) to a state-machine;

(e) selecting a set of binary values and unspecified assignments on internal states for substitution for each output function of the state-machine so that multiple output values and unspecified values of the cellular array in the at least one output column conforms to a predetermined set of output value functions;

(f) substituting the sets of binary values and unspecified assignments of step (e) for internal states and testing said sequences for equal effect on said internal states with said substituted sets;

assigning a distinct memory cell of the multiple memory cells of the main diagonal of step (b) to each sequence of characters found not to have equal effect in step (f) so that the memory cells collectively store information corresponding to cellular array states; and providing a control memory for controlling the transfer of information.

2. A method of operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) locating cells in a rectilinear cellular array with multiple locations in a plurality of columns and rows, including providing locations along a main diagonal;

(b) locating in the cellular array, multiple memory cells in locations along the main diagonal, function cells in locations removed from the main diagonal for transferring information between the memory cells, and at least one column of cells for providing output values of the cellular array;

(c) generating a plurality of sequences of said input characters;

(d) applying said sequences of step (c) to a state-machine;

(e) selecting a set of binary values and unspecified assignments on internal states for substitution for each output function of the state-machine so that multiple output values and unspecified values of the cellular array in the at least one output column conforms to a predetermined set of output value functions;

(f) substituting the sets of binary values and unspecified assignments of step (e) for internal states and testing said sequences for equal effect on said internal states with said substituted sets;

(g) constructing a pair chart for recording compatibility or incompatibility for each pair of sequences from those sequences found to have non-equal effect on the internal states of the state-machine in step (f), and for recording pair implications for each pair of sequences found to be compatible;

(h) determining compatibility or incompatibility for each pair of sequences from those sequences found to have non-equal effect on the internal states of the state-machine in step (f) for entry into the pair chart of step (g);

(i) determining an antecedent pair of sequences for each pair of sequences found to be compatible in step (h), from an antecedent table, and for each input character of the state-machine;

(j) determining a pair implication set of sequences for each antecedent pair of sequences determined in step (i) for entry into the pair chart of step (g);

processing the pair of compatible sets determined in step (h) and the pair implication sets of step (j) to obtain a closed cover;

assigning a distinct memory cell of the multiple memory cells of the main diagonal of step (b) to each compatible set constituting the closed cover so that the memory cells collectively store information corresponding to the cellular array states; and providing a control memory for controlling the transfer of information between memory cells.

3. A method of operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) locating cells in a rectilinear cellular array with multiple locations in a plurality of columns and rows, including providing locations along a main diagonal;

(b) locating in the cellular array, multiple memory cells in locations along the main diagonal, function cells in locations removed from the main diagonal for transferring information between the memory cells, and at least one column of cells for providing output values of the cellular array;

(c) generating a plurality of sequences of said input characters;

(d) applying said sequences of step (c) to a state-machine;

(e) selecting a set of binary values and unspecified assignments on internal states for substitution for each output function of the state-machine so that multiple output values and unspecified values of the cellular array in the at least one output column conforms to a predetermined set of output value functions;

(f) substituting the sets of binary values and unspecified assignments of step (e) for internal states and testing said sequences for equal effect on said internal states with said substituted sets;

(g) constructing a pair chart for recording compatibility or incompatibility for each pair of sequences from those sequences found to have non-equal effect on the internal states of the state-machine in step (f), and for recording pair implications for each pair of sequences found to be compatible;

(h) determining compatibility or incompatibility for each pair of sequences from those sequences found to have non-equal effect on the internal states of the state-machine in step (f) for entry into the pair chart of step (g);

(i) determining an antecedent pair of sequences for each pair of sequences found to be compatible in step (h), from an antecedent table, and for each input character of the state-machine;

(j) determining a pair implication set of sequences for each antecedent pair of sequences determined in step (i) for entry into the pair chart of step (g);

(k) deriving maximal compatible sets of sequences from the pair chart of step (g) completed to exhibit compatibility or incompatibility of each pair of sequences as determined at step (h);

(l) deriving an implication set of sequences for each maximal compatible set of sequences determined at step (k) and for each input character of the state-machine from the pair chart of step (g) completed to exhibit the pair implications determined at step (j);

processing the maximal compatible sets of input sequences derived in step (k) and the implication sets of sequences derived in step (l) to form a closed cover;

assigning a distinct memory cell of the multiple memory cells of the main diagonal of step (b) to each maximal compatible set that constitutes the closed cover so that the memory cells collectively store information corresponding to the cellular array states; and providing a control memory for controlling the transfer of information between memory cells.

4. A method as claimed in claim 3 wherein step (l) includes creating, for the compatible set, and for each input character of the state table, a set of input sequences which contain and which is limited to each implication pair of sequences for each compatible pair of sequences contained in the compatible set, under said input character;

If the implication set of input sequences so determined is a subset of the said compatible set, then the implication set of input sequences so determined is replaced by the null set.

5. A method of operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) locating cells in a rectilinear cellular array with multiple locations in a plurality of columns and rows, including providing locations along a main diagonal;

(b) locating in the cellular array, multiple memory cells in locations along the main diagonal, function cells in locations removed from the main diagonal for transferring information between the memory cells, and at least one column of cells for providing output values of the cellular array;

(c) generating a plurality of sequences of said input characters;

(d) applying said sequences of step (c) to a state-machine;

(e) selecting a set of binary values and unspecified assignments on internal states for substitution for each output function of the state-machine so that multiple output values and unspecified values of the cellular array in the at least one output column conforms to a predetermined set of output value functions;

(f) substituting the sets of binary values and unspecified assignments of step (e) for internal states and testing said sequences for equal effect on said internal states with said substituted sets;

(g) constructing a pair chart for recording compatibility or incompatibility for each pair of sequences from those sequences found to have non-equal effect on the internal states of the state-machine in step (f), and for recording pair implications for each pair of sequences found to be compatible;

(h) determining compatibility or incompatibility for each pair of sequences from those sequences found to have non-equal effect on the internal states of the state-machine in step (f) for entry into the pair chart of step (g);

(i) determining an antecedent pair of sequences for each pair of sequences found to be compatible in step (h), from an antecedent table, and for each input character of the state-machine;

(j) determining a pair implication set of sequences for each antecedent pair of sequences determined in step (i) for entry into the pair chart of step (g);

(k) deriving maximal compatible sets of sequences from the pair chart of step (g) completed to exhibit compatibility or incompatibility of each pair of sequences as determined at step (h);

(m) deriving prime compatible sets of sequences including, for each prime compatible set of sequences and input character of the state-machine input alphabet, an implication set of sequences, from the maximal compatible sets of sequences determined at step (k) and from the pair chart of step (g) completed to exhibit the pair implications determined at step (j);

(n) deriving a set of candidate cover trees containing a cover path having a least number of nodes, wherein each node of the set of candidate trees corresponds to a prime compatible set of sequences determined at step (m);

(o) assigning a distinct memory cell of the multiple memory cells of the main diagonal of step (b) to each node of the minimal cover path determined at step (n) and assigning a unique output column of step (b) to each output function of the state-machine; and (p) providing a control memory for controlling the transfer of information between memory cells.

6. A method as claimed in claim 5, wherein step (c) includes:

(q) generating a null sequence and making said null sequence the prior active sequence;

(r) distinguishing said prior active sequence for each unique state-machine output function and making such distinguished prior active sequence active;

(s) selecting an input character from said input alphabet and appending said input character to a prior active sequence to make a new sequence;

(t) distinguishing said new sequence for each state-machine output function which distinguishes said prior active sequence;

(u) making each said distinguished new sequence active as long as said distinguished new sequence does not have equal effect, with a substituted set of binary values determined by the distinguishing output function, on the set of machine states of the state-machine, including unspecified entries, as a previously generated distinguished prior active sequence; and making said new sequence active if at least one said distinguished new sequence is made active;

(v) assigning a distinguished antecedent sequence to each such distinguished prior active sequence, this distinguished antecedent sequence consisting of said new sequence distinguished by the identical output function as the distinguished prior active sequence if the distinguished new sequence is declared active, or if the distinguished new sequence is not declared active, making the distinguished prior active sequence which has equal effect the antecedent sequence;

(w) repeating steps (s) through (v) until said input alphabet is exhausted;

(x) making the prior active sequence to which input characters had been appended in steps (s) through (w) inactive, making each active distinguished new sequence an active distinguished prior sequence, and making each active new sequence an active prior sequence; and (y) repeating steps (s) through (x) until all active sequences have been made inactive.

7. A method as claimed in claim 5 wherein step (d) is applied in reverse order of input characters to said state-machine.

8. A method as claimed in claim 6 wherein step (d) is applied in a reverse order of input characters to said state-machine.

9. A method as claimed in claim 5 wherein sequences of input characters are applied in character reverse order so that a pair of sequences have equal effect when both sequences comprising the pair result in a state-machine having identical final state-machine states in step (f), including identical locations of unspecified entries.

10. A method as claimed in any one of claims 2 to 5 wherein the pair chart of step (g) is constructed to include a unique entry point indexed by each pair of sequences found to have non-equal effect on the internal states of the state-machine at step (f).

11. A method as claimed in any one of claims 2 to 5 wherein incompatibility of a pair of sequences at step (h) is determined by both such sequences being completely specified for at least one state-machine state at step (f), the specification of that state-machine state for one sequence of the pair being a different value than the specification of that state-machine state for the other sequence of the pair.

12. A method as claimed in any one of claims 2 to 5 wherein compatibility of two sequences at step (h) is determined by the two sequences not being incompatible for all final state-machine state specifications at step (f).

13. A method as claimed in any one of claims 2 to 5 wherein an antecedent pair of sequences is determined from a compatible pair of sequences at step (i) by including in the antecedent pair of sequences the antecedent sequence from the antecedent table of each input sequence which constitutes the compatible pair of sequences.

14. A method as claimed in any one of claims 2 to 5 wherein a pair implication set of sequences at step (j) is determined from an antecedent pair of sequences by having the antecedent pair of sequences become the pair implication set of sequences, except where:

(i) both antecedent input sequences (under a particular input state) are the same input sequence, then the pair implication set becomes only the single input sequence;

(ii) one of the antecedent input sequences (under a particular input state) has the effect of an unspecified entry on all state-machine states at step (f), then the pair implication set becomes just the single entry which is the other input sequence of the antecedent pair;

(iii) both of the antecedent input sequences (under a particular input state) has the effect of an-unspecified entry on all state-machine states at step (f), then the pair implication set becomes the null set;

(iv) both of the antecedent input sequences (under a particular input state) are contained as a subset of the compatible pair, then the pair implication set becomes the null set.

15. A method as claimed in either claim 3 or 5 wherein step (k) includes creating compatible sets of input sequences constrained by the characteristic that no compatible superset of input sequences contains the said maximal compatible set as a proper subset.

16. A method as claimed in claim 5 wherein step (m) includes creating, from the maximal compatible sets of input sequences, compatible sets of sequences, each such compatible set of sequences being a subset of a maximal compatible set, and, for each such subset of a maximal compatible set and input character, its implication set, this said subset of a maximal compatible set and associated implicating set being constrained so that there is no superset of compatible input sequences satisfying the following two conditions:

(i) the superset of compatible input sequences contains the said compatible set as a proper subset;

(ii) each implication set associated with the superset of compatible input sequences is contained as a subset (not necessarily a proper subset), of at least one implication set of the said compatible set.

17. A method as claimed in any one of claims 2 to 5 wherein step (n) includes creating a set or candidate trees, each such candidate tree consisting of nodes and branches connecting nodes, each node corresponding to a compatible set (a prime compatible set and for claim 4) and determining a path from the set of candidate trees having the characteristics that:

(i) (cover) each in put sequence having non-equal effect at step (f) is contained in at least one compatible set corresponding to a node of the path;

(ii) (closure) each implication set each compatible set corresponding to a node of the path is contained as a subset of at least one other compatible set corresponding to a node of the path;

(iii) (least length) any other path from the set of candidate trees having characteristics (cover) and (ii) (closure) has at least as many nodes as the said determined path.

18. A method as claimed in claim 5 wherein step (o) includes:

(z) associating a unique prime compatible set of the least length path with each memory cell located along the main diagonal of the cellular array, thereby relating number of the memory cells along the main diagonal to be used in the implementation to be the number of nodes in the least length path and (aa) assigning a unique output column of the cellular array to each output function of the multiple output functions contained in the state-machine and, for each memory cell occupying an output column, assigning a prime compatible set of the cover tree which contains a null sequence distinguished by the output function supported by that output column.

19. A method as claimed in claim 5 wherein step (p) includes configuring a control memory or programmable logic array which performs a Boolean function mapping of input states of the state-machine to binary encoded routing designators, one such binary encoded routing designator for each column of the cellular array, each routing designator having the characteristic that its binary encoded integer, specified as a Boolean function of said state-machine input states, designates that memory cell on the main diagonal corresponding to the compatible set which contains as a subset the implication set of the compatible set associated with the memory cell occupying the column of said routing designator under said input state.

20. A method as claimed in anyone of claims 2 to 5 wherein steps (n) through (p) includes:
determining the least number of cells of the cellular array of the main diagonal which are assigned compatible sets of input sequences having the characteristics of closure and cover.

21. A method of operating a computing element to compile a set of state-machine states in a completely specified state-machine having an input alphabet and internal states and at least two output functions, said state-machine having present internal states and next internal states, said input alphabet having a plurality of input characters, into a set of cellular array states comprising:

(a) locating cells in a rectilinear cellular array with multiple locations in a plurality of columns and rows, including providing locations along a main diagonal;

(b) locating in the cellular array, multiple memory cells in locations along the main diagonal, function cells in locations removed from the main diagonal for transferring information between the memory cells, and at least two columns of cells for providing an output values of the cellular array;

(c) generating a plurality of sequences of said input characters;

(d) applying said sequences of step (c) to a state-machine and testing said sequences for equal effect, on the internal states when said sequences are applied to said state-machine;

(e) selecting a set of binary values for substitution for each output function of the state-machine so that multiple output values of the cellular array in the at least two output columns conform to a predetermined set of output value functions;

(f) substituting the sets of binary values for internal states and testing said sequences for equal effect on said internal states with said substituted sets;

assigning a distinct memory cell of the multiple memory cells of the main diagonal of step (b) to each sequence of characters found not to have equal effect in step (f) so that the memory cells collectively store information corresponding to collector array states; and providing a control memory for controlling the transfer of information.

22. Apparatus for operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) means for locating cells in a rectilinear cellular array with multiple locations in a plurality of columns and rows, including providing locations along a main diagonal;

(b) means for locating in the cellular array, multiple memory cells in locations along the main diagonal, function cells in locations removed from the main diagonal for transferring information between the memory cells, and at least one column of cells for providing output values of the cellular array;

(c) means for generating a plurality of sequences of said input characters;

(d) means for applying said sequences of (c) to a state-machine;

(e) means for selecting a set of binary values and unspecified assignments on internal states for substitution for each output function of the state-machine so that multiple output values and unspecified values of the cellular array in the at least one output column conforms to a predetermined set of output value functions;

(f) means for substituting the sets of binary values and unspecified assignments of (e) for internal states and testing said sequences for equal effect on said internal states with said substituted sets;

means for assigning a distinct memory cell of the multiple memory cells of the main diagonal of (b) to each sequence of characters found not to have equal effect in (f) so that the memory cells collectively store information corresponding to cellular array states; and means for providing a control memory for controlling the transfer of information.

23. Apparatus for operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) means for locating cells in a rectilinear cellular array with multiple locations in a plurality of columns and rows, including providing locations along a main diagonal;

(b) means for locating in the cellular array, multiple memory cells in locations along the main diagonal, function cells in locations removed from the main diagonal for transferring information between the memory cells, and at least one column of cells for providing output values of the cellular array;

(c) means for generating a plurality of sequences of said input characters;

(d) means for applying said sequences of (c) to a state-machine;

(e) means for selecting a set of binary values and unspecified assignments on internal states for substitution for each output function of the state-machine so that multiple output values and unspecified values of the cellular array in the at least one output column conforms to a predetermined set of output value functions;

(f) means for substituting the sets of binary values and unspecified assignments of (e) for internal states and testing said sequences for equal effect on said internal states with said substituted sets;

(g) means for constructing a pair chart for recording compatibility or incompatibility for each pair of sequences from those sequences found to have non-equal effect on the internal states of the state-machine in (f), and for recording pair implications for each pair of sequences found to be compatible;

(h) means for determining compatibility or incompatibility for each pair of sequences from those sequences found to have non-equal effect on the internal states of the state-machine in (f) for entry into the pair chart of (g);

(i) means for determining an antecedent pair of sequences for each pair of sequences found to be compatible in (h), from an antecedent table, and for each input character of the state-machine;

(j) means for determining a pair implication set of sequences for each antecedent pair of sequences determined in (i) for entry into the pair chart of (g);

means for processing the pair of compatible sets determined in (h) and the pair implication sets of (j) to obtain a closed cover;

means for assigning a distinct memory cell of the multiple memory cells of the main diagonal of (b) to each compatible set constituting the closed cover so that the memory cells collectively store information corresponding to the cellular array states; and means for providing a control memory for controlling the transfer of information between memory cells.

24. Apparatus for operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) means for locating cells in a rectilinear cellular array with multiple locations in a plurality of columns and rows, including providing locations along a main diagonal;

(b) means for locating in the cellular array, multiple memory cells in locations along the main diagonal, function cells in locations removed from the main diagonal for transferring information between the memory cells, and at least one column of cells for providing output values of the cellular array;

(c) means for generating a plurality of sequences of said input characters;

(d) means for applying said sequences of (c) to a state-machine;

(e) means for selecting a set of binary values and unspecified assignments on internal states for substitution for each output function of the state-machine so that multiple output values and unspecified values of the cellular array in the at least one output column conforms to a predetermined set of output value functions;

(f) means for substituting the sets of binary values and unspecified assignments of (e) for internal states and testing said sequences for equal effect on said internal states with said substituted sets;

(g) means for constructing a pair chart for recording compatibility or incompatibility for each pair of sequences from those sequences found to have non-equal effect on the internal states of the state-machine in (f), and for recording pair implications for each pair of sequences found to be compatible;

(h) means for determining compatibility or incompatibility for each pair of sequences from those sequences found to have non-equal effect on the internal states of the state-machine in (f) for entry into the pair chart of (g);

(i) means for determining an antecedent pair of sequences for each pair of sequences found to be compatible in (h), from an antecedent table, and for each input character of the state-machine;

(j) means for determining a pair implication set of sequences for each antecedent pair of sequences determined in (i) for entry into the pair chart of (g);

(k) means for deriving maximal compatible sets of sequences from the pair chart of (g) completed to exhibit compatibility or incompatibility of each pair of sequences as determined at (h);

(l) means for deriving an implication set of sequences for each maximal compatible set of sequences determined at (k) and for each input character of the state-machine from the pair chart of (g) completed to exhibit the pair implications determined at (j);

means for processing the maximal compatible sets of input sequences derived in (k) and the implication sets of sequences derived in (l) to form a closed cover;

means for assigning a distinct memory cell of the multiple memory cells of the main diagonal of (b) to each maximal compatible set that constitutes the closed cover so that the memory cells collectively store information corresponding to the cellular array states; and means for providing a control memory for controlling the transfer of information between memory cells.

25. Apparatus for operating a computing element to compile a set of state-machine states in an incompletely specified state-machine having an input alphabet and internal states and at least one output function, said state-machine having present internal states and next internal states, and having the characteristic that at least some of the next internal state entries are unspecified, said input alphabet having a plurality of input characters, said at least one output function having the characteristic that at least some of the output value entries are unspecified, into a set of cellular array states comprising:

(a) means for locating cells in a rectilinear cellular array with multiple locations in a plurality of columns and rows, including providing locations along a main diagonal;

(b) means for locating in the cellular array, multiple memory cells in locations along the main diagonal, function cells in locations removed from the main diagonal for transferring information between the memory cells, and at least one column of cells for providing output values of the cellular array;

(c) means for generating a plurality of sequences of said input characters;

(d) means for applying said sequences of (c) to a state-machine;

(e) means for selecting a set of binary values and unspecified assignments on internal states for substitution for each output function of the state-machine so that multiple output values and unspecified values of the cellular array in the at least one output column conforms to a predetermined set of output value functions;

(f) means for substituting the sets of binary values and unspecified assignments of (e) for internal states and testing said sequences for equal effect on said internal states with said substituted sets;

(g) means for constructing a pair chart for recording compatibility or incompatibility for each pair of sequences from those sequences found to have non-equal effect on the internal states of the state-machine in (f), and for recording pair implications for each pair of sequences found to be compatible;

(h) means for determining compatibility or incompatibility for each pair of sequences from those sequences found to have non-equal effect on the internal states of the state-machine in (f) for entry into the pair chart of (g);

(i) means for determining an antecedent pair of sequences for each pair of sequences found to be compatible in (h), from an antecedent table, and for each input character of the state-machine;

(j) means for determining a pair implication set of sequences for each antecedent pair of sequences determined in (i) for entry into the pair chart of (g);

(k) means for deriving maximal compatible sets of sequences from the pair chart of (g) completed to exhibit compatibility or incompatibility of each pair of sequences as determined at (h);

(m) means for deriving prime compatible sets of sequences including, for each prime compatible set of sequences and input character of the state-machine input alphabet, an implication set of sequences, from the maximal compatible sets of sequences determined at (k) and from the pair chart of (g) completed to exhibit the pair implications determined at (j);

(n) means for deriving a set of candidate cover trees containing a cover path having a least number of nodes, wherein each node of the set of candidate trees corresponds to a prime compatible set of sequences determined at (m);

(o) means for assigning a distinct memory cell of the multiple memory cells of the main diagonal of (b) to each node of the minimal cover path determined at (n) and assigning a unique output column of (b) to each output function of the state-machine; and (p) means for providing a control memory for controlling the transfer of information between memory cells.

26. Apparatus as claimed in claim 25, wherein (c) includes:

(q) means for generating a null sequence and making said null sequence the prior active sequence;

(r) means for distinguishing said prior active sequence for each unique state-machine output function and making such distinguished prior active sequence active;

(s) means for selecting an input character from said input alphabet and appending said input character to a prior active sequence to make a new sequence;

(t) means for distinguishing said new sequence for each state-machine output function which distinguishes said prior active sequence;

(u) means for making each said distinguished new sequence active as long as said distinguished new sequence does not have equal effect, with a substituted set of binary values determined by the distinguishing output function, on the set of machine states of the state-machine, including unspecified entries, as a previously generated distinguished prior active sequence; and making said new sequence active if at least one said distinguished new sequence is made active;

(v) means for assigning a distinguished antecedent sequence to each such distinguished prior active sequence, this distinguished antecedent sequence consisting of said new sequence distinguished by the identical output function as the distinguished prior active sequence if the distinguished new sequence is declared active, or, if the distinguished new sequence is not declared active, making the distinguished prior active sequence which has equal effect the antecedent sequence;

(w) means for repeating (s) through (v) until said input alphabet is exhausted;

(x) means for making the prior active sequence to which input characters had been appended in (s) through (w) inactive, making each active distinguished new sequence an active distinguished prior sequence, and making each active new sequence an active prior sequence; and (y) means for repeating (s) through (x) until all active sequences have been made inactive.

27. Apparatus as claimed in claim 26 wherein (d) is applied in a reverse order of input characters to said state-machine.

28. Apparatus as claimed in claim 25 wherein (d) is applied in reverse order of input characters to said state-machine.

29. Apparatus as claimed in claim 25 wherein sequences of input characters are applied in character reverse order so that a pair of sequences have equal effect when both sequences comprising the pair result in a state-machine having identical final state-machine.

30. Apparatus as claimed in any one of claims 23 to 25 wherein the pair chart of (g) is constructed to include a unique entry point indexed by each pair of sequences found to have non-equal effect on the internal states of the state-machine at (f).

31. Apparatus for operating a computing element to compile a set of state-machine states in a completely specified state-machine having an input alphabet and internal states and at least two output functions, said state-machine having present internal states and next internal states, said input alphabet having a plurality of input characters, into a set of cellular array states comprising:

(a) means for locating cells in a rectilinear cellular array with multiple locations in a plurality of columns and rows, including providing locations along a main diagonal;

(b) means for locating in the cellular array, multiple memory cells in locations along the main diagonal, function cells in locations removed from the main diagonal for transferring information between the memory cells, and at least two columns of cells for providing an output values of the cellular array;

(c) means for generating a plurality of sequences of said input characters;

(d) means for applying said sequences of (c) to a state-machine and testing said sequences for equal effect, on the internal states when said sequences are applied to said state-machine;

(e) means for selecting a set of binary values for substitution for each output function of the state-machine so that multiple output values of the cellular array in the at least two output columns conform to a predetermined set of output value functions;

(f) means for substituting the sets of binary values for internal states and testing said sequences for equal effect on said internal states with said substituted sets;

means for assigning a distinct memory cell of the multiple memory cells of the main diagonal of (b) to each sequence of characters found not to have equal effect in (f) so that the memory cells collectively store information corresponding to collector array states; and means for providing a control memory for controlling the transfer of information.

* * * * *

UNITED STATES PATENT AND TRADEMARK OFFICE
CERTIFICATE OF CORRECTION

PATENT NO. : 5,377,123

DATED : December 27, 1994

INVENTOR(S) : Edward Hyman

It is certified that error appears in the above-identified patent and that said Letters Patent is hereby corrected as shown below:

In the Title, "LOGINC" should read --LOGIC--;

In column 2, lines 25 and 26, "statema-chine" should read --state-machine--;

In column 10, line 29, please insert --/ \-- after the word "sequence";

In column 13, line 35, "," should read --.--;

In column 17, Table 3, lines 4 and 5,

 should read -- 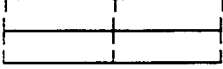 --;

In column 17, Table 3, lines 7 and 8,

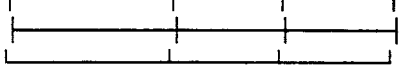 should read -- 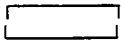 --;

In column 17, Table 3, line 9, "(1-1)  $Z_0$  $Z_1$" should read --(0-1)  $Z_1$  $Z_2$--;

In column 17, line 17, "n" should read --(n-1)--;

In column 18, line 67, please delete "{·,0}" after the word "in";

In column 18, line 68, please insert --{·,0}-- after the word "set";

In column 22, line 58, please insert --{0,1}-- after the word "alphabet";

In column 23, line 18, "/ \." should read --/ \,--;

In column 24, line 26, "/ \." should read --/ \,--;

UNITED STATES PATENT AND TRADEMARK OFFICE
CERTIFICATE OF CORRECTION

PATENT NO. : 5,377,123

DATED : December 27, 1994

INVENTOR(S) : Edward Hyman

It is certified that error appears in the above-identified patent and that said Letters Patent is hereby corrected as shown below:

In column 24, line 65, " "-" " should read --"-",--;

In column 26, line 36, "/ \," should read --/ \$_1$,--;

In column 26, line 21, "/\$_2$)" should read --/ \$_2$)--;

In column 26, line 55, "1," should read --1$_1$,--;

In column 27, line 10, "(/ \)," should read --(/ \$_1$),--;

In column 27, line 14, "/ \," should read --/ \$_1$,--;

In column 27, line 24, "1$_2$," should read --1$_1$,--;

In column 28, line 32, "/ $_2$" should read --/ \$_2$--;

In column 30, line 46, "/ $_2$" should read --/ \$_2$--;

In column 30, line 63, " "1" " should read --"1,"--;

In column 34, line 51, "pthe" should read --the--;

In column 35, line 28, please delete "[u]" after the letter "b";

In column 35, line 62, please delete "1$_1$" after the word "is";

In column 36, line 13, please delete "[11]" after the number "134";

UNITED STATES PATENT AND TRADEMARK OFFICE
CERTIFICATE OF CORRECTION

PATENT NO. : 5,377,123

DATED : December 27, 1994

INVENTOR(S) : Edward Hyman

It is certified that error appears in the above-identified patent and that said Letters Patent is hereby corrected as shown below:

In column 37, line 50, "28" should read --128--;

In column 42, line 56, "/ \," should read --/ $\textbackslash_1$,--;

In column 43, line 26, please delete "lo" after the word "row";

In column 44, line 34, "$0_1$," should read --$0_2$--;

In column 44, line 64, "(/ \," should read --(/ $\textbackslash_2$,--;

In column 45, line 5, "$01_1$)" should read --$01_2$)--;

In column 46, line 37, "($0_1$, $01_2$)" should read --($0_1$, / $\textbackslash_2$, $01_2$) --;

In column 46, lines 47 and 52, "/ $\textbackslash_1$," should read --/ $\textbackslash_2$,--;

In column 49, line 9, please delete "[6]" after the number "5";

In column 49, line 61, please delete "[7]" after the number "6";

In column 49, line 10, please delete "[Compatibles]" after the word "Prime";

In column 49, line 50, "path yields" should read --the Path yields--;

In column 49, line 55, "Sequence" should read --sequence--;

In column 50, line 1, please delete "[7]" after the number "6";

In column 52, line 52, please insert --46-- after the word "and";

UNITED STATES PATENT AND TRADEMARK OFFICE
CERTIFICATE OF CORRECTION

PATENT NO. : 5,377,123

DATED : December 27, 1994

INVENTOR(S) : Edward Hyman

It is certified that error appears in the above-identified patent and that said Letters Patent is hereby corrected as shown below:

In column 55, line 12, please insert --,-- after the word "index";

In column 56, line 58, please insert --values are determined-- after the word "memory";

In column 56, lines 59 and 60, please delete "multiple locations along the main diagonal as well as" after the word "memory";

In column 56, line 60, please insert --multiple locations along the main diagonal as well as for those memory cells occupying-- after the word "occupying";

In column 57, line 9, please delete "a" after the symbol "/ \,";

In column 66, line 64, please insert --(1)-- after the word "characteristics";

In column 72, line 54, please insert --a-- after the word "in";

In column 72, line 60, please insert --states in (f), including identical locations of unspecified entries-- after the word "state-machine";

Signed and Sealed this

Twenty-eighth Day of May, 1996

Attest:

BRUCE LEHMAN

*Attesting Officer*   *Commissioner of Patents and Trademarks*